United States Patent
Myron et al.

(10) Patent No.: US 6,415,205 B1
(45) Date of Patent: *Jul. 2, 2002

(54) OCCUPANCY SENSOR AND METHOD OF OPERATING SAME

(75) Inventors: Douglas D. Myron; Vadim A. Konradi; Bruce G. Williams; John J. Fowler; Timothy W. Woytek; Jonathan D. Williams; Gerard L. Cullen, all of Austin, TX (US)

(73) Assignee: Mytech Corporation, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/383,492

(22) Filed: Aug. 26, 1999

Related U.S. Application Data

(63) Continuation of application No. 08/795,327, filed on Feb. 4, 1997, now Pat. No. 5,986,357.

(51) Int. Cl.$^7$ .................................................. G01M 1/38
(52) U.S. Cl. ........................................ 700/275; 340/522
(58) Field of Search ................................ 700/11, 14, 22, 700/28, 275; 340/825.3, 825.31, 825.32, 825.34, 825.36, 506, 508, 517, 539, 541, 565, 587, 521, 522, 567, 529, 554, 540; 307/112, 116, 117, 125, 139, 140, 32

(56) References Cited

U.S. PATENT DOCUMENTS

| | | | |
|---|---|---|---|
| 3,074,053 A | 1/1963 | McDonough et al. | 340/258 |
| 3,383,678 A | 5/1968 | Palmer | 343/5 |
| 3,721,972 A | 3/1973 | Hermans | 340/276 |
| 3,725,888 A | 4/1973 | Solomon | 340/258 |
| 3,777,139 A | 12/1973 | Peel | 246/125 |
| 3,781,859 A | 12/1973 | Hermans | 340/258 |
| 3,801,978 A | 4/1974 | Gershberg et al. | 340/258 |
| 3,958,118 A | 5/1976 | Schwarz | 250/221 |
| 3,967,283 A | 6/1976 | Clark et al. | 343/7.7 |
| 4,021,679 A | 5/1977 | Bolle et al. | 307/117 |
| 4,051,472 A | 9/1977 | Albanese et al. | 343/5 PD |
| 4,172,253 A | 10/1979 | Hermans | 367/94 |
| 4,207,559 A | 6/1980 | Meyer | 340/531 |

(List continued on next page.)

FOREIGN PATENT DOCUMENTS

| | | |
|---|---|---|
| DE | 40 05 169 | 8/1991 |
| DE | 4302836 | 7/1994 |
| EP | 0 066 691 | 12/1982 |
| WO | WO 92/10074 | 6/1992 |
| WO | WO 93/05627 | 3/1993 |
| WO | WO 94/20937 | 9/1994 |
| WO | WO 96/25021 | 8/1996 |

OTHER PUBLICATIONS

Hubbell, "Mass 1500A and 750A Motion Switching System," 1993.
Imbrecht et al., In: *Building Energy Efficiency Standards*, California Energy Commission, Jul. 1988.
International Search Report dated Jun. 7, 1996.
International Search Report dated May 18, 1998 (PCT/US98/02010) (MYTE:023P).
O'Mara, "Dual–technology sensors solve installation problems," *Security Distributing & Marketing*, pp. 81–83, Aug. 1990.

*Primary Examiner*—William Grant
*Assistant Examiner*—Edward F. Gain, Jr.
(74) *Attorney, Agent, or Firm*—Fulbright & Jaworski

(57) ABSTRACT

A multiple sensing technology-based occupancy sensor. Ultrasonic and infrared sensors are used to produce first and second occupancy estimator signals that are combined using a fusion based detection algorithm to produce a combined estimator signal. The combined estimator is then used to switch electrical loads when the combined estimator signal is above a predetermined threshold. The result is an occupancy sensor that has a very high probability of occupancy detection and a low probability of false tripping.

25 Claims, 75 Drawing Sheets

U.S. PATENT DOCUMENTS

| | | | |
|---|---|---|---|
| 4,225,808 A | 9/1980 | Saraceni | 315/307 |
| 4,243,979 A | 1/1981 | Kleinschmidt | 340/554 |
| 4,275,390 A | 6/1981 | Heywang et al. | 340/554 |
| 4,315,596 A | 2/1982 | Johnson, Jr. et al. | 236/94 |
| 4,331,952 A | 5/1982 | Galvin et al. | 340/508 |
| 4,336,464 A | 6/1982 | Weber | 307/141.4 |
| 4,337,402 A | 6/1982 | Nowakowski | 307/121 |
| 4,361,767 A | 11/1982 | Pelka et al. | 307/117 |
| 4,383,288 A | 5/1983 | Hess, II et al. | 362/32 |
| 4,391,406 A | 7/1983 | Fried | 236/47 |
| 4,401,976 A | 8/1983 | Stadelmayr | 340/522 |
| 4,437,089 A * | 3/1984 | Achard | 340/541 |
| 4,461,977 A | 7/1984 | Pierpoint et al. | 315/159 |
| 4,521,843 A | 6/1985 | Pezzolo et al. | 700/16 |
| 4,551,654 A | 11/1985 | Barnum | 315/159 |
| 4,575,659 A | 3/1986 | Pezzolo et al. | 315/159 |
| 4,593,234 A | 6/1986 | Yang | 315/362 |
| 4,636,774 A | 1/1987 | Galvin et al. | 340/565 |
| 4,660,024 A | 4/1987 | McMaster | 340/522 |
| 4,661,720 A | 4/1987 | Cameron, Jr. et al. | 307/117 |
| 4,678,985 A | 7/1987 | Moskin | 323/324 |
| 4,703,171 A | 10/1987 | Kahl et al. | 250/221 |
| 4,710,750 A | 12/1987 | Johnson | 340/522 |
| 4,713,598 A | 12/1987 | Smith | 323/245 |
| 4,751,399 A | 6/1988 | Koehring et al. | 307/117 |
| 4,769,765 A | 9/1988 | Green | 700/16 |
| 4,772,875 A * | 9/1988 | Maddox et al. | 340/522 |
| 4,787,722 A | 11/1988 | Claytor | 350/452 |
| 4,815,046 A | 3/1989 | Dorr | 367/95 |
| 4,820,938 A | 4/1989 | Mix et al. | 307/117 |
| 4,833,450 A | 5/1989 | Buccola et al. | 340/506 |
| 4,843,283 A | 6/1989 | Chen | 315/153 |
| 4,857,912 A * | 8/1989 | Everett, Jr. et al. | 340/825.3 |
| 4,874,962 A | 10/1989 | Hermans | 307/116 |
| 4,882,567 A | 11/1989 | Johnson | 340/522 |
| 4,890,093 A | 12/1989 | Allison et al. | 340/567 |
| 4,929,833 A | 5/1990 | Smith | 250/338.1 |
| 5,015,994 A | 5/1991 | Hoberman et al. | 340/567 |
| 5,034,579 A | 7/1991 | Rowland | 200/61.45 R |
| 5,077,548 A * | 12/1991 | Dipoala | 340/522 |
| 5,083,025 A | 1/1992 | Blomberg | 250/353 |
| 5,101,194 A | 3/1992 | Sheffer | 340/567 |
| 5,124,546 A | 6/1992 | Hu | 250/216 |
| 5,124,566 A | 6/1992 | Hu | 307/116 |
| 5,128,654 A | 7/1992 | Griffin et al. | 340/567 |
| 5,142,199 A | 8/1992 | Elwell | 315/154 |
| 5,189,393 A | 2/1993 | Hu | 340/322 |
| 5,194,848 A | 3/1993 | Kerr | 340/566 |
| 5,196,826 A | 3/1993 | Whiting | 340/554 |
| 5,221,919 A | 6/1993 | Hermans | 340/567 |
| 5,243,327 A | 9/1993 | Bentz et al. | 340/566 |
| 5,258,743 A | 11/1993 | Nelson et al. | 340/568 |
| 5,258,775 A | 11/1993 | Casey et al. | 346/1.1 |
| 5,258,899 A | 11/1993 | Chen | 362/394 |
| 5,276,427 A * | 1/1994 | Peterson | 340/522 |
| 5,281,961 A | 1/1994 | Elwell | 340/825 |
| 5,282,118 A | 1/1994 | Lee | 362/276 |
| 5,283,551 A | 2/1994 | Guscott | 340/567 |
| 5,293,097 A * | 3/1994 | Elwell | 315/154 |
| 5,307,054 A | 4/1994 | Concannon, Sr. et al. | 340/686 |
| 5,317,304 A | 5/1994 | Choi | 340/571 |
| 5,317,620 A | 5/1994 | Smith | 379/40 |
| 5,319,283 A | 6/1994 | Elwell | 315/194 |
| 5,349,330 A | 9/1994 | Diong | 340/567 |
| 5,357,170 A | 10/1994 | Luchaco | 315/159 |
| 5,374,854 A | 12/1994 | Chen | 307/117 |
| 5,386,210 A | 1/1995 | Lee | 340/567 |
| 5,406,176 A | 4/1995 | Sudgen | 315/292 |
| 5,473,202 A | 12/1995 | Mudge et al. | 307/116 |
| 5,482,314 A * | 1/1996 | Corrado et al. | 280/735 |
| 5,489,827 A | 2/1996 | Xia | 315/294 |
| 5,504,473 A | 4/1996 | Cecic et al. | 340/541 |
| 5,543,777 A | 8/1996 | Vane et al. | 340/514 |
| 5,578,988 A | 11/1996 | Hoseit et al. | 344/522 |
| 5,586,048 A | 12/1996 | Coveley | 364/492 |
| 5,640,143 A * | 6/1997 | Myron et al. | 340/541 |

* cited by examiner

| | A | | | | | | | | | | | | | | | |
|---|---|---|---|---|---|---|---|---|---|---|---|---|---|---|---|---|
| B | 0 | 1 | 2 | 3 | 4 | 5 | 6 | 7 | 8 | 9 | 10 | 11 | 12 | 13 | 14 | 15 |
| 0 | 0 | 1 | 2 | 3 | 4 | 5 | 6 | 7 | 8 | 9 | 10 | 11 | 12 | 13 | 14 | 15 |
| 1 | 1 | 1 | 2 | 3 | 4 | 5 | 6 | 7 | 8 | 9 | 10 | 11 | 12 | 13 | 14 | 15 |
| 2 | 2 | 2 | 2 | 3 | 4 | 5 | 6 | 7 | 8 | 9 | 10 | 11 | 12 | 13 | 14 | 15 |
| 3 | 3 | 3 | 3 | 4 | 5 | 5 | 6 | 7 | 8 | 9 | 10 | 11 | 12 | 13 | 14 | 15 |
| 4 | 4 | 4 | 4 | 5 | 5 | 6 | 7 | 8 | 8 | 9 | 10 | 11 | 12 | 13 | 14 | 15 |
| 5 | 5 | 5 | 5 | 5 | 6 | 7 | 7 | 8 | 9 | 10 | 11 | 12 | 13 | 13 | 14 | 15 |
| 6 | 6 | 6 | 6 | 6 | 7 | 7 | 8 | 9 | 10 | 10 | 11 | 12 | 13 | 14 | 15 | 16 |
| 7 | 7 | 7 | 7 | 7 | 8 | 8 | 9 | 9 | 10 | 11 | 12 | 13 | 13 | 14 | 15 | 16 |
| 8 | 8 | 8 | 8 | 8 | 8 | 9 | 10 | 10 | 11 | 12 | 12 | 13 | 14 | 15 | 16 | 17 |
| 9 | 9 | 9 | 9 | 9 | 9 | 10 | 10 | 11 | 12 | 12 | 13 | 14 | 15 | 15 | 16 | 17 |
| 10 | 10 | 10 | 10 | 10 | 10 | 11 | 11 | 12 | 12 | 13 | 14 | 14 | 15 | 16 | 17 | 18 |
| 11 | 11 | 11 | 11 | 11 | 11 | 12 | 12 | 13 | 13 | 14 | 14 | 15 | 16 | 17 | 17 | 18 |
| 12 | 12 | 12 | 12 | 12 | 12 | 13 | 13 | 13 | 14 | 15 | 15 | 16 | 16 | 17 | 18 | 19 |
| 13 | 13 | 13 | 13 | 13 | 13 | 13 | 14 | 14 | 15 | 15 | 16 | 17 | 17 | 18 | 19 | 19 |
| 14 | 14 | 14 | 14 | 14 | 14 | 14 | 15 | 15 | 16 | 16 | 17 | 17 | 18 | 19 | 19 | 20 |
| 15 | 15 | 15 | 15 | 15 | 15 | 15 | 16 | 16 | 17 | 17 | 18 | 18 | 19 | 19 | 20 | 21 |

FIG. 21

| | A | | | | | | | | | | | | | | | |
|---|---|---|---|---|---|---|---|---|---|---|---|---|---|---|---|---|
| B | 0 | 1 | 2 | 3 | 4 | 5 | 6 | 7 | 8 | 9 | 10 | 11 | 12 | 13 | 14 | 15 |
| 0 | 0 | 1 | 2 | 3 | 4 | 5 | 6 | 7 | 8 | 9 | 10 | 11 | 12 | 13 | 14 | 15 |
| 1 | 1 | 4 | 5 | 7 | 9 | 10 | 11 | 13 | 14 | 16 | 17 | 18 | 19 | 21 | 22 | 23 |
| 2 | 2 | 5 | 8 | 9 | 11 | 13 | 14 | 16 | 18 | 19 | 20 | 22 | 23 | 25 | 26 | 27 |
| 3 | 3 | 7 | 9 | 12 | 13 | 15 | 17 | 19 | 20 | 22 | 23 | 25 | 27 | 28 | 29 | 31 |
| 4 | 4 | 9 | 11 | 13 | 16 | 17 | 19 | 21 | 23 | 25 | 26 | 28 | 29 | 31 | 32 | 34 |
| 5 | 5 | 10 | 13 | 15 | 17 | 20 | 21 | 23 | 25 | 27 | 29 | 30 | 32 | 34 | 35 | 37 |
| 6 | 6 | 11 | 14 | 17 | 19 | 21 | 24 | 25 | 27 | 29 | 31 | 33 | 34 | 36 | 38 | 39 |
| 7 | 7 | 13 | 16 | 19 | 21 | 23 | 25 | 28 | 29 | 31 | 33 | 35 | 37 | 39 | 40 | 42 |
| 8 | 8 | 14 | 18 | 20 | 23 | 25 | 27 | 29 | 32 | 33 | 35 | 37 | 39 | 41 | 43 | 44 |
| 9 | 9 | 16 | 19 | 22 | 25 | 27 | 29 | 31 | 33 | 36 | 37 | 39 | 41 | 43 | 45 | 47 |
| 10 | 10 | 17 | 20 | 23 | 26 | 29 | 31 | 33 | 35 | 37 | 40 | 41 | 43 | 45 | 47 | 49 |
| 11 | 11 | 18 | 22 | 25 | 28 | 30 | 33 | 35 | 37 | 39 | 41 | 44 | 45 | 47 | 49 | 51 |
| 12 | 12 | 19 | 23 | 27 | 29 | 32 | 34 | 37 | 39 | 41 | 43 | 45 | 48 | 49 | 51 | 53 |
| 13 | 13 | 21 | 25 | 28 | 31 | 34 | 36 | 39 | 41 | 43 | 45 | 47 | 49 | 52 | 53 | 55 |
| 14 | 14 | 22 | 26 | 29 | 32 | 35 | 38 | 40 | 43 | 45 | 47 | 49 | 51 | 53 | 56 | 57 |
| 15 | 15 | 23 | 27 | 31 | 34 | 37 | 39 | 42 | 44 | 47 | 49 | 51 | 53 | 55 | 57 | 60 |

FIG. 22

OCCUPANCY SENSOR AND METHOD OF OPERATING SAME

This is a continuation of application Ser. No. 08/795,327, filed Feb. 4, 1997, now U.S. Pat. No. 5,986,357.

REFERENCE TO A COMPUTER PROGRAM LISTING APPENDIX

An appendix is included in this application, the totality of which is hereby incorporated by reference for all purposes as an integral part of this application. The appendix includes on compact disk (CD-ROM or CD-R) a computer program listing. The total number of compact discs is 2 (two) including duplicate(s). Pursuant to 37 C.F.R. §1.52(e), the names of the files on each compact disk, their date of creation and their sizes in bytes are specified as follows:

Disk 1:
Machine Format: IBM-PC
Operating System: MS-Windows
File Included:
   Name: MYTE005--1
   MS-DOS Name: MYTE00~3.TXT
   Created on: Dec. 18, 2001
   Size: 205,572 bytes Disk 2:
Machine Format: IBM-PC
Operating System: MS-Windows
File Included:
   Name: MYTE005--1
   MS-DOS Name: MYTE00~3.TXT
   Created on: Dec. 18, 2001
   Size: 205,572 bytes

BACKGROUND OF THE INVENTION

The present invention relates to occupancy sensors.

A portion of the disclosure of this patent document contains material that is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

An occupancy sensor is an energy conservation device designed to detect the presence of human occupant(s) in a given area. When occupancy is sensed, the various electrically-powered loads in that area controlled by the sensor (for example, lights, ventilation, and the like) are energized. When that same area has been unoccupied for a predetermined period of time, the sensor de-energizes the electrical loads that it controls. Occupancy sensors may therefore conserve a great deal of energy in areas where the occupants do not exercise diligence in de-energizing those electrical loads when they leave the area.

Over the last few decades, several events have led to the growth of a large consumer market for energy saving devices including occupancy sensors. First, there has been an increase in public awareness of energy conservation and its beneficial environmental consequences. In addition, there has been increased realization by both private and government-controlled power generation industries of the economic and environmental advantages of energy conservation as a means of meeting peak load power demands. Finally, there have been legislative mandates at the federal, state and local levels for the use of energy conserving devices, such as occupancy sensors, in government and other public buildings.

Occupancy sensors have been successfully designed and tested using a variety of technologies. A brief description of the most widely used occupancy sensor technologies along with the strengths and weaknesses of those technologies follows:

Active Ultrasonic Acoustic Doppler Occupancy Detection

This technology allows continuous detection of moving objects that reflect ultrasonic acoustic energy. This method of occupancy detection is highly sensitive since it is based on an active source of ultrasonic acoustic energy. An apparatus and method of this type are disclosed in U.S. patent application Ser. No. 08/384,580, filed Feb. 6, 1995, assigned to the same assignee as the present invention and entitled: OCCUPANCY SENSOR AND METHOD FOR OPERATING SAME, the disclosure of which is incorporated herein by reference.

However, this method of occupancy detection has several limitations: first, it is insensitive to motion that is orthogonal to the direction toward the receiver; second it is insensitive to motion generally not in the line of sight of the receiver; third, it is subject to false tripping due to other sources of ultrasonic energy; fourth, it is subject to false tripping due to heating and air conditioning air flow; and finally, it has no means of range discrimination. Since occupancy sensors based on Doppler techniques have no means of range discrimination, a large-distant target moving at approximately the same speed as a smaller, nearby target might have similar target signatures.

Active Electromagnetic Doppler Occupancy Detection

This technology allows continuous detection of moving objects that reflect electromagnetic energy. This method of occupancy detection is highly sensitive since it is based on an active source of electromagnetic energy. However, this method of motion detection also has several limitations: first, it is insensitive to motion that is orthogonal to the direction toward the receiver; second, it is insensitive to motion generally not in the line of sight of the receiver; third, it is subject to false tripping due to other sources of electromagnetic energy; and finally, it has no means of range discrimination.

Passive Audio Acoustic Occupancy Detection

This technology allows continuous detection of objects that emit audio acoustic energy. This method of occupancy detection is quite sensitive but is subject to false tripping due to non-occupant sources of audio acoustic energy such as facsimile machine, telephone and security system tones, automobile and emergency vehicle horns, etc.

Passive Infrared Occupancy Detection

This technology allows continuous detection of moving objects that emit infrared energy. This method of occupancy detection is also quite sensitive even though it is based on passive sensing of moving sources of infrared energy. This method of occupancy detection also has several limitations: first, it is insensitive to sources generally not in the line of sight of the receiver; second, it is subject to being blinded by intense, stationary sources of infrared energy; third, it is subject to false tripping due to rapid fluctuations in the intensity of stationary infrared sources; and finally, it is subject to a detection coverage tradeoff involving the number of lens facets versus detection range.

Position Sensor Based Occupancy Detection

This technology uses one or more mercury switches to sense changes in the physical position of the sensor. This technology has several limitations: first, it is insensitive to minor motion that may be indicative of occupancy; and second, it is inherently a digital (off/on) device.

Piezoelectric Sensor Based Occupancy Detection

This technology senses the changes in the resistance of a piezoelectric sensor to sense occupancy. This technology is subject to false tripping due to changes in temperature.

Significant innovation in the design of occupancy sensors has occurred over the last few decades. The early occupancy sensors utilized primarily analog signal processing techniques. The large area motion sensor described in U.S. Pat. No. 3,967,283 by Clark et. al., issued Jun. 29, 1976, utilized electromagnetic motion detection and was based on analog signal processing techniques. The occupancy sensor described in U.S. Pat. No. 4,661,720 by Cameron, Jr. et. al., issued Apr. 28, 1987, and the low voltage motion sensor for activating a high voltage load described in U.S. Pat. No. 4,820,938 by Mix et. al., issued Apr. 11, 1989, utilized analog signal processing techniques. The variable gain amplifier used in these sensors required manual adjustment. The room occupancy sensor, lens and method of lens fabrication described in U.S. Pat. No. 5,221,919 by Hermans, issued Jun. 22, 1993, utilized passive infrared detection and was based on analog signal processing techniques. The motion detection sensor with computer interface described in U.S. Pat. No. 5,281,961 by Elwell, issued Jan. 25, 1994, utilized active ultrasonic motion detection and was based primarily on analog signal processing techniques. Although easy to design and relatively cheap to implement, the analog filters in these devices had filter response characteristics that drifted with temperature variations and that varied over the lifetime of the various analog filter components. The overall result of using a sensor based on analog signal processing techniques was an occupancy sensor whose performance was unpredictable.

Additionally, the majority of these early occupancy sensors were based on a single sensing technology. Since each technology has its own inherent limitations, these sensors were subject to false tripping due to a variety of sources. For example, ultrasonic Doppler sensors were subject to false trips due to air conditioning and heating system air flow. In addition, since these sensors had no means of range discrimination, they were subject to false trips due to motion outside the desired range of interest. Similarly, passive infrared (PIR) sensors were subject to being blinded by intense, stationary sources of infrared energy. The automatic lighting device described in U.S. Pat. No. 4,751,399 by Koehring et. al. issued Jun. 14, 1988 utilized only acoustic motion detection. This sensor was subject to false tripping due to non-occupant sources of audio acoustic energy such as facsimile machine, telephone and security system controller tones, emergency vehicle and automobile horns, etc. The selective illumination technique described in U.S. Pat. No. 4,225,808 by Saraceni issued Sep. 30, 1980 allowed the use of pressure, ultrasonic motion, microwave, photoelectric and audible sound sensors but failed to combine these technologies to achieve a more reliable sensor with a reduced probability of false tripping. In order to lessen the probability of false trips, the user was often forced to reduce the sensor's sensitivity. The overall result of using a sensor based on a single technology was an occupancy sensor with reduced sensitivity and reliability.

The next generation of occupancy sensors used two or more sensing technologies. These sensors typically required the user to specify a separate activation threshold for each detector technology in the sensor. The digital detector output of each sensor technology was then combined using classical digital logic to detect occupancy. The preset light controller including infrared sensor operable in multiple modes described in U.S. Pat. No. 5,128,654 by Griffin et. al., issued Jul. 7, 1992, used infrared and visible light sensors. The dual technology motion sensor described in U.S. Pat. No. 5,189,393 by Hu, issued Feb. 23, 1993, combined the outputs of its ultrasonic and infrared sensors using classical Boolean AND and OR hardware logic. In general, these multiple sensing technology sensors had better performance than their predecessors but still exhibited a sensitivity-false alarm tradeoff. For example, if the various detector signals were combined using the logical OR function, the overall sensitivity of the sensor increased at the expense of an increased incidence of false trips. On the other hand, if the various detector signals were combined using the logical AND function, the overall incidence of false trips decreased at the expense of decreased sensor sensitivity. Since each sensing technology has its own separate activation threshold, these sensors were often unable to reliably detect motion in marginal cases where one or more sensing technologies observed signal levels just below the user-defined threshold level. The overall result of using these early multiple sensing technology-based occupancy sensors was an improved performance occupancy sensor that was unable to sense occupancy in the more complex marginal sensor signal level situations.

In general, prior art occupancy sensors heretofore known suffer from a number of disadvantages, including:

1. Lack of a sophisticated multiple sensing technology sensor signal conditioning to more completely exploit the advantages of sensing technologies while minimizing disadvantages. The prior art failed to combine the various occupancy sensor detection technologies in a sophisticated fashion to increase the overall probability of occupancy detection while simultaneously lowering the overall probability of false tripping.
2. Lack of adaptive sensor behavior. The prior art failed to produce an occupancy sensor whose performance adapted over time to optimize the sensor's performance.
3. Lack of digital signal processing techniques. The prior art used analog signal processing techniques. The analog filters used in these sensors required manual tuning that was a costly, time consuming process. In addition, the performance of these analog filters was temperature dependent and drifted with time.
4. Lack of means to simply and efficiently communicate the status of the sensor to installation and maintenance personnel. An occupancy sensor, typically has a number of settings that determine its mode of operation, and that the person who installs or maintains the sensor may wish to review. The sensor is typically installed out of reach on a ceiling or wall such that its adjustment knobs or dials are not readily visible. The prior art does not incorporate a system to make such settings readily available and apparent to a person who wishes to query them.
5. Lack of means to check status of the controlled signal to determine if a load device is connected, or if the controlled output is misconnected or shorted.
6. Lack of permanent storage of sensor variables. The prior art failed to permanently store various sensor settings. In the event of a power failure, these sensors had no means of recovering their previous settings.
7. Lack of no means to recognize an excessively reverberant controlled space with excessive ultrasonic return signal amplitude, and lack of means to compensate by adjusting the ultrasonic transmitter amplitude.

8. Lack of ultrasonic receiver preamplifier and demodulator performance monitoring means. The prior art did not monitor ultrasonic receiver preamplifier and demodulator performance and did not have means for making adjustments to accommodate a poorly executed installation or highly acoustically reflective space. A sophisticated ultrasonic sensor incorporates a high gain receiver preamplifier that may become saturated due to excessive acoustic reflections from room walls and other hard structures within the space. Furthermore, the sensor may be installed incorrectly too close to a fixed acoustic reflector such as a wall, exit sign, or other architectural feature. Saturation of the receiver preamplifier causes the motion signal to be lost, and the sensor to be effectively blinded by the excessive signal level. It is desirable that the sensor may be installed by unskilled personnel, and that the sensor be able to accommodate non-ideal situations created either by improper installation or difficult acoustic environments. The prior art has no means to determine saturation of the receiver preamplifier, nor any means to correct for such saturation.

9. Lack of occupancy cycle detection and utilization. The prior art did not detect the typical daily and weekly occupancy cycle of the sensor's environment and use that information to make occupancy decisions. A workspace is typically occupied according to a cycle that varies predictably throughout the day, and also according to a set pattern through the work week. Heretofore, sensors have not taken into account this pattern, and the prior art has no means to survey and record the typical daily and weekly occupancy patterns, nor to store that information, nor to act on the basis of that information.

SUMMARY OF THE INVENTION

The present invention solves the above-noted failings in the prior art by providing an occupancy based load controller, comprising a plurality of occupancy sensors for producing a respective plurality of occupancy estimator signals, each indicative of motion within a space; a programmable microprocessor, connected to the plurality of occupancy sensors, for calculating a composite occupancy estimator from the plurality of occupancy estimator signals, and for comparing the composite occupancy estimator to a composite activation threshold; and a controllable load energizing device responsive to the programmable microprocessor, operable to automatically energize an electrical load when the microprocessor determines that the composite occupancy estimator is greater than the composite activation threshold. The programmable microprocessor can also operate to compare the composite occupancy estimator to a composite maintenance threshold, and the controllable load energizing device is then operable to continue energizing the electrical load when the microprocessor determines that the composite occupancy estimator is greater than the composite maintenance threshold.

The plurality of occupancy estimator signals are preferably digital representations based on signal levels detected at the plurality of occupancy sensors. The invention contemplates the use of any type of occupancy sensor technology, in any combination, including, for example, an ultrasonic transmitter and sensor, a passive infrared (PIR) detector, a passive audio acoustic detector, and a microwave transmitter and sensor, or any combination of two or more of these sensor technologies.

The composite occupancy estimator may be calculated by any useful mathematical combination of the plurality of individual occupancy estimator signals, for example, arithmetic sum, weighted arithmetic sum, or Yager Union function of the plurality of occupancy estimator signals. In addition, the composite occupancy estimator can be created by performing a table look-up based on the plurality of occupancy estimator signals.

The composite activation and maintenance thresholds can be programmable.

The sensitivity of at least one of the plurality of occupancy sensors may be adjusted in accordance with the present invention, for example based upon an historical usage patterns of the space, based upon detection of false-on events, or based upon detection of false-off events.

The invention may also include an environmental sensor, connected to the microprocessor, for sensing an environmental condition of the space, including, for example, an ambient temperature sensor or an ambient light sensor.

An additional feature of the invention is the storing of a status of the load controller; and visually reporting the status of the load controller. Status may be reported at predetermined time intervals, or upon user interrogation, for example upon detecting a predetermined motion pattern.

When incorporating an ultrasonic transmitter and sensor, the ultrasonic transmitter may operate to transmit continuous wave ultrasonic signals; and the ultrasonic sensor may include an ultrasonic signal receiver, and a controllable gain preamplifier circuit having an input connected to receive a Doppler-shifted ultrasonic signal produced by the ultrasonic receiver, and an output providing a Doppler-shifted ultrasonic signal with controllable amplitude. The ultrasonic sensor further comprising a zero crossing phase lock loop sampling point circuit having an input connected to receive a sampling point control signal; and an output providing a sample of the Doppler-shifted ultrasonic signal near a zero crossing point of the Doppler shifted ultrasonic signal.

The invention also contemplates a method for controlling an electrical load as a function of occupancy of a space, comprising generating a plurality of occupancy estimator signals indicative of motion within a space; calculating a composite occupancy estimator from the plurality of occupancy estimator signals; comparing the composite occupancy estimator to a composite activation threshold; and energizing the electrical load when the composite occupancy estimator is greater than the composite activation threshold. Further, the method may compare the composite occupancy estimator to a composite maintenance threshold; and continue to energize an electrical load when the composite occupancy estimator is greater than the composite maintenance threshold.

The calculating step may be accomplished by any useful mathematical function, including, for example, calculating the composite occupancy estimator by performing an arithmetic sum of the plurality of occupancy estimator signals, by performing a weighted arithmetic sum of the plurality of occupancy estimator signals, or by performing a Yager Union function of the plurality of occupancy estimator signals. The method may also be accomplished by performing a table look-up based on the plurality of occupancy estimator signals.

The method also programmably adjusts the composite activation and composite maintenance thresholds.

The invention also contemplates a method for controlling an electrical load as a function of occupancy of a space, comprising transmitting continuous wave ultrasonic signals into the space; receiving a Doppler-shifted ultrasonic signal reflected from the space; sampling the Doppler shifted ultrasonic signal near a zero crossing point of the Doppler shifted ultrasonic signal to provide a sampled Doppler-shifted ultrasonic signal; detecting occupancy of the space as a function of the sampled Doppler-shifted ultrasonic signal; and energizing the electrical load when the sampled Doppler-shifted ultrasonic signal indicates that the space is occupied. The sampling step may be performed by sampling the Doppler-shifted ultrasonic signal as a function of continuous wave ultrasonic signals transmitted into the space.

The invention also contemplates a method of operating an occupancy based load controller, including: at least one occupancy sensor for producing at least one occupancy estimator signal indicative of motion within a space, a programmable microprocessor, connected to the at least one occupancy sensor, for comparing the occupancy estimator signal to a predetermined threshold; and a controllable load energizing device responsive to the programmable microprocessor, operable to automatically energize an electrical load when the microprocessor determines that the occupancy estimator signal is greater than the predetermined threshold; the method comprising maintaining a status of the occupancy based load controller; detecting a predetermined motion pattern within the space; and reporting the status upon detection of the predetermined motion pattern.

Accordingly, some exemplary features and advantages of embodiments of the present invention include the use of a sophisticated multiple sensing technology based sensor fusion detection algorithm. This algorithm combines the outputs of a plurality of occupancy sensors, including, for example, ultrasonic, PIR, microwave and acoustic sensors, to produce a composite occupancy estimator signal that is compared to a composite threshold to determine occupancy. This produces a highly sensitive yet highly reliable occupancy sensor.

The present invention also contemplates a variety of self-adaptive features. These adaptive features may be individually enabled or disabled by proper setting of the sensor's user-controlled option switches. In general, the longer the sensor is allowed to adapt within a given environment, the better its occupancy detection performance will be.

The invention also provides a means to simply and efficiently communicate the status of the sensor to installation and maintenance personnel. In accordance with the present invention, a visual indication of the sensor's internal settings and variables is reported in the form of a sequence of light flashes, encoded to represent the numerical values. It also emits character descriptors of its state of operation, for instance, satisfactory, failed, or otherwise non-optimal, in the form of a sequence of light flashes. Thus it is possible for the sensor to communicate key portions of its internal state information to installers or maintenance personnel. This communication takes place from a distance, without a need to physically access the sensor.

A portion of the sensor's status information may be emitted automatically at periodic intervals. One embodiment of the present invention is also able to recognize a choreographed sequence of hand movements that instruct the sensor to output a detailed sequence of status descriptors and variable information upon command. Upon receipt of this sequence of movements, the sensor enters an information retrieval mode, and detailed internal state information is emitted in a predetermined sequence. Thus it is possible for installation or maintenance personnel to query the sensor for status and receive a detailed report. Both the query and receipt of the report occur from a distance by using the occupancy sensing function of the sensor, without a need to physically access the sensor and without the need to provide dedicated hardware to shift the sensor from a normal mode of operation to a status reporting mode.

The present invention also may incorporate means to store adapted sensor variables such that they are maintained if power to the sensor is disconnected. It is generally preferred that an occupancy sensor be powered continuously. In numerous applications, however, the power supply to the sensor is connected in series with a wall switch that controls the lighting. This often occurs in retrofit situations where the sensor power supply and relay are connected into existing lighting circuits in the most expedient way, near the lighting fixture, and in the portion of the circuit already switched at the wall. In such situations, the sensor will periodically loose power, and it is essential that it maintain its previously adapted settings.

The present invention also incorporates means to determine if the ultrasonic receiver preamplifier is saturated, and means to adjust the phase of the sample point of the synchronous demodulator circuit relative to the outgoing carrier signal by searching for the zero crossing of the preamplifier signal. This ensures that the synchronous demodulation sample is taken at the optimum point, and that the performance of the receiver is not adversely affected by preamplifier saturation that occurs between the zero crossings of the signal. Furthermore, if due to extreme preamplifier saturation the sample point search algorithm is unable to find a sample point that has sufficient saturation margin, the algorithm then decreases the transmitter drive amplitude in order to reduce the excessive signal return to the preamplifier. The search algorithm is reinitiated, and the entire process repeated until a satisfactory sample point is achieved without excessive signal saturation.

Another feature of the present invention is the detection of the typical daily and weekly occupancy cycles of the controlled space, and use of that information to improve the accuracy of the sensor's occupancy decisions. This is accomplished by maintaining a clock, and dividing the seven days of the week and the 24 hours of each day into multiple time slots. Associated with each of these time slots is a stored data value that indicates the likelihood that the workspace is occupied during that particular time on that particular day of the week thus forming a histogram. This occupancy probability histogram is formed over a period of days and weeks during which the sensor records and averages the detected occupancy of the space for that particular time slot. When a marginal motion signal is received, the sensor applies a correction to it based on the probability of occupancy that has been determined for that particular time slot. If the time slot is one that is typically occupied, the occupancy decision is biased in favor of declaring occupancy and the electrical loads are turned on. Conversely, if the time slot is one that is typically not occupied, the occupancy decision is biased in favor of determining non-occupancy, and the electrical loads are kept off. The result of this algorithm is a sensor that knows when people are typically around, and energizes the electrical loads quickly for them, and knows when the space is typically vacant, and keeps the electrical loads de-energized unless an unmistakable motion signal is received.

The present invention also includes active ultrasonic continuous wave Doppler motion occupancy detection. The duty cycle of the ultrasonic transmitter waveform may be varied to achieve automatic output level adjustment. The present invention may also include PIR motion occupancy detection, acoustic sound detection, microwave detection, or any combination of ultrasonic, PIR, acoustic, and microwave detection methods.

The present invention may also include energy-conserving daylight control operation. This feature is used to turn off electrical lighting loads in an occupied area that has a sufficient amount of natural lighting or to control dimmable or multi-level lighting systems to provide only the required amount of additional (electrical) lighting.

The present invention is also able to recognize saturation of the ultrasonic receiver preamplifier due to excessive ultrasonic return signal amplitude. It is able to vary the duty cycle of the waveform applied to the ultrasonic transmitter away from 50 percent (maximum amplitude) duty cycle, and to decrease the amplitude by changing to a lower duty cycle.

The present invention also includes easy selection of operating mode and adjustment of sensitivity and timer delay. This feature allows the user to easily adjust the sensor's mode of operation, the sensor's sensitivity and delay timer settings for the desired operation of the sensor. A user of the present invention also has a variety of sophisticated dual-technology selection settings, including a HIGH CONFIDENCE mode and a HIGH SENSITIVITY mode.

Other features and advantages of the invention will become apparent from a consideration of the drawings and ensuing detailed description.

BRIEF DESCRIPTION OF THE DRAWINGS

FIG. 21 is a decision surface for a table look-up version of the Yager Union function in FIG. 19.

FIG. 22 is a decision surface for a table look-up version of the Yager Union function in FIG. 20.

FIGS. 62A and 62A-1 are the LED status task flowchart for the present invention.

DESCRIPTION OF ILLUSTRATIVE EMBODIMENTS

| Glossary of Acronyms | |
|---|---|
| A/D | analog-to-digital converter |
| ASA | automatic sensitivity adjustment |
| ATA | automatic timer adjustment |
| CCP | capture/compare/PWM |

| -continued | |
|---|---|
| Glossary of Acronyms | |
| CMOS | complimentary metal oxide semiconductor |
| DSP | digital signal processing |
| EEPROM | electrically erasable programmable read only memory |
| GSB | gain setback |
| HVAC | heating, ventilation, air conditioning |
| I/O | input/output |
| LED | light emitting diode |
| MUX | multiplexer |
| OP AMP | operational amplifier |
| PIR | passive infrared |
| PWM | pulse width modulation |
| RAM | random access memory |
| ROM | read only memory |
| TTL | transistor-transistor logic |
| VDC | volts direct current |

Figure 1:
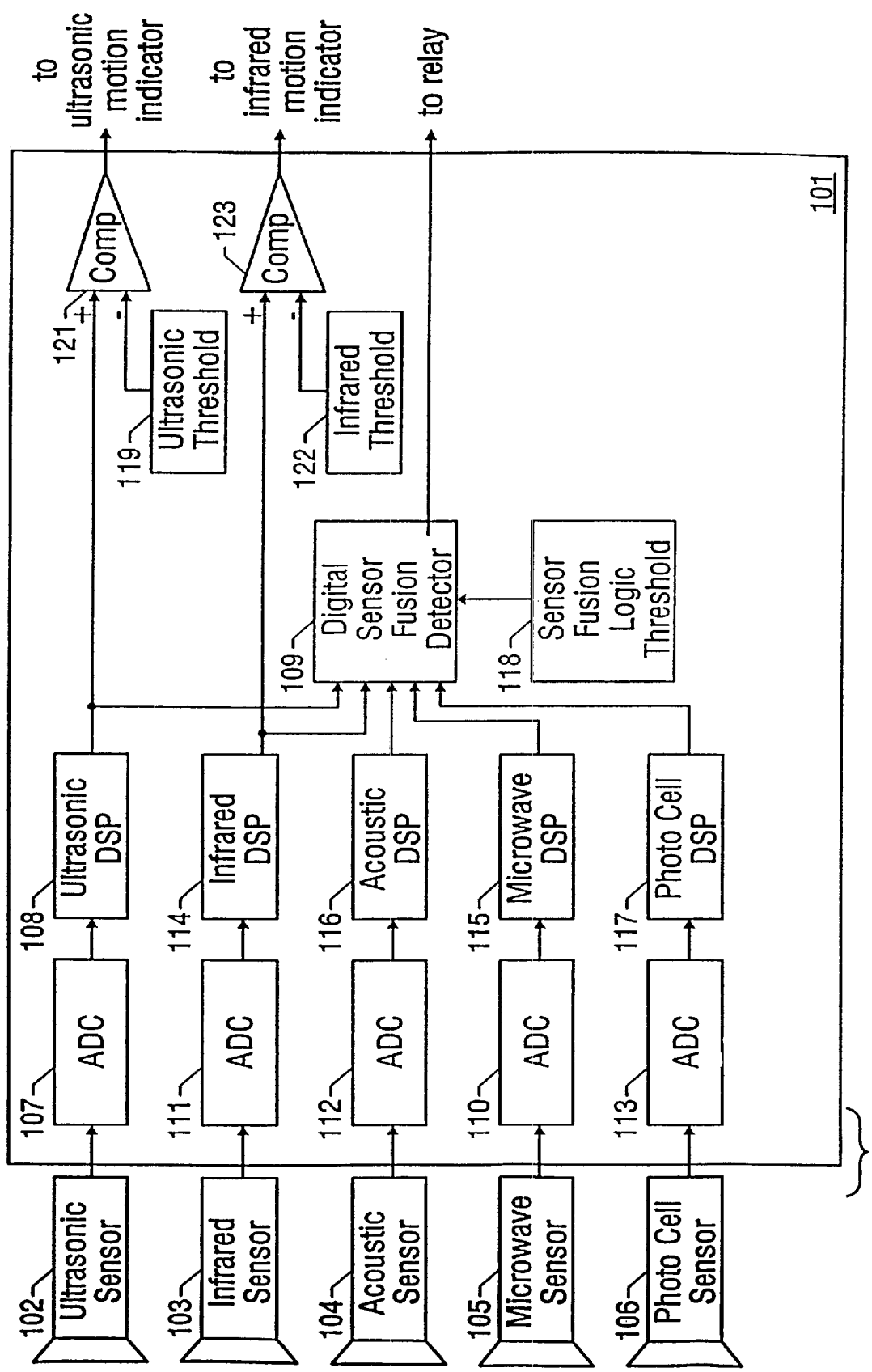
FIG. 1 is a simplified functional block diagram of the present invention.

A simplified, functional block diagram of the multi-technology-based occupancy sensor 100 of the present invention is shown in FIG. 1. The occupancy sensor inputs are on the left side of FIG. 1. The digital microcontroller 101 and various signal conditioning blocks are in the center of FIG. 1. The various outputs are on the right hand side of FIG. 1. FIG. 1 illustrates the use of five different sensor technologies: ultrasonic 102, infrared 103, acoustic 104, microwave 105 and visible light 106. The analog output signal of the ultrasonic sensor 102 is digitized using an analog-to-digital converter (A/D) 107. The digital ultrasonic sensor signal is then processed using an ultrasonic DSP algorithm 108 on the digital microcontroller. The resulting ultrasonic output signal, referred to as an occupancy estimator signal, is then fed to a digital sensor fusion detector 109. In a similar fashion, occupancy estimator signals are generated for the analog signals from the infrared, acoustic, microwave and visible light sensors 103, 104, 105, 106 by digitizing the analog signal using A/Ds 110, 111, 112, 113 and processing the signal using the appropriate DSP algorithms 114, 115, 116, 117. The resulting occupancy estimator signals are fed to the digital sensor fusion detector 109. The digital sensor fusion occupancy detector 109 then combines the different processed sensor signals to produce a composite occupancy estimator that is compared to a composite sensor fusion threshold 118 (either a composite activation or composite maintenance threshold) to determine occupancy. The output of the sensor fusion detector 109 is used to actuate a relay that energizes the electrical load(s) controlled by the occupancy sensor.

If the ultrasonic DSP 108 output signal exceeds the user-defined ultrasonic activation threshold 119 as determined by comparator 121, the ultrasonic motion indicators will be turned on. Similarly, if the infrared DSP 114 output signal exceeds the user-defined infrared activation threshold 122 as determined by comparator 123, the infrared motion indicators will be turned on. It should be noted that the individual sensor technology activation thresholds 119 and 122 are preferably used only to drive the various sensor technology motion indicators and are not used alone to sense occupancy.

Figure 2:
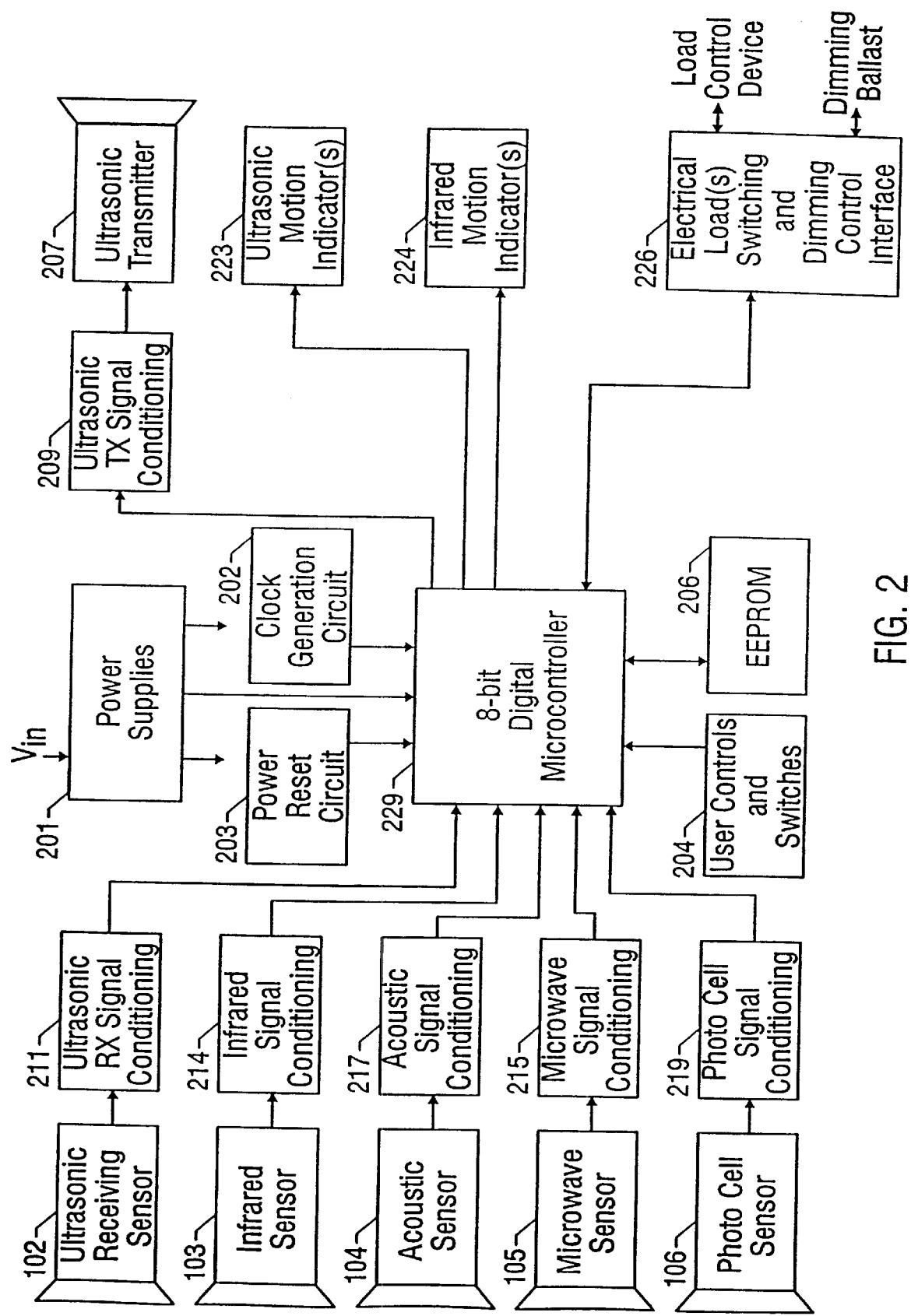
FIG. 2 is a detailed functional block diagram of the present invention.

A more detailed functional block diagram of the present invention is shown in FIG. 2. The occupancy sensor inputs are on the left hand side of the diagram. The digital microcontroller and its-related blocks are in the center of the diagram. The various outputs are on the right hand side of the diagram. The occupancy sensor has the following major functional blocks: power supplies circuit 201; clock generator circuit 202; power reset circuit 203; user controls and switches 204; EEPROM circuit 206; ultrasonic transmitter circuit 207; ultrasonic receiver circuit 102; ultrasonic transmitter signal conditioning circuit 209; ultrasonic receiver signal conditioning circuit 211; infrared sensor circuit 103; infrared signal conditioning circuit 214; acoustic sensor circuit 104; acoustic signal conditioning circuit 217; microwave sensor circuit 105, microwave signal conditioning circuit 215, microwave transmitter circuit 225, microwave transmitter signal conditioning circuit 210, photo cell sensor circuit 106; photo cell signal conditioning circuit 219; ultrasonic motion indicator circuit 223; infrared motion indicator circuit 224; electrical load(s) switching and dimming control interface 226; and digital microcontroller circuit 229.

Each of these electrical hardware blocks is now described in detail. An exemplary embodiment of the power supplies circuit 201 accepts an unregulated input voltage, Vin, and produces one or more regulated out voltages that are used to power the various components shown in FIG. 2. An exemplary embodiment has an input voltage is 24 VDC and produces nominal regulated output voltages of 13.1, 5.1 and 2.5 VDC, although other input and output voltages would also be acceptable. The 2.5 VDC supply is also referred to as VREF.

Clock generator circuit 202 may be of conventional crystal oscillator design, and in the exemplary embodiment, includes a crystal and a clock driver circuit internal to the digital microcontroller 229. The clock generator circuit 202 has no input and the output of the clock generator circuit is the digital oscillator clock signal for the digital microcontroller 229. An 8.0 MHz or 9.8 MHz parallel cut crystal is used depending on the desired ultrasonic transmitter frequency.

Power reset circuit 203 is of conventional design. The input to power reset circuit 203 is the 5.1 VDC power supply. The output of power reset circuit 203 is an exponentially rising analog signal used to reset the digital microcontroller 229 upon application of power.

Figure 3:
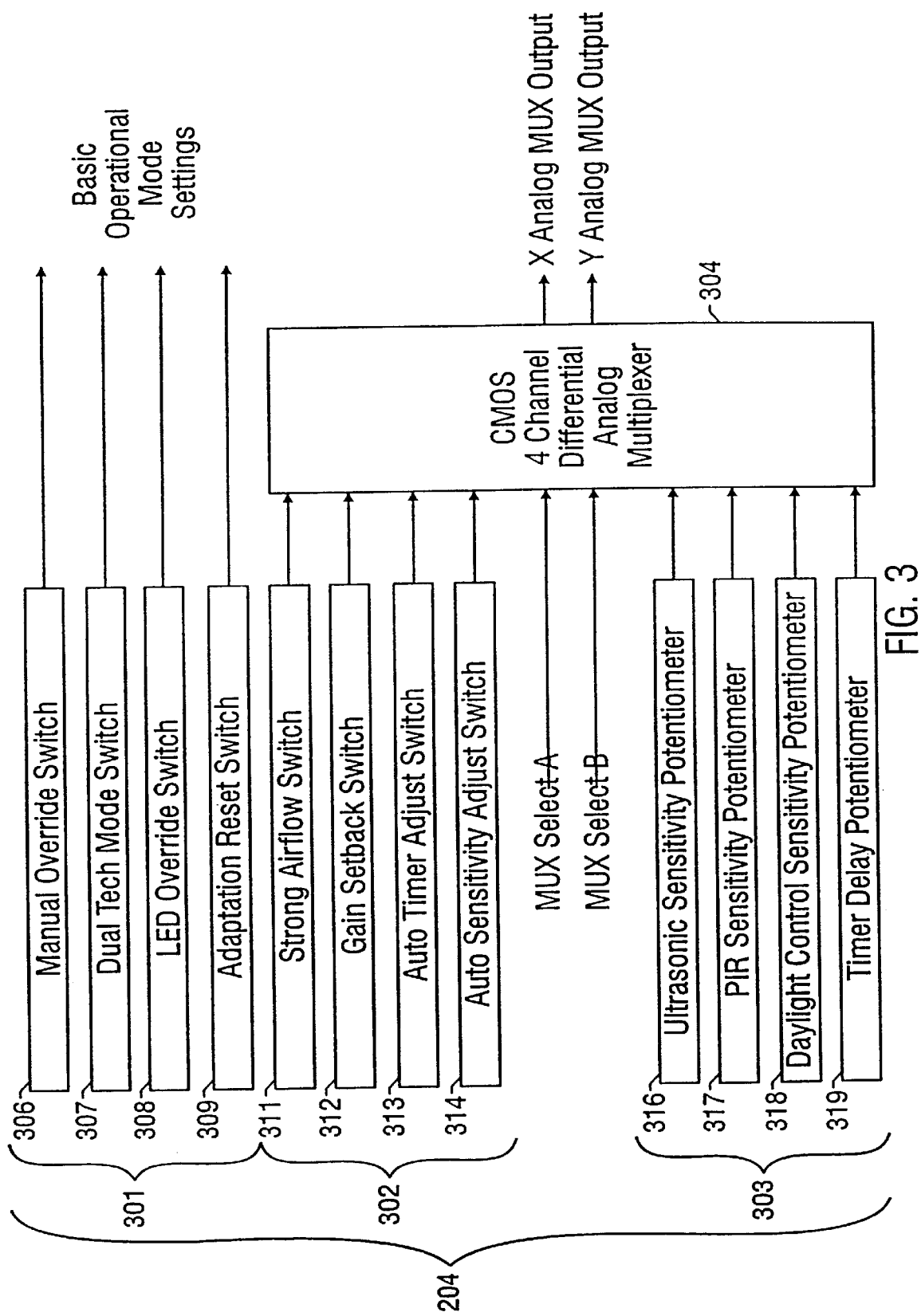
FIG. 3 is the user controls and switches circuit of the present invention.

An exemplary embodiment of the user controls and switches block 204 is shown in FIG. 3 and comprises two banks of switches 301, 302, four potentiometers 303 and a CMOS 4 channel differential analog multiplexer 304. The inputs to the user controls and switches block 204 are the user-specified settings of these switches and potentiometers. The outputs of the user controls and switches block 204 are the analog voltages corresponding to the user-specified settings.

The first bank of switches 301 includes four switches 306, 307, 308, 309 that determine the basic operational mode of the sensor. Specifically, these switches include manual override switch 306, dual technology mode switch 307, LED override switch 308 and adaptation reset switch 309.

Manual override switch 306 is used to override the normal operation of the sensor. In the ON state, the electrical load switched by the sensor will be energized at all times. In the OFF state, the electrical load switched by the sensor, will be energized whenever occupancy is sensed.

Dual technology mode switch 307 determines the thresholds to be used for comparing to the composite occupancy estimator. The system can be configured with any combination of ultrasonic, PIR and acoustic detection technologies. In the OFF state (referred to as the HIGH CONFIDENCE THRESHOLD mode), the sensor's composite activation threshold is set at a high level. In this mode, the sensor is less likely to false trigger, but the sensor is not as sensitive and therefore less likely to detect marginal detection cases. In the ON state (referred to as the HIGH SENSITIVITY THRESHOLD mode), the sensor's composite activation threshold is set at a lower level than the HIGH CONFIDENCE THRESHOLD mode. In this mode, the sensor is more sensitive and will more accurately detect marginal cases at the risk of a greater likelihood of false triggering.

LED override switch 308 is used to override the normal operation of the sensor's LEDs. In the OFF state, all sensor LEDs will be disabled. In the ON state, all sensor LEDs will be enabled.

Adaptation reset switch 309 is used to reset the sensor's adaptive variables. If the sensor's environment changes significantly a long time after the power on reset condition, the sensor's adaptive variables may need to be reset so that the sensor can begin adapting to its new environment. In the OFF state, the sensor's adaptive variables will not be reset. In the ON state, the sensor's adaptive variables will be reset.

The second bank of switches 302 comprises four switches 311, 312, 313, 314 that select the more advanced features of the sensor. Specifically, these switches include: strong airflow algorithm switch 311, gain setback switch 312, automatic timer adjustment switch 313, and automatic sensitivity adjustment switch 314.

Strong airflow algorithm switch 311 is used to modify the ultrasonic sensor's response in order to better compensate for the presence of air flow. In the OFF state, the sensor uses its standard airflow ultrasonic DSP algorithm. In the ON state, the sensor uses its strong airflow ultrasonic DSP algorithm.

Gain setback switch 312 is used to determine the sensor's gain as a function of time since motion was last sensed. In the OFF state, the sensor's gain does not vary as a function of time. In the ON state, the sensor's gain will vary as a function of time.

Automatic timer adjustment switch 313 is used to determine the sensor's timer delay setting as a function of time. In the OFF state, the sensor's timer delay setting does not automatically vary as a function of time. In the ON state, the sensor's timer delay setting varies automatically as a function of time.

Automatic sensitivity adjustment switch 314 is used to determine the sensor's sensitivity setting as a function of time. In the OFF state, the sensor's sensitivity setting does not automatically vary as a function of time. In the ON state, the sensor's sensitivity setting varies automatically as a function of time.

The user controls and switches block 204 also contains four potentiometers: ultrasonic sensitivity potentiometer 316, PIR sensitivity potentiometer 317, daylight control sensitivity potentiometer 318, and timer delay potentiometer 319.

Ultrasonic sensitivity potentiometer 316 is used to increase or decrease the sensor's ultrasonic sensitivity. The ultrasonic sensitivity potentiometer setting maps linearly to sensor range. PIR sensitivity potentiometer 317 is used to increase or decrease the sensor's PIR sensitivity. Daylight control sensitivity potentiometer 318 is used to adjust the sensor's daylight control sensitivity by increasing or decreasing the daylight control ambient light threshold. Timer delay potentiometer 319 is used to adjust the sensor's timer delay by increasing or decreasing the length of time the sensor's electrical load(s) are energized following occupancy detection. The timer delay potentiometer setting maps linearly to sensor time delay.

The user controls and switches block 204 also contains a CMOS 4 channel differential analog multiplexer 304. Multiplexer 304 may be a 4052 type multiplexer, available from National Semiconductor. Multiplexer 304 allows the user to simultaneously read two analog input signals. The inputs to multiplexer 304 are two banks of four analog signals 302, 303 and two digital logic control signals A and B generated by digital microcontroller 229 (FIG. 2). The outputs of multiplexer 304 are the two analog signals selected using the multiplexer 304 for application to digital microcontroller 229.

In the exemplary embodiment, EEPROM circuit 206 comprises a CMOS 256×8 serial EEPROM for non-volatile storage of the various occupancy sensor registers although other memories may be used. EEPROM circuit 206 has two inputs, a serial clock and serial data line. The output of the EEPROM circuit is a serial data line. In the exemplary embodiment, EEPROM 206 uses a standard serial bus protocol for saving and retrieving the various occupancy sensor register values.

Figure 4:
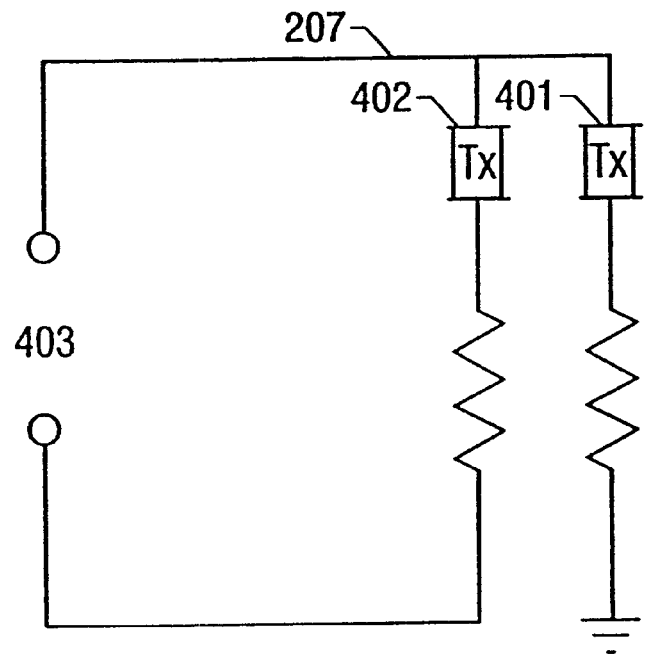
FIG. 4 is the ultrasonic transmitter circuit of the present invention.

An exemplary embodiment of the ultrasonic transmitter circuit 207 is shown in FIG. 4 and is comprised of one or two 16 mm narrowband air ultrasonic ceramic transducers 401, 402. The input 403 to these transducers 401, 402 is either a 0 to 15 volt or −15 to 15 volt variable duty cycle square wave, although other driving signal may also be acceptable. The output of transducers 401, 402 is an ultrasonic continuous-wave tone at the desired frequency of interest.

An exemplary embodiment supports ultrasonic transmitter frequencies of 25 KHz, 32 KHz and 40 KHz, but other frequencies would also be acceptable. A variety of commercial ultrasonic transmitting transducers are available. For example, acceptable 16 mm transmitting transducers available from S-Square are shown in Table 1.

TABLE 1

Exemplary S-Square Ultrasonic Transmitting Transducers

| Frequency (KHz) | Model Number | Sound Level (dB) | Bandwidth (KHz) | Capacitance (pF) | Input Power (watts) |
| --- | --- | --- | --- | --- | --- |
| 25 | 250ST160 | 112 | 2 | 2400 | 0.2 |
| 32 | 328ST160 | 115 | 2 | 2400 | 0.2 |
| 40 | 400ST160 | 119 | 2 | 2400 | 0.2 |

Figure 5:
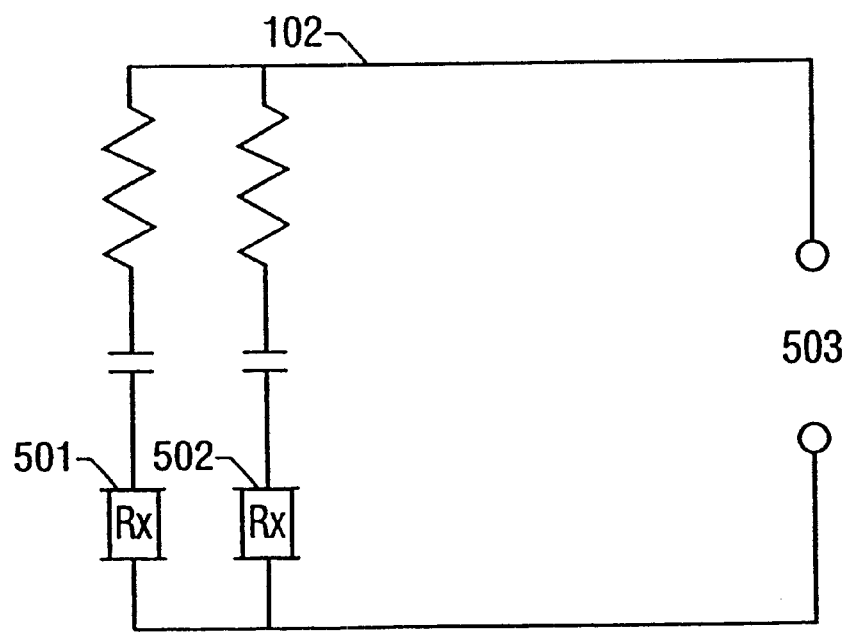
FIG. 5 is the ultrasonic receiver circuit of the present invention.

An exemplary embodiment of ultrasonic receiver circuit 102 is shown in FIG. 5 and includes one or two 16 mm narrowband air ultrasonic ceramic transducers 501, 502. The input to these transducers 501, 502 is an ultrasonic continuous-wave tone centered at the desired frequency of interest with an additional Doppler-shifted signal corresponding to motion in the sensor's field of view. The output 503 of ultrasonic receiver circuit 102 is an electrical signal corresponding to the received acoustic signal. An exemplary embodiment of the present invention supports ultrasonic receiver frequencies of 25 KHz, 32 KHz and 40 KHz, and variety of commercial ultrasonic receiving transducers are available. For example, acceptable 16 mm receiving transducers available from S-Square are shown in Table 2.

TABLE 2

Exemplary S-Square Ultrasonic Receiving Transducers

| Frequency (KHz) | Model Number | Sensitivity (dB) | Bandwidth (KHz) | Capacitance (pF) | Input Power (watts) |
| --- | --- | --- | --- | --- | --- |
| 25 | 250SR160 | −65 | 2 | 2400 | 0.2 |
| 32 | 328SR160 | −67 | 2.5 | 2400 | 0.2 |
| 40 | 400SR160 | −65 | 2.5 | 2400 | 0.2 |

Figure 6:
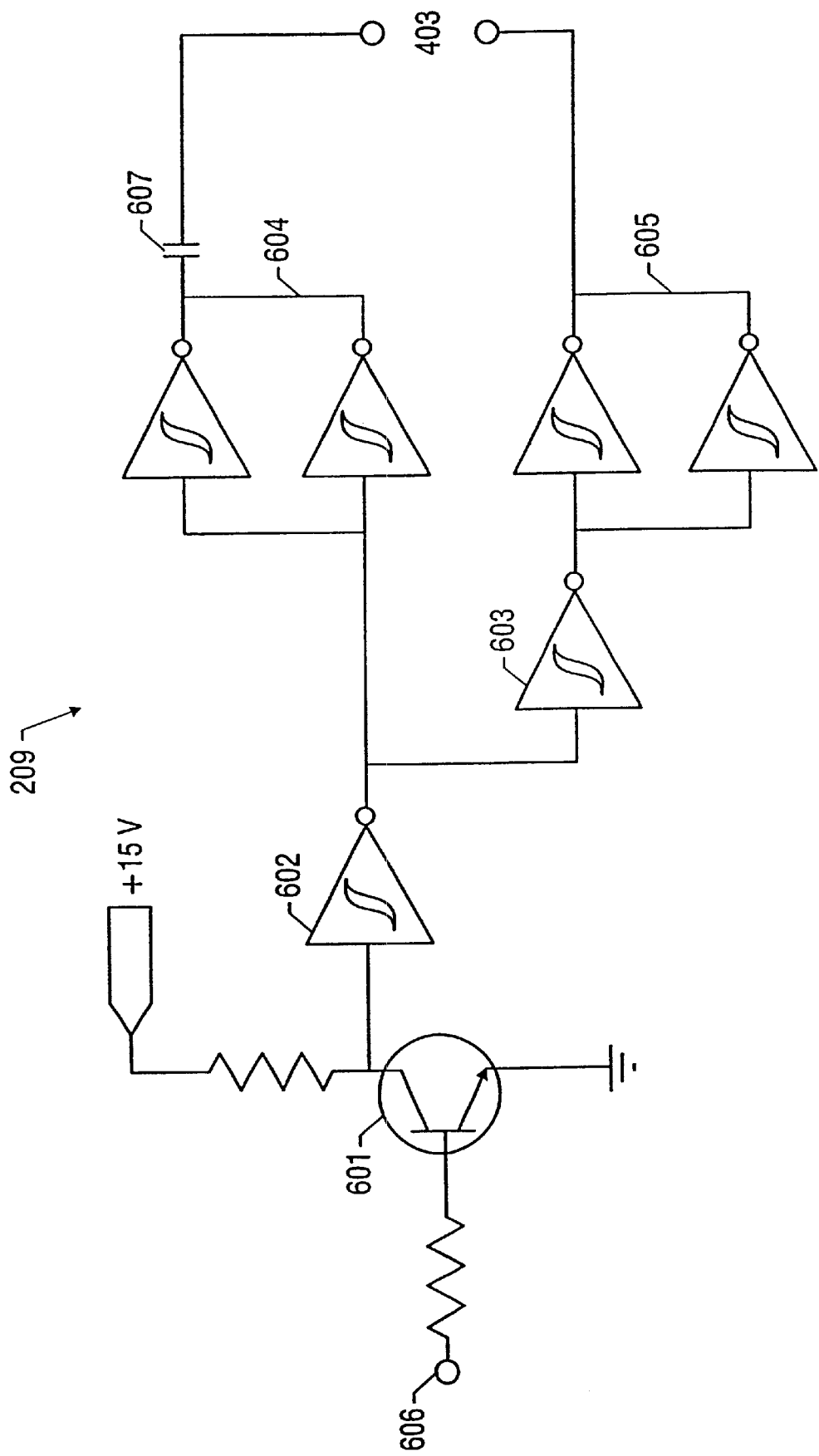
FIG. 6 is the ultrasonic transmitter signal conditioning circuit of the present invention.

An exemplary ultrasonic transmitter signal conditioning circuit 209 is shown in FIG. 6 and includes an NPN transistor circuit 601, a CMOS buffer circuit 602, a CMOS inverter circuit 603 and two CMOS driver circuits 604, 605. Input 606 to circuit 209 is a variable duty cycle TTL-level square wave generated by the digital microcontroller 229. Output 403 of circuit 209 is applied to ultrasonic transmitter circuit 207 (FIG. 4) and is either a single-ended or double-ended ultrasonic transmitter signal at the desired frequency of interest.

The variable duty cycle TTL-level square wave input signal 606 generated by the digital microcontroller 229 is generated by a latch (not shown) that is set at a rate determined by a carrier period counter value, and that is cleared within each carrier period at a point determined by the carrier pulse width counter value. Unequal turn-on and turn-off times of the transmitter signal conditioning circuit 209 that drives the carrier send transducer may result in an asymmetric signal at the amplifier output, and thus less than full power being dissipated in transmitter. The sensor algorithm may compensate for the unequal turn-on and turn-off times by setting the carrier pulse width counter to a predetermined value intended to yield a symmetric square wave at the amplifier output. In the event that it is desired to decrease the transmitter output power level, the carrier pulse width counter may be varied to deviate from a 50% duty cycle square wave, lowering the effective AC drive level to the transmitting transducer, and thus the output level.

NPN transistor circuit 601 is used as a level shifter. The input to NPN transistor circuit 601 is a TTL-level square wave. The output of NPN transistor circuit 601 is a 0 to 15 volt level square wave. CMOS buffer circuit 602 is composed of a single CMOS inverter with Schmitt trigger. This CMOS inverter 602 is used to increase the output drive capability of the NPN transistor circuit 601. The input to the CMOS buffer 602 is a 0 to 15 volt level square wave. The output of the CMOS buffer 602 is a 0 to 15 volt level square wave. CMOS inverter circuit 603 is comprised of a single CMOS inverter with Schmitt trigger. CMOS inverter circuit 603 inverts the ultrasonic transmitter signal to allow double-ended transmitter drive capability. The two CMOS driver circuits 604, 605 are each comprised of two CMOS inverters with Schmitt triggers, in parallel. These two driver circuits 604, 605 allow the ultrasonic transducer(s) to be driven in either single ended or differential mode. For single ended mode the transducer(s) is connected between driver circuit 604 via capacitor 607, and the effective drive applied to the transducer(s) is a square wave with amplitude +7.5V to −7.5V. For differential drive, the transducer(s) is connected between driver circuit 604, coupled via capacitor 607, and driver circuit 605, and the effective drive applied to the transducer(s) is a square wave of amplitude +15V to −15V.

Figure 7A:
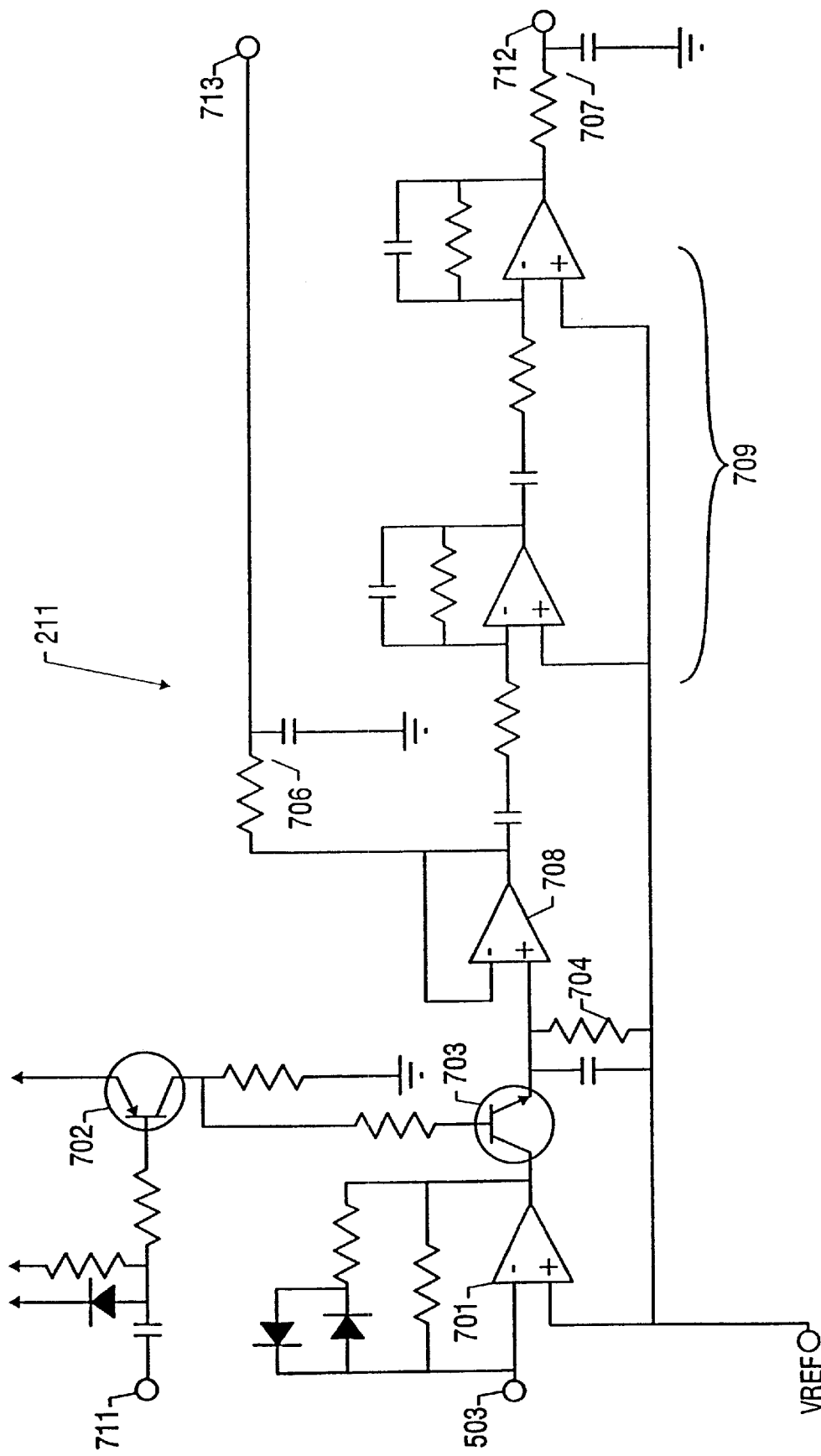
FIG. 7(a) is the ultrasonic receiver signal conditioning circuit of the present invention.

The ultrasonic receiver signal conditioning circuit 211 is shown in FIG. 7(a) and includes a variable gain op amp circuit 701, a PNP transistor circuit 702, an NPN transistor circuit 703, three RC circuits 704, 706, 707, an op amp buffer circuit 708 and a two stage op amp circuit 709. The inputs to ultrasonic receiver signal conditioning circuit 211 are the Doppler-shifted analog ultrasonic receiver signal 503 and a digital sampling point signal 711. The outputs of ultrasonic receiver signal conditioning circuit 211 are the demodulated, filtered analog ultrasonic receiver signal 712 and an analog ultrasonic sampling point signal 713.

Variable gain op amp circuit 701 is an ultrasonic receiver preamplifier circuit. The input to this circuit is the modulated analog ultrasonic receiver signal 503. The output of this circuit is an amplified, modulated analog ultrasonic receiver signal. Circuit 701 uses diodes in the negative feedback path to switch in parallel with a resistor, thus decreasing the overall gain for large signal excursions, and preventing hard-limiting of the amplifier in the event of excessive continuous wave receiver signals. The resulting nonlinear transfer characteristic is advantageous when the sensor is installed in a confined space where wall reflections cause a large amount of acoustic energy to be directed into the ultrasonic receiver.

PNP transistor circuit 702 is a zero crossing phase lock loop sampling point circuit. The input to circuit 702 is a digital sampling point signal 711 generated by the digital microcontroller 229. The output of circuit 702 is an analog sampling signal used to drive the synchronous demodulator circuit 703. Circuit 702 varies the position (or phase) of the sampling point on the ultrasonic receiver waveform under control of digital microcontroller 229. This prevents the loss of motion information due to large signal levels. For optimum sensitivity, the synchronous sample point on the ultrasonic receiver waveform should lie as close to the zero crossing as possible.

NPN transistor circuit 703 is a synchronous demodulator circuit. The two inputs to circuit 703 are the amplified modulated analog ultrasonic receiver signal and the analog sampling point signal. The output of circuit 703 is the demodulated Doppler-shifted analog ultrasonic receiver signal. The NPN transistor in circuit 703 is arranged in a series pass configuration and is driven by the analog sampling point signal generated by PNP transistor circuit 702.

RC circuit 704 is an envelope detector circuit. The input to RC circuit 704 is the Doppler-shifted analog ultrasonic receiver signal. The output of RC circuit 704 is the filtered, demodulated Doppler-shifted analog ultrasonic receiver signal. RC circuit 704 acts as an envelope detector and filters out the ultrasonic carrier while preserving the low frequency Doppler shift signal information.

Op amp buffer circuit 708 serves to increase the drive capability of the synchronous demodulator circuit 703. The input to circuit 708 is the filtered, demodulated Doppler-shifted analog ultrasonic receiver signal. The output of circuit 708 is the increased drive, filtered, demodulated Doppler-shifted analog ultrasonic receiver signal.

RC circuit 706 is a lowpass filter circuit. The input to RC circuit 706 is the increased drive, filtered, demodulated Doppler-shifted analog ultrasonic receiver signal. The output of RC circuit 706 is the increased drive, lowpass filtered, demodulated Doppler-shifted analog ultrasonic receiver signal. The output of circuit 708 is lowpass filtered to remove contributions due to motion in the environment, leaving a DC signal that represents the receiver carrier amplitude at the ultrasonic sample point. This signal is sampled by the digital microcontroller 229 through signal 711 to yield the analog ultrasonic sampling point signal 713.

Two stage op amp circuit 709 is a bandpass filter circuit. The input to circuit 709 is the increased drive, filtered, demodulated Doppler-shifted analog ultrasonic receiver signal. The output of circuit 709 is the increased drive, bandpass filtered, demodulated Doppler-shifted analog ultrasonic receiver signal. The pass band of circuit 709 is designed to pass the Doppler-shifted signal for motions of interest.

RC circuit 707 is an anti-aliasing filter circuit. The input to RC circuit 707 is the increased drive, bandpass filtered, demodulated Doppler-shifted analog ultrasonic receiver signal. The output of RC circuit 707 is the anti-aliased, increased drive, bandpass filtered, demodulated Doppler-shifted analog ultrasonic receiver signal. The output signal 712 is sampled by the digital microcontroller 229 A/D circuitry and processed using a variety of digital signal processing techniques as discussed in detail below.

Figure 7B:
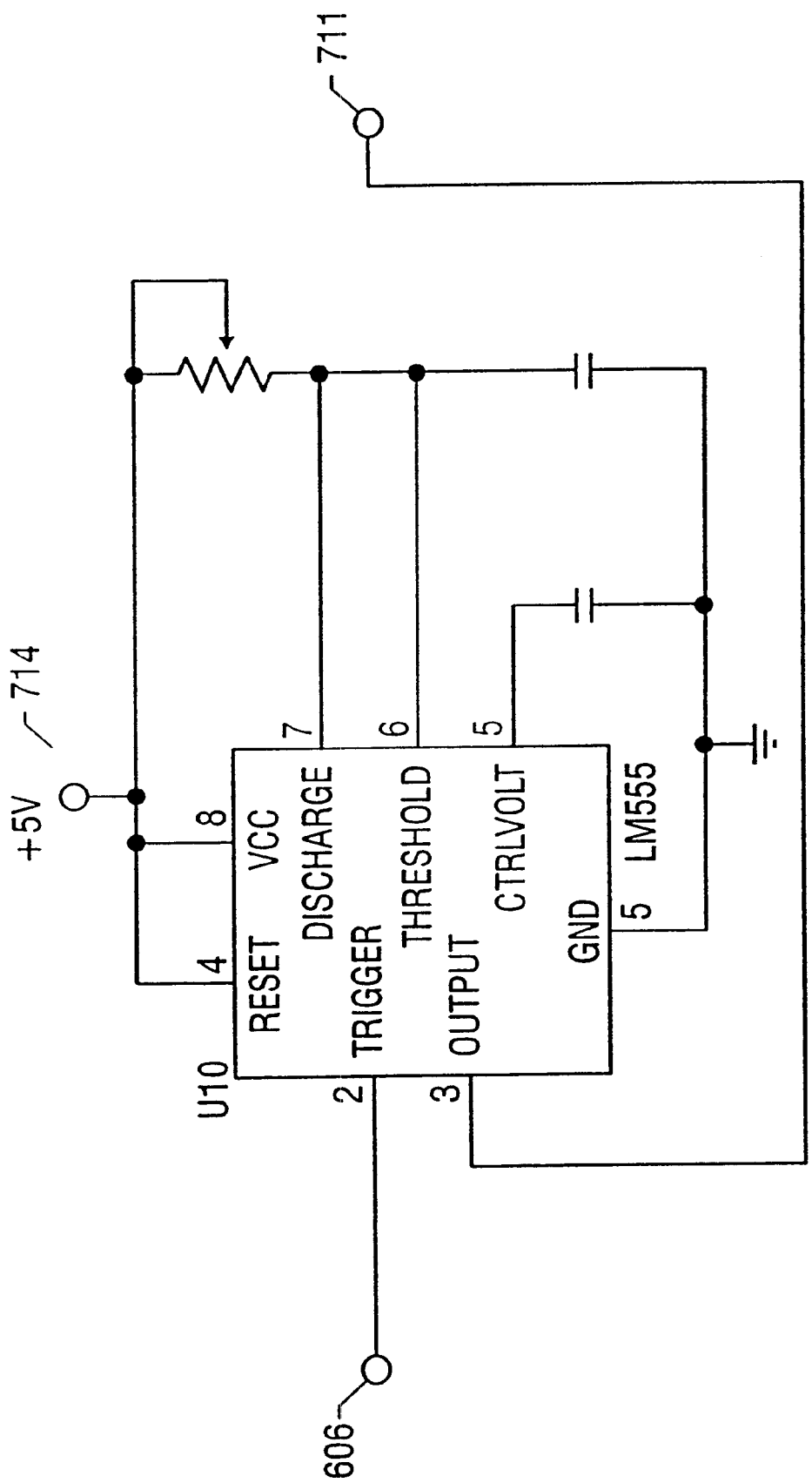
FIG. 7(b) is an alternative sampling control circuit useable in the circuit of FIG. 7(a)

FIG. 7(b) is an exemplary embodiment of a circuit that may be used in combination with the circuit of FIG. 7(a) to affect sampling of the Doppler shifted ultrasonic signal without the use of microcontroller 229 to generate the sampling signal. The circuit of FIG. 7(b) is based on a commercially available 555 timer circuit 714 and peripheral circuitry. The input to the timer circuit 714 is the same as the input 606 to the transmitter signal conditioning circuit shown in FIG. 6, and the output of the timer circuit 714 is connected to the sampling point signal input 711 to the ultrasonic receiver signal conditioning circuit of FIG. 7(a).

Figure 8:
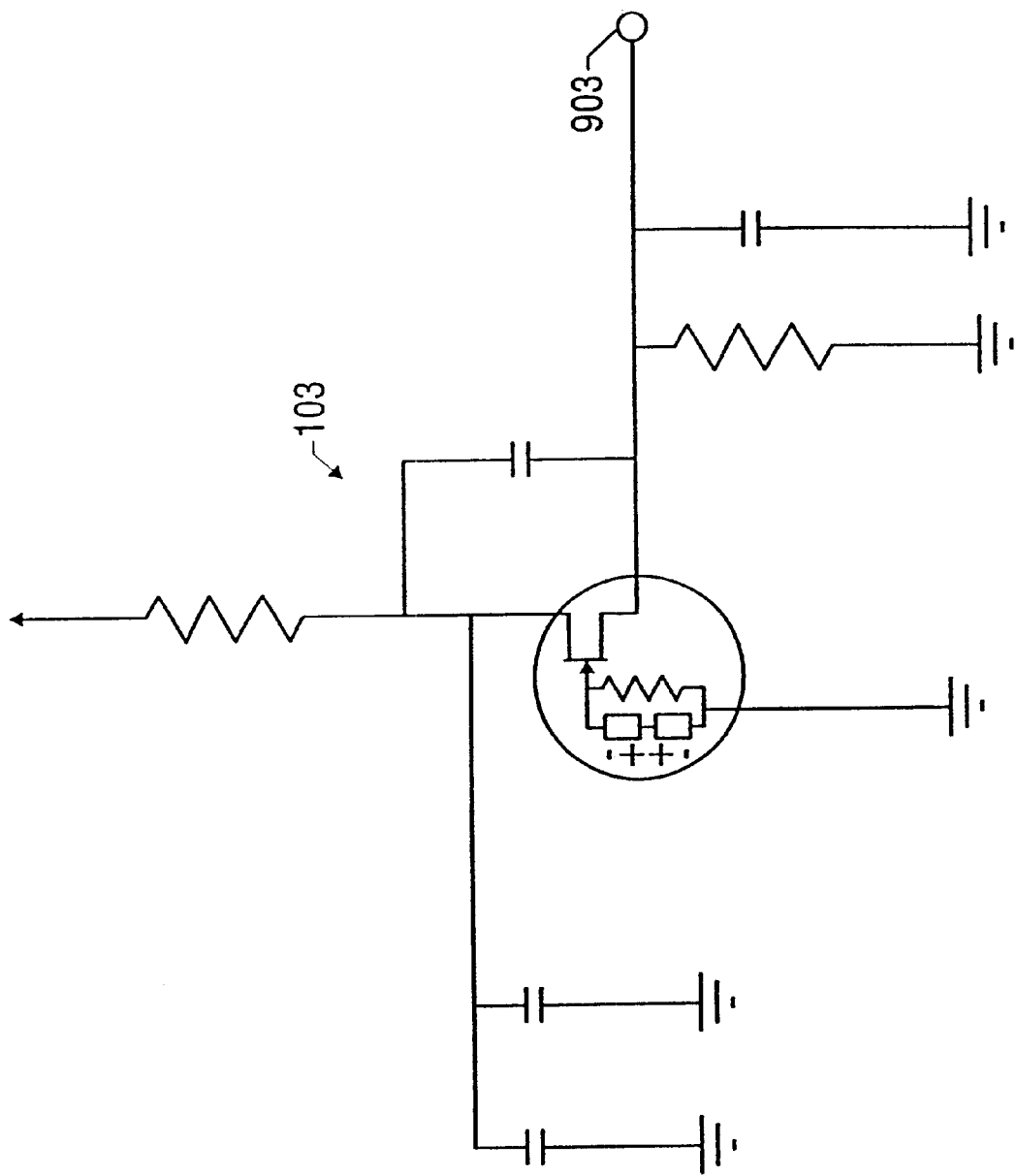
FIG. 8 is the infrared sensor circuit of the present invention.

An exemplary embodiment of the infrared sensor circuit 103 is shown in FIG. 8 and includes a dual element pyroelectric infrared motion sensor circuit. The input to infrared sensor circuit 103 is infrared electromagnetic radiation. The output of infrared sensor circuit 103 is an electrical signal indicative of motion.

A variety of commercial infrared motion sensors are available. An acceptable example is the Heimann LHi 878 dual element pyroelectric infrared motion sensor. This sensor is designed to detect motion of human body radiation in the range of electromagnetic wavelengths of 5 to 14 micrometers. Other infrared sensors would also be acceptable.

Figure 9:
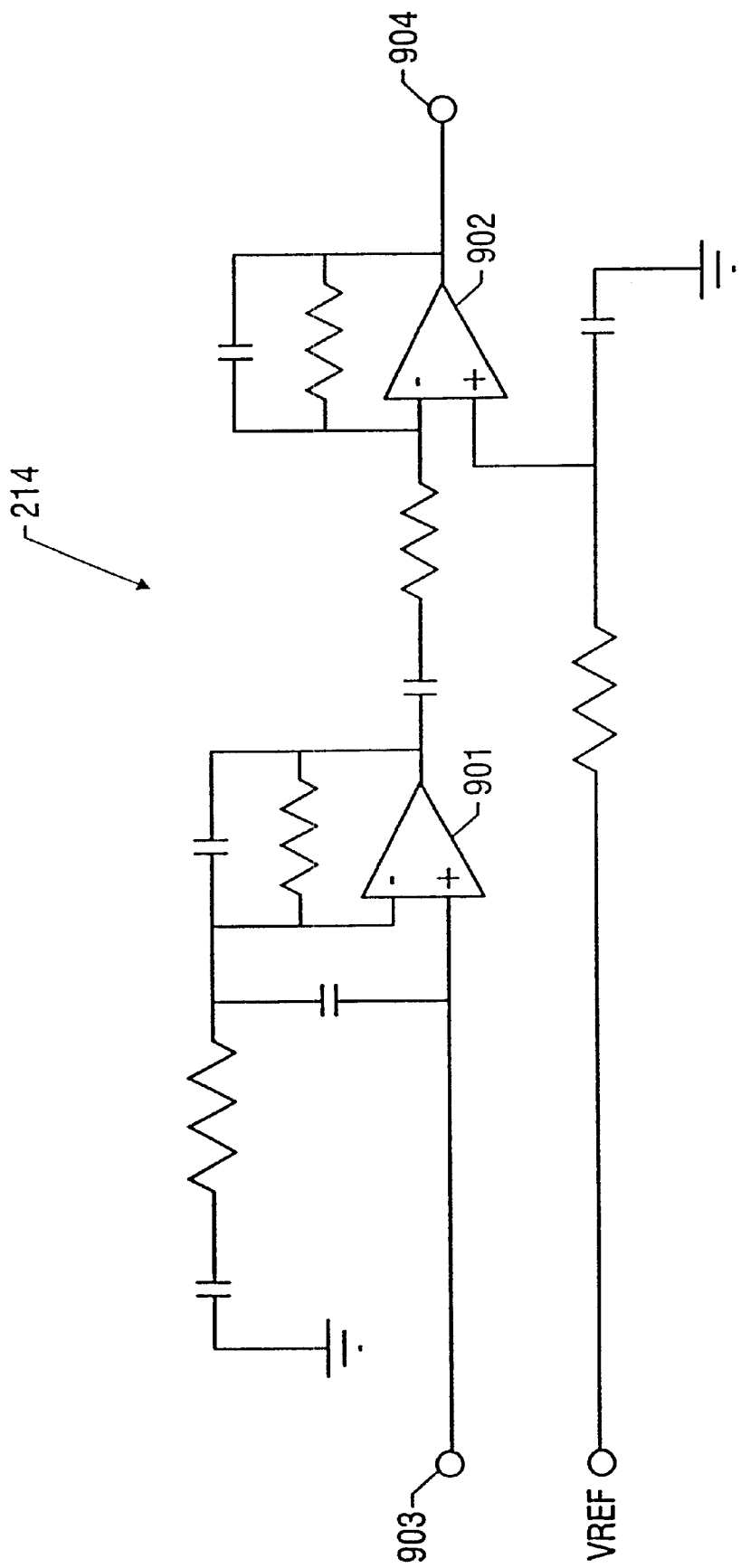
FIG. 9 is the infrared signal conditioning circuit of the present invention.

An exemplary embodiment of the infrared signal conditioning circuit 214 is shown in FIG. 9 and includes two cascaded op amp bandpass circuits 901, 902. The input 903 to infrared signal conditioning circuit 214 is the electrical PIR sensor signal indicative of motion. The output 904 of infrared signal conditioning circuit 214 is a bandpass filtered infrared sensor signal indicative of motion. The output signal 904 of this circuit is sampled by A/D circuitry within the digital microcontroller 229 and processed using a variety of digital signal processing techniques discussed below.

Figure 10:
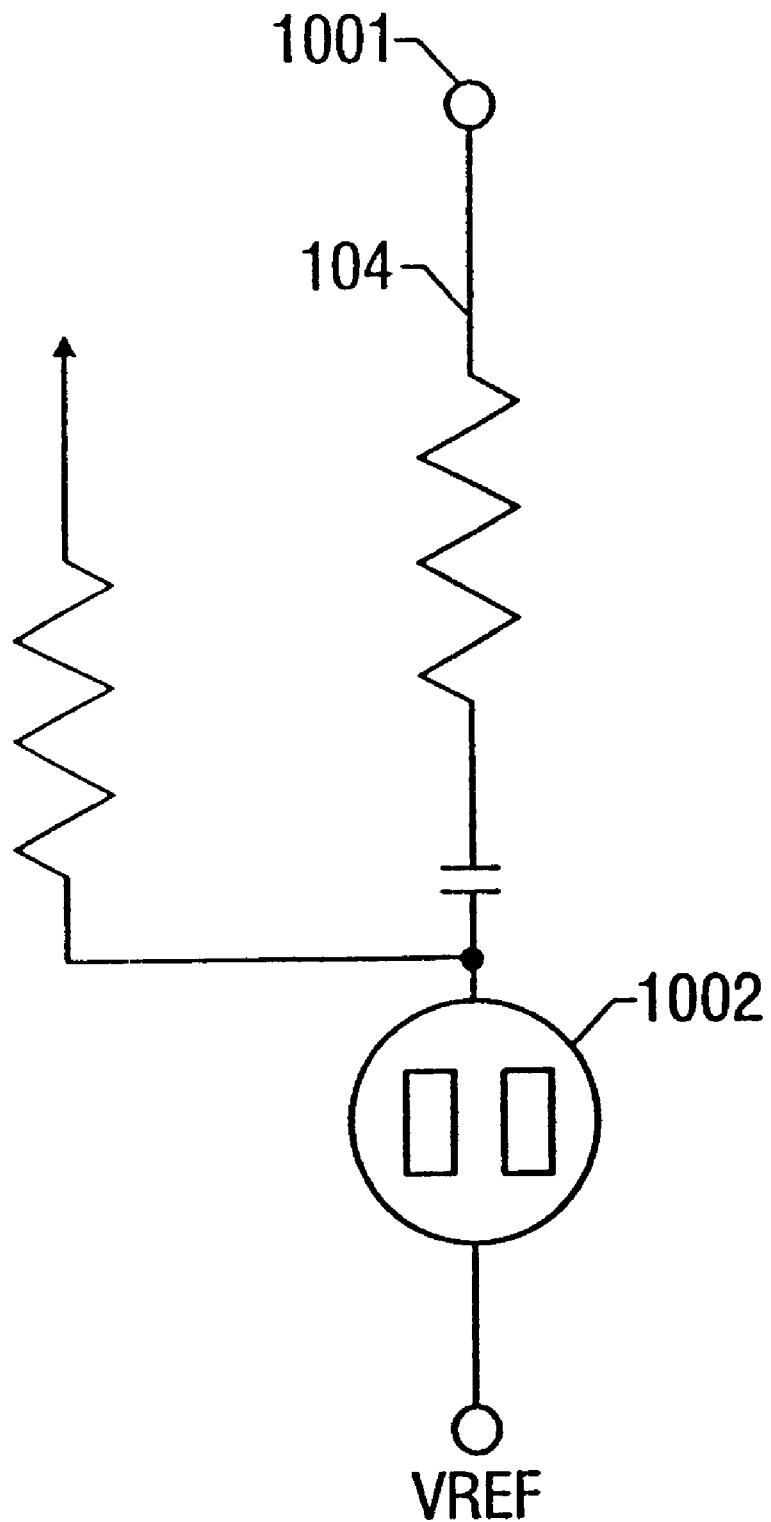
FIG. 10 is the acoustic sensor circuit of the present invention.

An exemplary embodiment of the acoustic sensor circuit 104 is shown in FIG. 10 and includes an audio acoustic sensor 1002 and surrounding circuitry. The input to acoustic sensor circuit 104 is sound energy. The output 1001 is an electrical signal indicative of occupancy such as human speech and sounds generated by human occupants.

A variety of commercial acoustic sensors 1002 are available. An acceptable example is the Panasonic WM-52BM electret condenser microphone cartridge. It includes a high voltage internal electret membrane, metal electrode and a field effect transistor (FET). Frequency range extends from 20–16,000 Hz.

Figure 11:
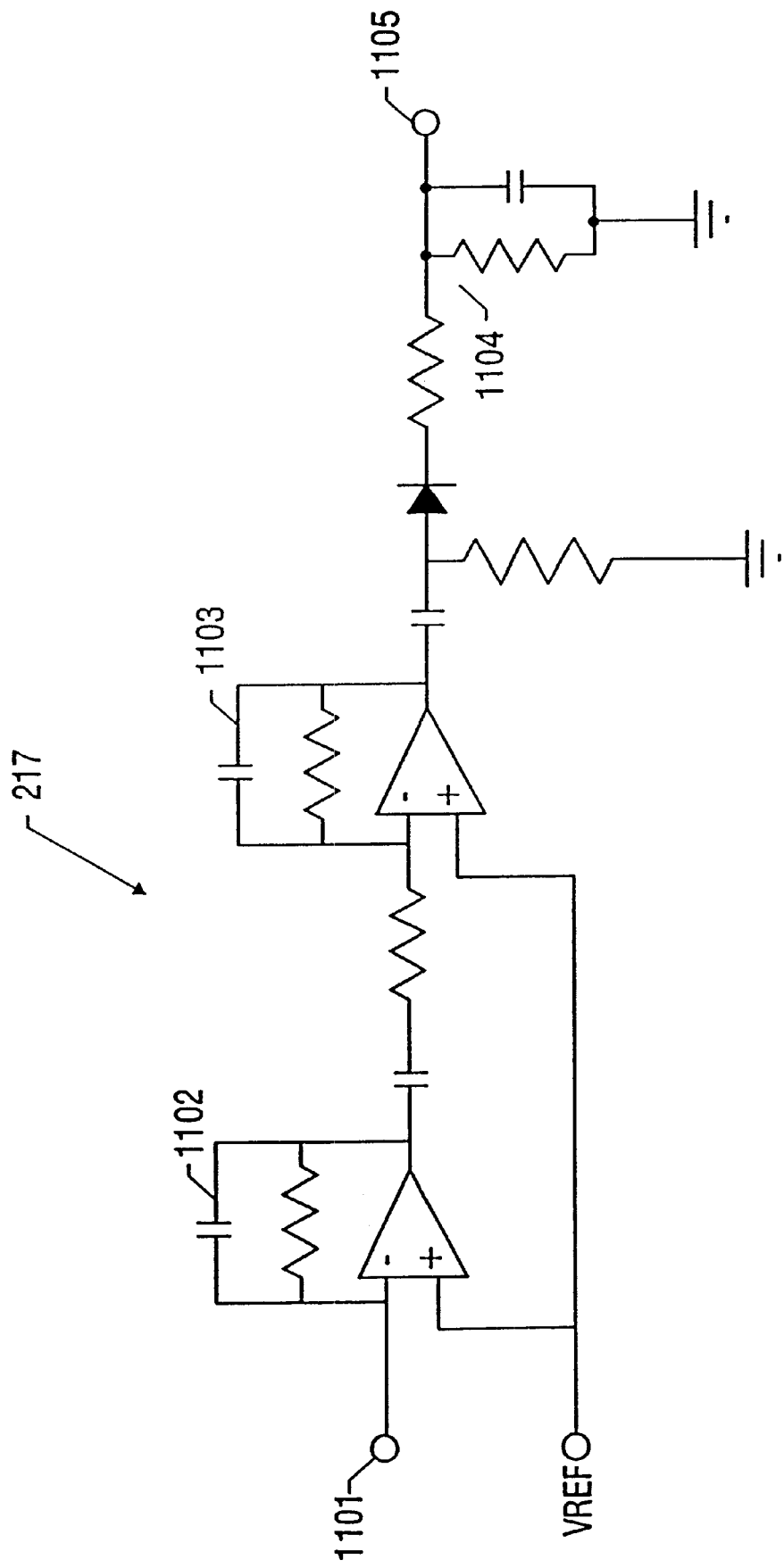
FIG. 11 is the acoustic signal conditioning circuit of the present invention.

An exemplary embodiment of the acoustic signal conditioning circuit 217 is shown in FIG. 11 and includes two cascaded op amp band pass circuits 1102 and 1103 followed by a fast attack, slow decay peak detector 1104. The input 1101 to acoustic signal conditioning circuit 217 is the electrical acoustic sensor signal indicative of occupancy

1001. The output 1105 of the acoustic signal conditioning circuit 217 represents the magnitude of acoustic energy. The output signal of this circuit is sampled by A/D circuitry within the digital micro controller 229 and processed using a variety of digital signal processing techniques discussed in detail below.

Figure 12:
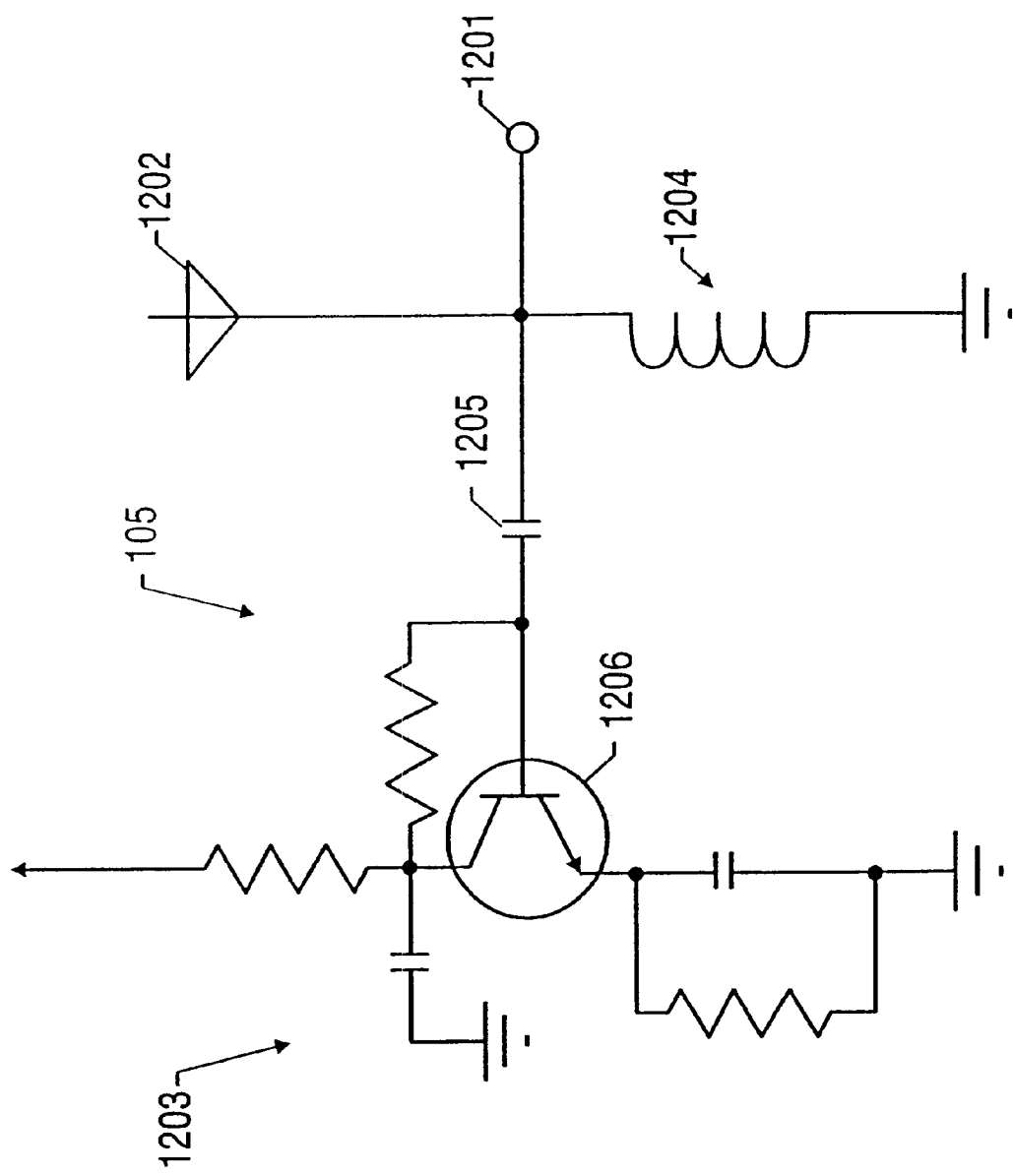
FIG. 12 is the microwave transmitter/receiver circuit of the present invention.

An exemplary embodiment of the microwave sensor circuit 105 is shown in FIG. 12, and includes a microwave antenna 1202 and an oscillator circuit 1203. Circuit 105 combines the transmitting and receiving elements into one antenna 1202. The antenna 1202, inductor 1204, capacitor 1205 determine oscillator frequency and with NPN transistor circuit 1206 form the oscillator and transmitter. The output impedance of the transmitter is high enough not to significantly reduce reflected signal reception. The input to microwave sensor circuit 105 is electromagnetic energy reflected from the observed space. The output 1201 is an amplitude modulated radio frequency signal indicative of motion. A variety of constructions for antenna 1202 are available from wave guides to simple wire.

Figure 13:
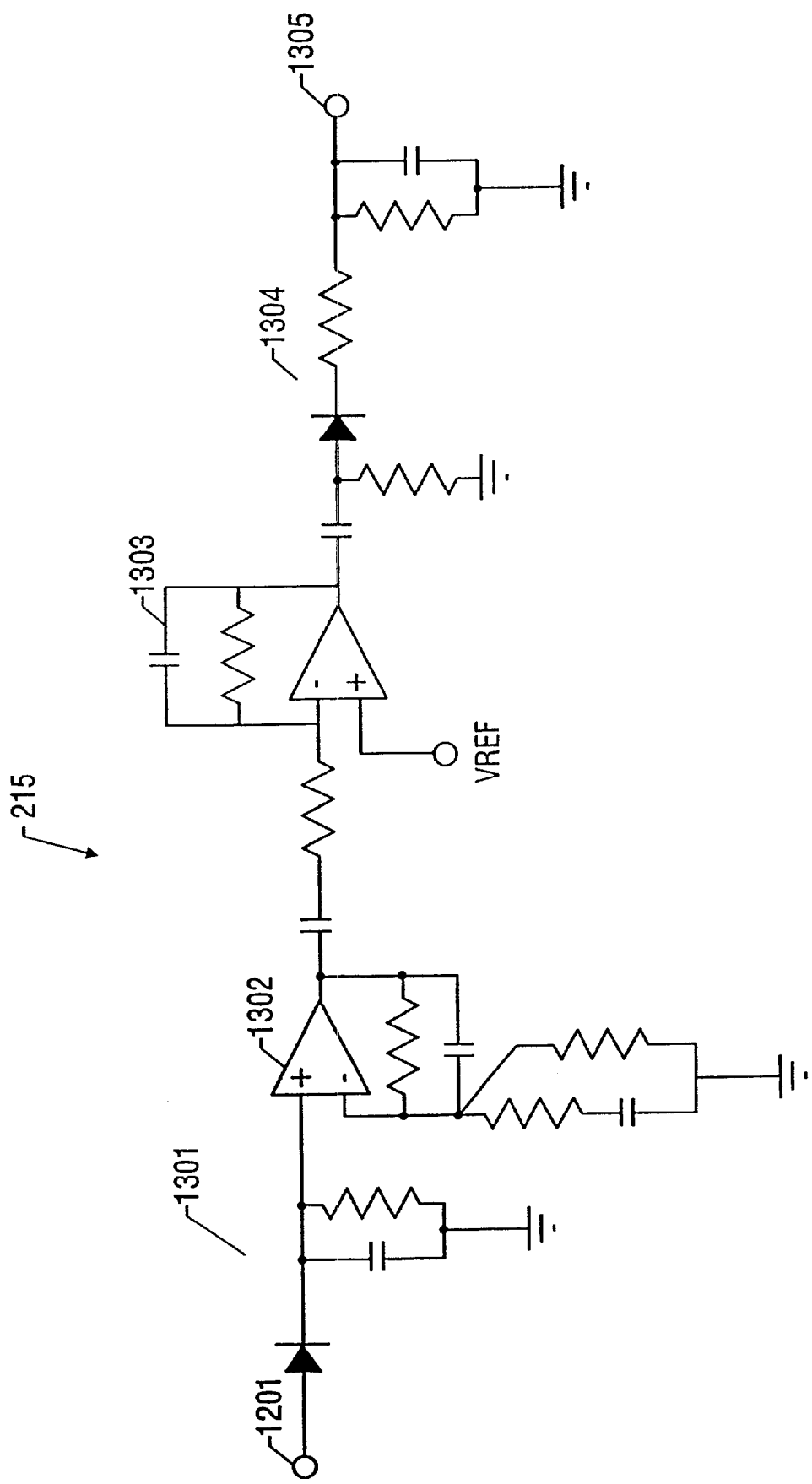
FIG. 13 is the microwave signal conditioning circuit of the present invention.

An exemplary embodiment of the microwave signal conditioning circuit 215 is shown in FIG. 13 and includes two cascaded op amp band pass circuits 1302 and 1303, followed by a fast attack, slow decay peak detector 1304. The input 1201 to microwave signal conditioning circuit 215 is the electrical microwave sensor signal indicative of motion. The output 1305 of microwave signal conditioning circuit 215 represents the magnitude of received Doppler microwave energy. The output signal 1305 is sampled by A/D circuitry within the digital micro controller 229 and processed using a variety of digital signal processing techniques discussed in detail below.

Figure 14:
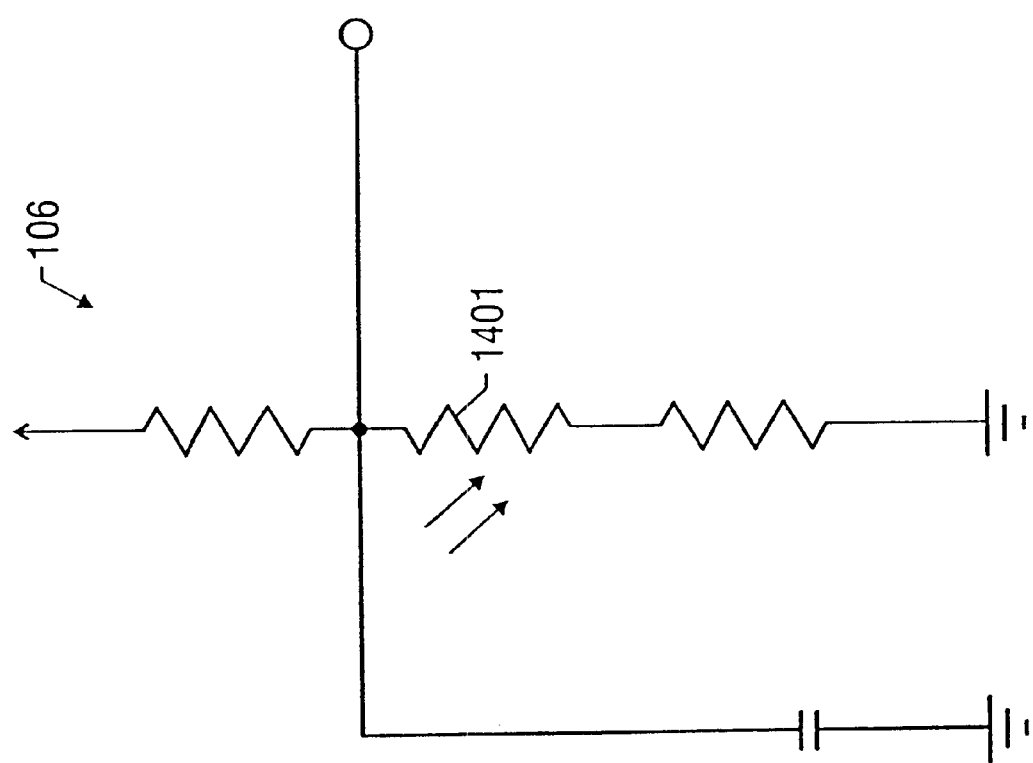
FIG. 14 is the photo cell sensor circuit of the present invention.

An exemplary embodiment of the photo cell sensor circuit 106 is shown in FIG. 14 and is comprised of a visible light photo sensor 1401 and supporting circuitry. The input to photo cell sensor circuit 106 is visible electromagnetic radiation. The output of photo cell sensor circuit 106 is an electrical signal indicative of ambient light. A variety of commercially available photo cells are available for use as light photo sensor 1401, including, for example, the Vactec VT90N4 photoconductive cell sensor.

Photo cell signal conditioning circuit 219 may be, for example, an RC lowpass filter. The input to this RC lowpass filter is the electrical photo cell sensor signal indicative of ambient light. The output of this RC lowpass filter is a lowpass filtered photo cell sensor signal indicative of ambient light. The output signal of photo cell signal conditioning circuit 219 is sampled by A/D circuitry within the digital microcontroller 229 and processed using a variety of digital signal processing techniques as described in detail below.

Ultrasonic motion indicator circuit 223 and infrared motion indicator circuit 224 may each be comprised of LEDs driven by digital microcontroller 229. The outputs of these indicators 223 and 224 are lights indicating that the ultrasonic or infrared portion of the sensor has detected motion above user-specified thresholds. In the preferred embodiment, the ultrasonic activation threshold and the infrared activation threshold are used only for the purpose of driving the ultrasonic motion indicator and infrared motion indicator and are not used by the digital sensor fusion detection algorithm to determine occupancy.

The electrical load switching and dimming control interface circuit 226 may take many forms and typically includes a conventional transistor-based relay driver circuit and relay that interfaces digital microcontroller 229 with an electrical load that is operated at a higher voltage than the power supplied to microcontroller 229. Provisions may be made to control any number of electrical loads. Incandescent light loads may be controlled by a simple relay, while fluorescent lighting may be controlled using dimming ballasts or other electrical load dimming devices in a known manner.

In accordance with one embodiment of the present invention, the digital microcontroller circuit 229 may be an 8-bit CMOS microcontroller with A/D converter for sophisticated communication and control of the sensor. An acceptable commercially available microcontroller is an 8-bit low-cost, high-performance Microchip PIC 16C73A fully-static, EEPROM-based 28-pin CMOS microcontroller, however, other microcontrollers or microprocessors may also be acceptable. The microcontroller clock frequency in an exemplary embodiment is either 8.0 MH or 9.83 MHz depending on the desired ultrasonic frequency. The preferred device has an advanced RISC-like Harvard architecture and includes a large register set, an eight-level deep hardware stack and supports multiple internal and external interrupt sources. The device has 192 bytes of RAM and 22 I/O pins. It also has a variety of on-chip peripherals including five 8-bit A/D channels, three timer/counters modules, two capture/compare/pulse width modulation (PWM) modules and two serial ports. The synchronous serial port of the device can be configured as either a 3-wire serial peripheral interface device or a two-wire Inter-Integrated Circuit (I²C) bus device. The serial communications interface can be configured as either a synchronous or an asynchronous device. The device offers four oscillator options and includes a highly reliable watchdog timer to provide protection against software malfunctions.

Although the hardware aspects of the present invention have been described with reference to a particular exemplary embodiment, it will be understood that addition, deletions and changes may be made to the exemplary embodiment without departing from the scope of the present invention The software used to control the operation of digital microcontroller 229 in accordance with one embodiment of the invention includes two primary routines, the main (foreground) routine and the interrupt (background) routine. The main foreground routine initializes the sensor and then enters the main loop that periodically displays the status of the sensor and resets the microcontroller's watch dog timer. The background interrupt routine is executed on a regular, periodic basis and performs most of the sensor's major functions.

The various operational functions of the sensor are separated into tasks such as the sensor task, MUX task, LED task, etc. Each of these high-level tasks may be further broken down into a sequence of smaller tasks. For example, the sensor task may be broken down into the ultrasonic sensor task, the PIR sensor task, the acoustic sensor task, and the photo sensor task Each task may be enabled by setting that task's enable flag. Similarly, each task may be disabled by clearing that task's enable flag.

Figure 15:
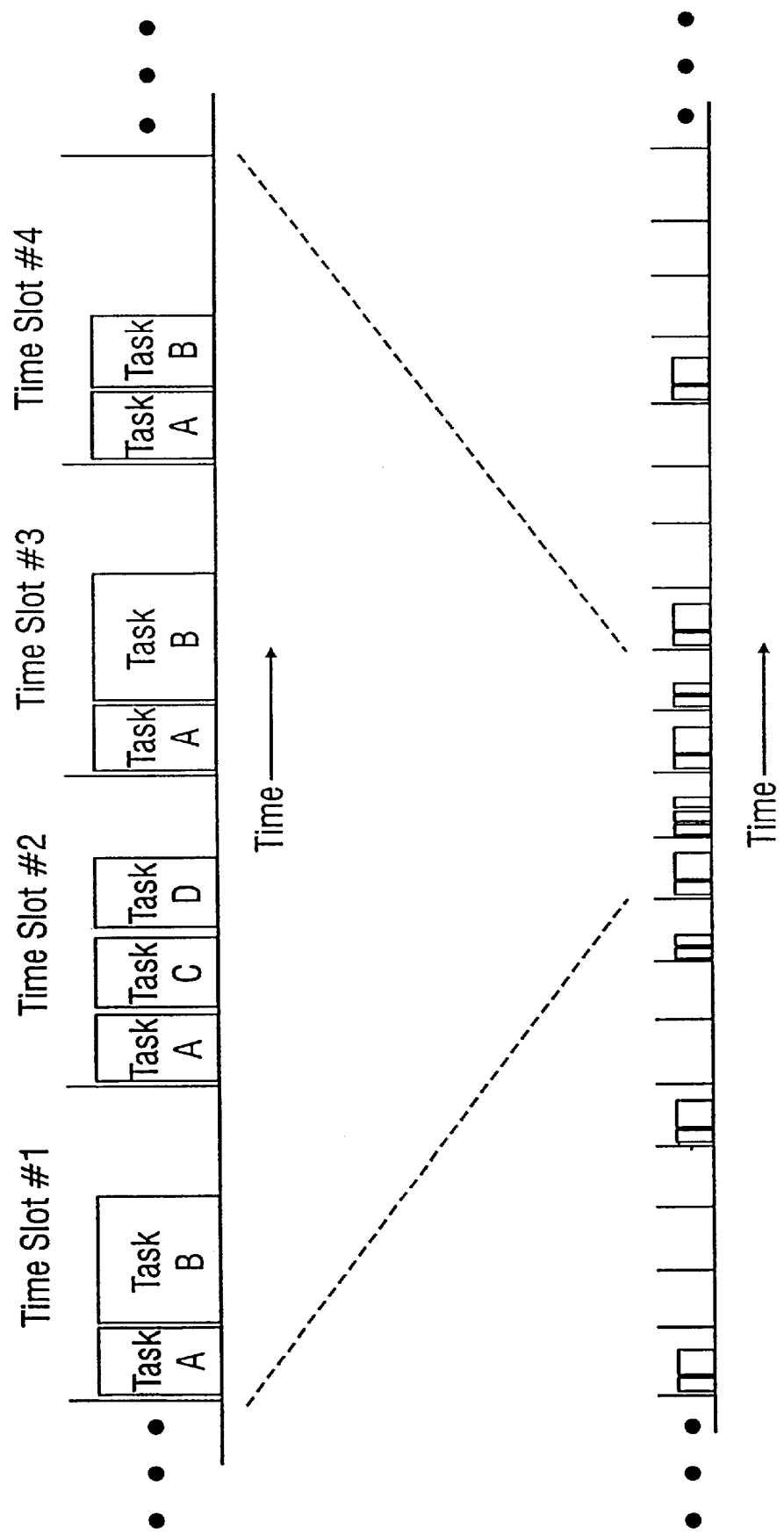
FIG. 15 is the software time division multiplexing scheme used for task allocation of the present invention.

One of the timer/counter peripherals within digital microcontroller 229 is used to interrupt microcontroller 229 on a regular, periodic basis. This scheme allows the instruction bandwidth of microcontroller 229 to be evenly divided into a number of execution time slots as shown in FIG. 15. This time-division multiplexing scheme is used to run the various sensor tasks at different periodic intervals. For example, the sensor's display status task is run once every two minutes while the sensor's second task is run once a second. By counting interrupts (time slots) and balancing the load of each task, the various sensor tasks can be multiplexed in time to keep the microcontroller evenly loaded. For simplicity, the present implementation uses 256 time slots, each time slot having a duration of 1 millisecond.

The early multi-technology occupancy sensors utilized a separate activation threshold for each sensor technology in order to generate a separate digital occupancy signal for each sensor technology. Typically, whenever a given sensor signal was greater than or equal to the activation threshold value for that technology, the digital occupancy estimator signal for that sensor technology was a logical one. Whenever that sensor signal was below the activation-threshold value for that technology, the sensor's digital occupancy estimator signal for that sensor technology was a logical zero. The various digital occupancy estimator signals of each sensor technology were then combined using classical Boolean (digital) logic in order to generate a digital composite occupancy estimator signal.

For example, consider a dual technology sensor that used ultrasonic and infrared sensors and combined their digital outputs using the AND logic function. Expressed symbolically, the digital output of each of the sensors and the overall digital output of the dual technology occupancy sensor would be:

ultrasonic sensor digital output =

$$\begin{cases} 0 \text{ if ultrasonic sensor output level} < \text{ultrasonic threshold} \\ 1 \text{ if ultrasonic sensor output level} \geq \text{ultrasonic threshold} \end{cases}$$

infrared sensor digital output =

$$\begin{cases} 0 \text{ if infrared sensor output level} < \text{infrared threshold} \\ 1 \text{ if infrared sensor output level} \geq \text{infrared threshold} \end{cases}$$

occupancy sensor digital output=AND(ultrasonic digital output, infrared digital output)

In general, these early multi-technology sensors exhibited a sensitivity-false alarm tradeoff depending on which Boolean logic function was used to combine the individual digital occupancy estimator signals. If the various individual digital occupancy estimator signals were combined using the Boolean OR function, the overall sensitivity of the sensor increased at the expense of an increased incidence of false trips. If the various individual digital occupancy estimator signals were combined using the Boolean AND function, the overall incidence of false trips decreased at the expense of decreased sensor sensitivity. Since each technology had its own separate activation threshold, these prior art sensors were often unable to reliably detect motion in complex marginal cases where one or more technologies observed signal levels just below the user-defined threshold level.

Figure 16A:
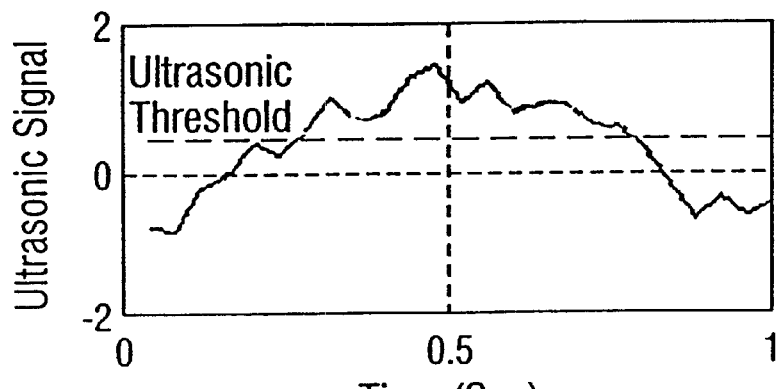
FIGS. 16A–16F are graphs illustrating prior art dual technology occupancy detection using the Boolean AND function.
Figure 16B:
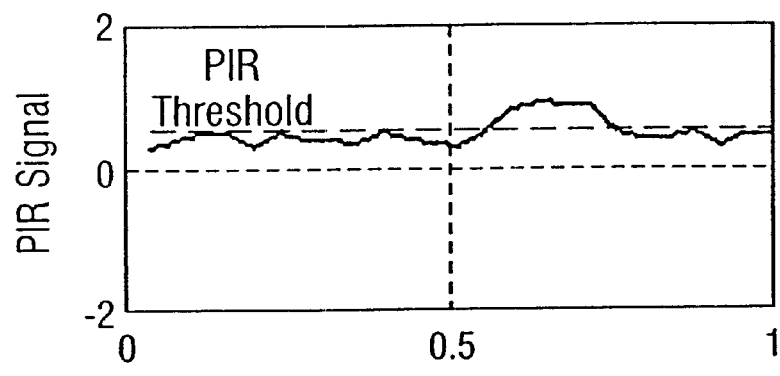
Figure 16C:
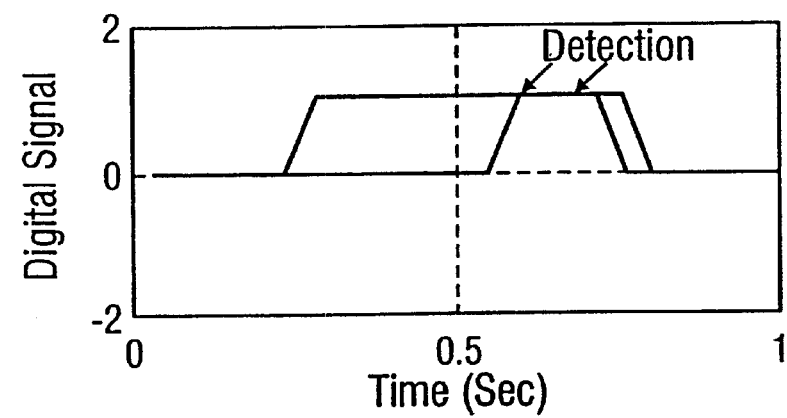
Figure 16D:
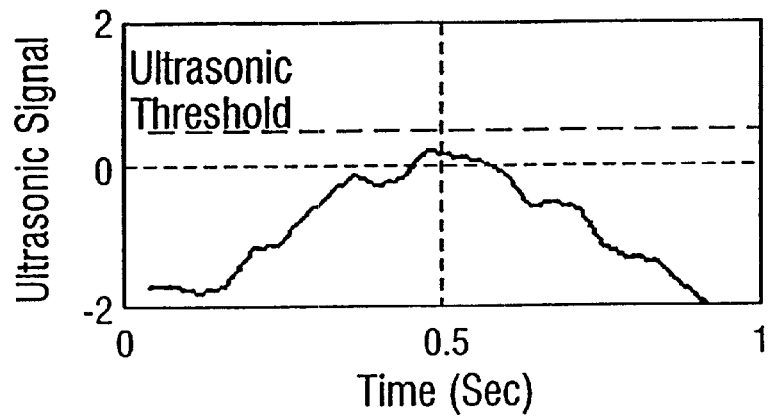
Figure 16E:
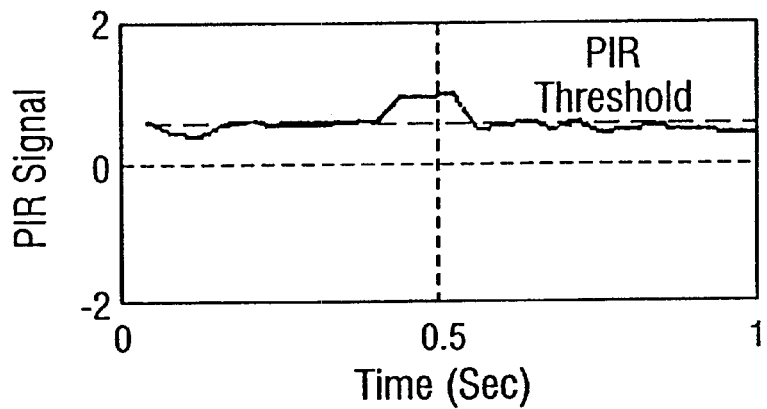
Figure 16F:
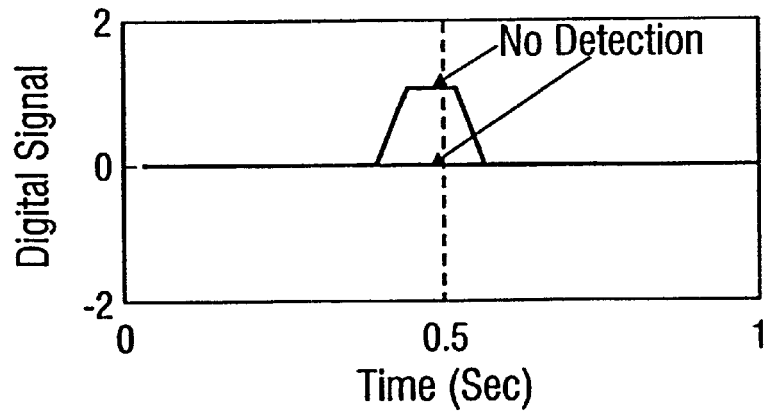

An example of this situation for a prior art dual technology sensor is shown in FIGS. 16(a)–(f). FIG. 16(a) depicts a typical ultrasonic sensor signal that occasionally exceeds the ultrasonic activation level threshold. FIG. 16(b) depicts a typical passive infrared sensor signal that also occasionally exceeds the passive infrared activation level threshold. FIG. 16(c) depicts the corresponding individual digital occupancy estimator signals. When the two individual digital occupancy estimator signals are combined using the Boolean AND function, the sensor's digital composite occupancy estimator signal (not shown) indicates that occupancy has been detected. In contrast, FIGS. 16(d)–(f) depict a more complex situation. FIG. 16(d) depicts an ultrasonic sensor signal that is close to the ultrasonic activation level threshold but never exceeds the ultrasonic activation level threshold. FIG. 16(e) depicts a typical passive infrared sensor signal that occasionally exceeds the passive infrared activation level threshold. FIG. 16(f) depicts the corresponding individual digital occupancy estimator signals. When the two individual digital occupancy estimator signals are combined using the Boolean AND function, the sensor's digital composite occupancy estimator signal (not shown) indicates that occupancy has not been detected.

While these prior art multi-technology-based occupancy sensors showed improved performance over single technology occupancy sensors, they were still unable to sense occupancy in the more complex marginal sensor signal level situations.

In contrast, the multi-technology sensor-fusion-based occupancy sensor of the present invention does not generate a separate digital occupancy signal for each sensor technology. Instead, the multi-technology sensor-fusion method of the present invention takes the various sensor output signals and forms a composite occupancy estimator signal. This composite occupancy estimator signal is then compared with a composite activation threshold value. Whenever the composite occupancy estimator signal is greater than or equal to the composite activation threshold value, the sensor's digital composite occupancy signal is a logical one. Whenever the composite occupancy estimator signal is below the composite activation threshold value, the sensor's digital composite occupancy signal is a logical zero.

For example, consider a dual technology sensor-fusion-based occupancy sensor in accordance with the present invention that uses ultrasonic and infrared sensors and combines their outputs using an arbitrary generalized non-linear function. Expressed symbolically, the composite occupancy estimator signal and the overall digital composite occupancy signal of the dual technology sensor-fusion-based occupancy sensor is:

composite output=f(ultrasonic output, infrared output)

occupancy sensor digital output =

$$\begin{cases} 0 \text{ if composite output level} < \text{composite threshold} \\ 1 \text{ if composite output level} \geq \text{composite threshold} \end{cases}$$

where, $f(*,*,*, \ldots ,*)$ denotes an arbitrary generalized function of N variables (i.e., one variable for each sensor technology). Note that for the dual technology sensor of the present invention with (N=2), the function $f(*,*)$ may be an arithmetic sum, a weighted arithmetic sums, or an arbitrary non-linear function of the variables expressed either algorithmically or in tabulated form. The algorithmic form is more amenable to mathematical analysis whereas the tabulated form has distinct advantages from a microprocessor implementation point of view.

One embodiment of the present invention utilizes an arithmetic sum based occupancy detection algorithm to implement a sophisticated multi-technology sensor fusion detection scheme. This algorithm increases the overall probability of occupancy detection while simultaneously lowering the overall probability of false tripping. In a dual technology sensor using ultrasonic and PIR sensors, the invention combines the outputs of the ultrasonic and PIR sensors to produce a composite occupancy estimator that is compared to a composite threshold to determine occupancy. This produces a highly sensitive yet highly reliable occupancy sensor that can detect minor motion in more complex marginal sensor signal level situations.

Figure 17:
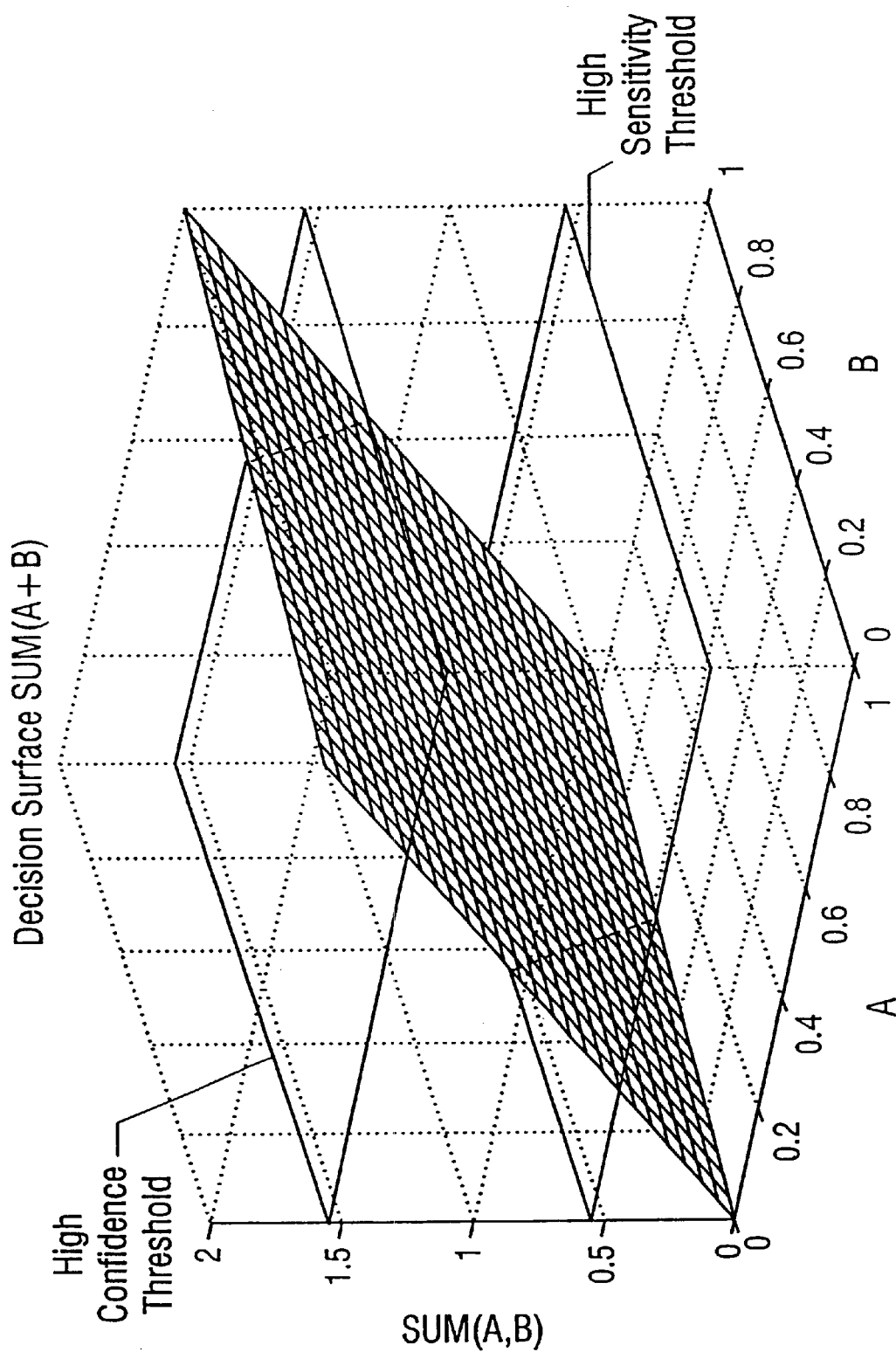
FIG. 17 is a decision surface for the arithmetic sum formula in accordance with the present invention.
Figure 18A:
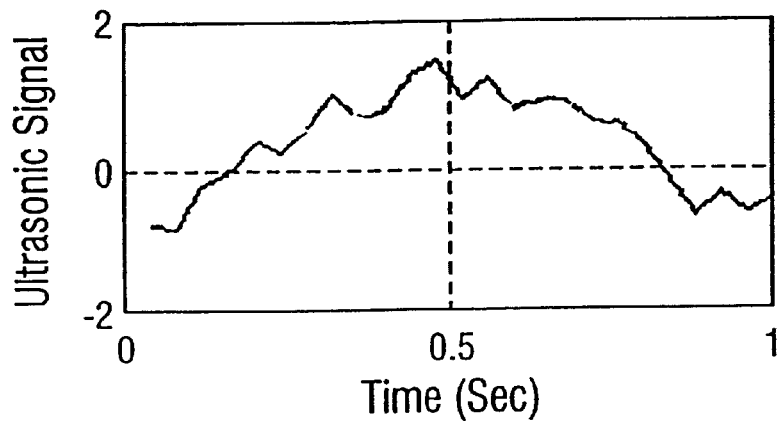
FIGS. 18A–18F are graphs illustrating dual technology occupancy detection in accordance with the present invention.
Figure 18B:
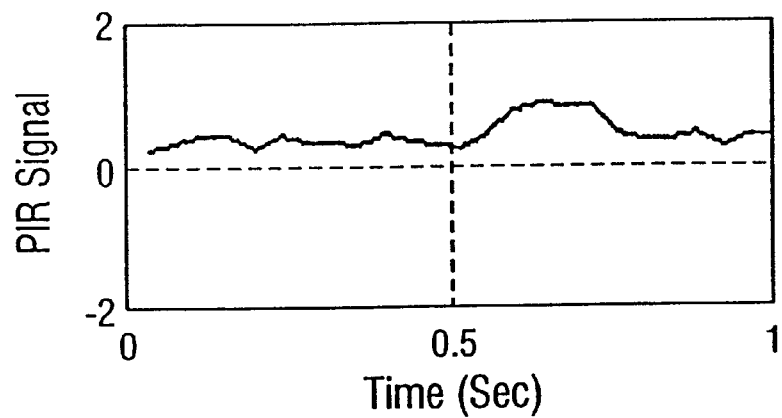
Figure 18C:
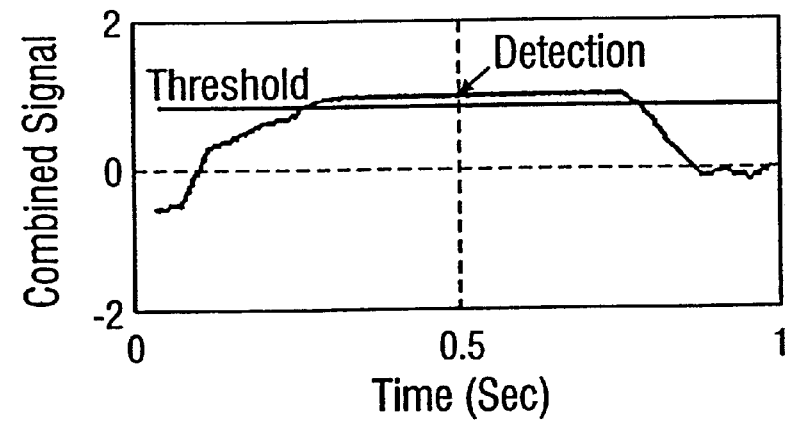
Figure 18D:
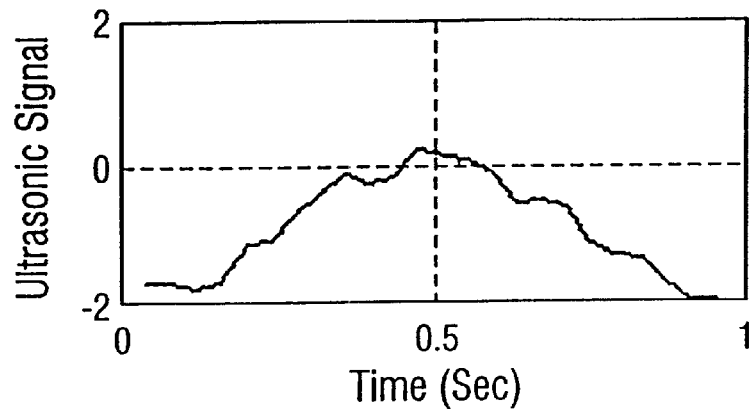
Figure 18E:
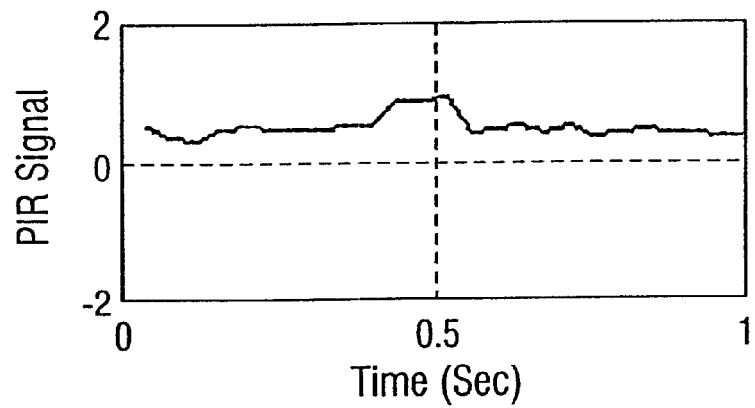
Figure 18F:
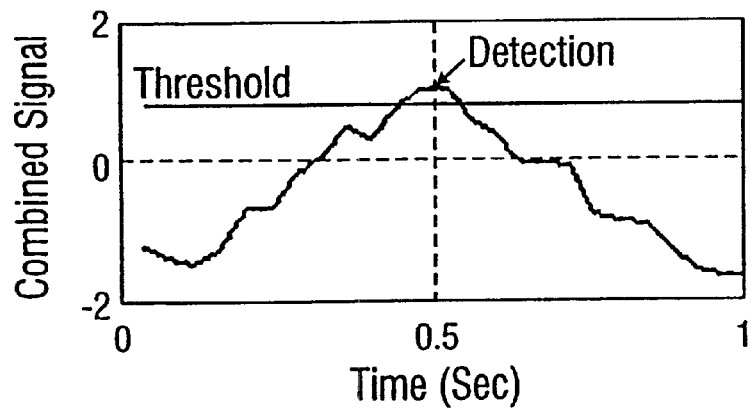

A plot of the two-dimensional arithmetic sum surface is shown in FIG. 17. When the arithmetic sum is greater than the activation threshold shown in FIG. 17, a load is activated. Once activated, the load remains activated when the arithmetic sum is greater than the maintenance threshold shown in FIG. 17. By combining these signals prior to thresholding, sub-threshold signal levels are able to contribute useful information to the decision process. This allows the sensor to effectively utilize sensor signal values that are high enough to be indicative of occupancy but too low to indicate certain occupancy according to a given single sensing technology. In an exemplary embodiment of the invention, the computation and evaluation of the composite occupancy estimator signal is performed separately for HIGH CONFIDENCE and HIGH SENSITIVITY modes using fixed-point arithmetic.

An example of this situation for a dual technology occupancy sensor according to the present invention is shown in FIGS. 18 (*a*)–(*f*). FIG. 18(*a*) depicts a typical ultrasonic sensor signal. FIG. 18(*b*) depicts a typical passive infrared sensor signal. Note that neither of the individual sensor technologies have a separate activation threshold. FIG. 18(*c*) depicts the sensor's composite occupancy estimator signal and the sensor's composite activation threshold level. When the two individual sensor signals are combined using an arithmetic sum function, the sensor's composite occupancy estimator signal suggests that occupancy has been detected whenever its value exceeds the sensor's composite activation threshold level. FIGS. 18(*d*)–(*f*) depict a more complex situation. FIG. 18(*d*) depicts a weak ultrasonic sensor signal. FIG. 18(*e*) depicts a typical passive infrared sensor signal. FIG. 18(*f*) depicts the sensor's composite occupancy estimator signal and the sensor's composite activation threshold level. When the two individual sensor signals are combined using an arithmetic sum function, the sensor's composite occupancy estimator signal suggests that occupancy has again been detected. It should be noted that the prior art multi-technology occupancy sensor was unable to detect occupancy in this situation (FIGS. 16(*d*)–(*f*)).

An example of a more complex occupancy function of two variables is the function $$f(x,y) = \min(1, (K_x * x^p + K_y * y^p)^{1/p})$$

Figure 19:
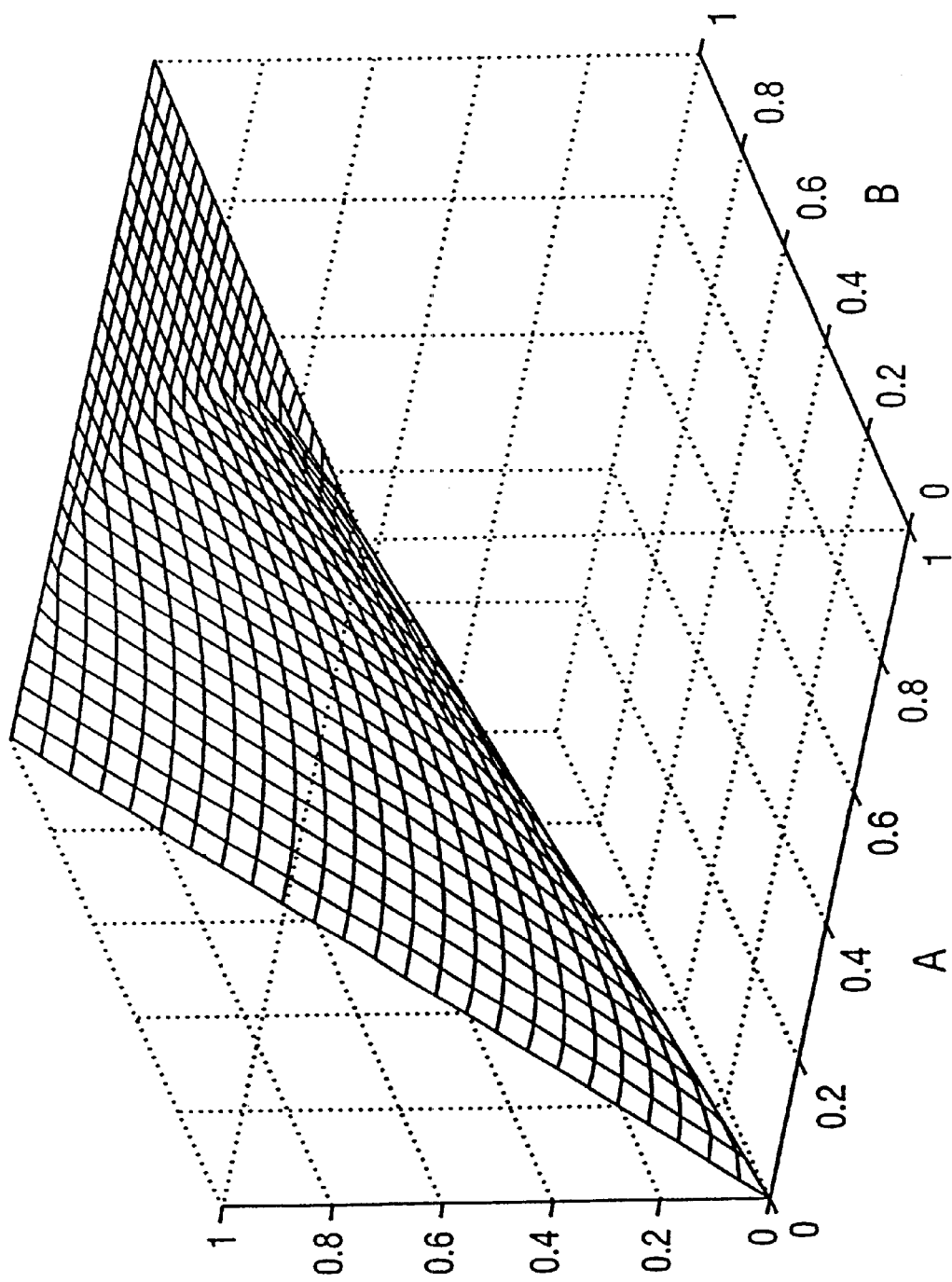
FIG. 19 is a decision surface for the Yager Union function (K=1, p=2) in accordance with the present invention.

This function produces what is known as the Yager Union decision surface. A condition may occur where either sensing technology alone assures reliable detection of occupancy when its associated occupancy estimator signal occurs at a relatively high level. Additionally, the occurrence of moderate levels of both the occupancy estimators together may be a reliable indication of occupancy. In this case, a composite occupancy estimator is required that indicates occupancy when the component occupancy estimators occur together at relatively low levels, or individually at relatively high levels. An example of the given function with $K_x=K_y=1$ and $p=2$ is shown in FIG. 19. This function combines the component occupancy estimators to form a composite occupancy estimator as desired.

Figure 20:
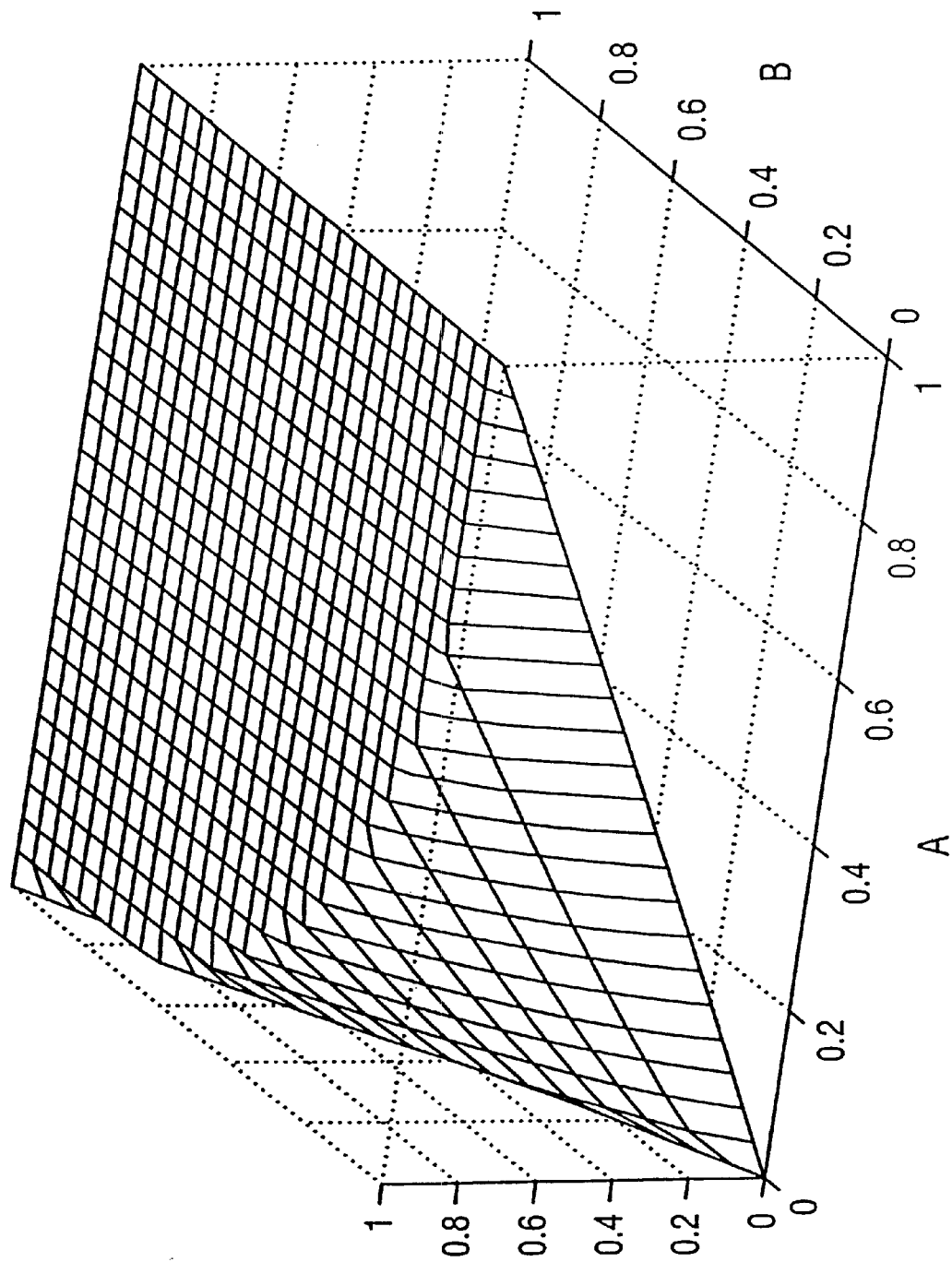
FIG. 20 is a decision surface for the Yager Union function (K=1, p=0.5) in accordance with the present invention.

A condition may occur that requires a relatively high degree of confidence in the occupancy estimate, and where the component occupancy estimators are generally reliable when taken together, but where the component occupancy estimators are generally unreliable taken alone. In this case, a composite occupancy estimator is required that indicates occupancy with a moderate level of indication from both component occupancy estimators, but rejects even large signals from the component occupancy estimators individually. An example of the given function with $K_x=K_y=1$ and $p=0.5$ is shown in FIG. 20. This function combines the component occupancy estimators to form the desired composite occupancy estimator.

Other functions may also be acceptable to combine the individual component occupancy estimators to produce a composite estimator signal, and the specification of theses exemplary functions does not limit the scope of the invention. In addition, although the exemplary functions are described using two occupancy estimators produced by two occupancy sensing technologies, this is due primarily to the ease of illustration using two estimators. However, it will be understood that a composite occupancy estimator may be derived from any number of individual occupancy estimators. For example, PIR, ultrasonic and microwave sensing technologies may be used to produce three individual component occupancy estimators that are then combined using a desired function (for example, algebraic sum, weighted sum, Yager Union, and the like) to produce a composite occupancy estimator.

The Yager Union function requires a significant computational resource to evaluate analytically, more than may be available in real time from a cost effective microprocessor. FIGS. 21 and 22 depict the same functional relationships as in FIGS. 19 and 20, but expressed in a discrete tabular form for fast efficient table lookup. In order to achieve different functional characteristics, the microprocessor may have multiple such tables to choose from, corresponding to different occupancy environment situations. These tables may then be selected adaptively or before hand. Additionally, the tables may be dynamic, and periodically recalculated according to the adaptation rules of the sensor automatic adjustment algorithm. This is possible, even with a limited computational resource, because the adaptation is an occasional low speed process, unlike the function evaluation, that must be executed at a high repetition rate in order to achieve fast response to occupancy signals. The Yager Union function is offered as an exemplary embodiment of the table look up aspect of the present invention, it will be understood that other mathematical functions used to calculate the composite signal may also be stored as a table.

The present invention may also include a number of adaptive features. When enabled, the following sensor variables are adapted as a function of time: ultrasonic sensor lights ON sensitivity setting; ultrasonic sensor lights OFF sensitivity setting; infrared sensor sensitivity setting; timer delay setting, infrared noise level estimate, smallest ultrasonic motion level estimate and a time between motion estimate.

The adaptation of the sensor's various sensitivity settings is generally referred to automatic sensitivity adjustment (ASA). The adaptation of the sensor's timer delay setting is generally referred to as automatic timer adjustment (ATA).

At power on reset, the various ultrasonic and infrared sensitivity settings and the timer delay setting are initialized according to the user-specified potentiometer settings (FIG. 3, 316, 317, 319). Automatic adjustments to the ultrasonic and infrared sensitivity settings and the sensor's timer delay setting are implemented as deviations from the user-specified potentiometer settings. As a result, any change to a potentiometer value results in an immediate change to the sensor adapted characteristic. The sensor continues to adapt based on both the potentiometer setting and the adapted adjustment value.

To accomplish ASA, a variety of situations automatically modify the sensor's ultrasonic, PIR and acoustic sensitivity settings, including: false-on event, false-on-stay-on event, false-off event, lights stay on-with no major occupancy event, lights stay on-with major occupancy event, occupancy cycle detection and utilization adjustment, infrared noise level adjustment, acoustic background noise level adjustment and smallest ultrasonic motion level adjustment. ASA can be accomplished in single technology or multiple technology sensors.

Figure 23:
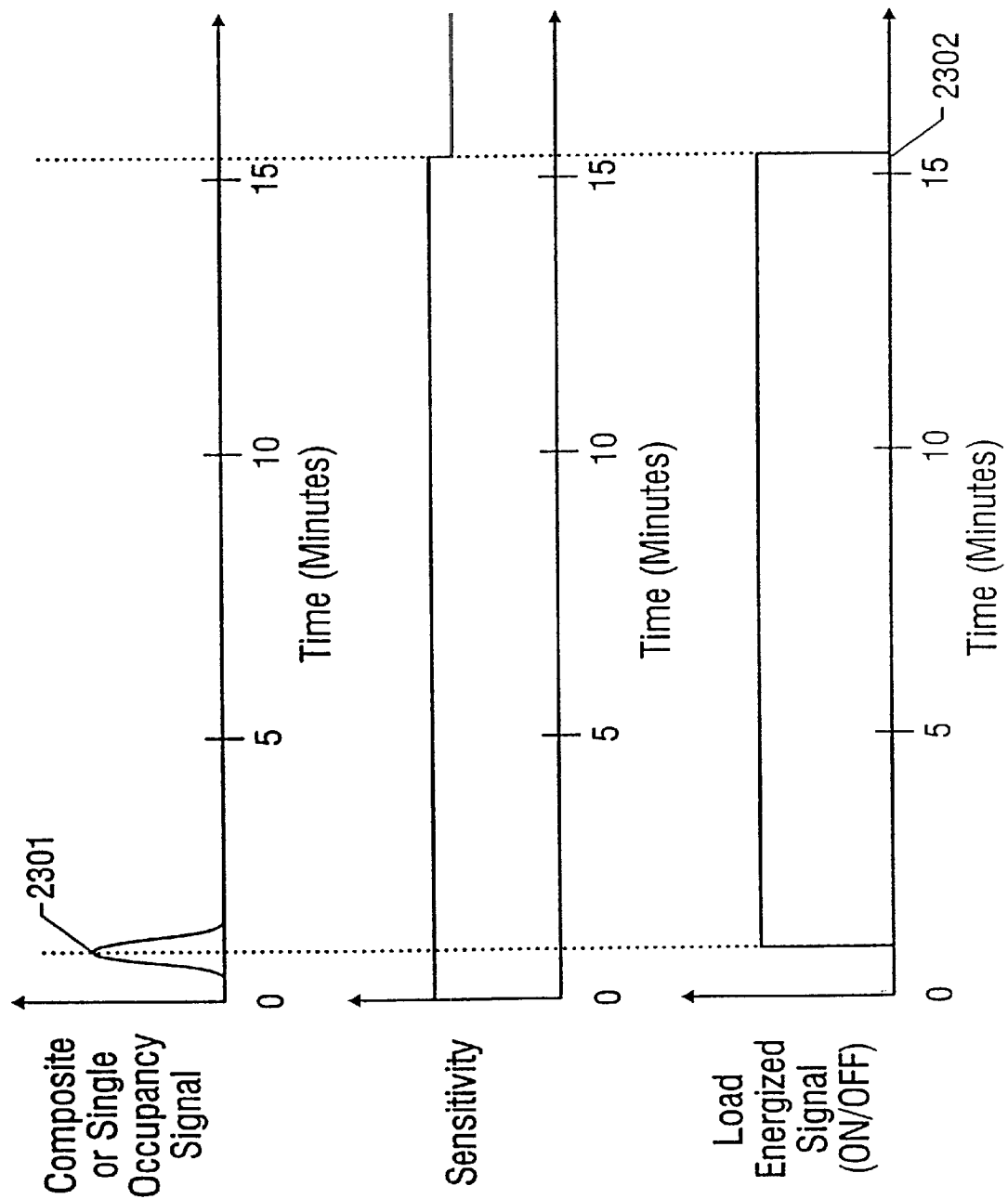
FIG. 23 is a time line depicting the adaptation of sensor sensitivity for a false-on event in accordance with the present invention.

A false-on event occurs when the sensor's load(s) are initially de-energized, energized for a short period of time (for example, 0–8 seconds longer than timer delay setting), and then de-energized again. FIG. 23 describes a false-on adaptation event. The timer setting in this example is 15 minutes; occupancy is detected at 2301 only for a very short period of time (less than 15 seconds) and the load is energized. Because occupancy was not detected for 15 minutes after load was initially energized, lights turn off at 2302 and sensitivity is reduced (2303). A false-on event causes the sensor's ultrasonic, PIR, microwave, or acoustic sensitivity to be reduced.

Figure 24:
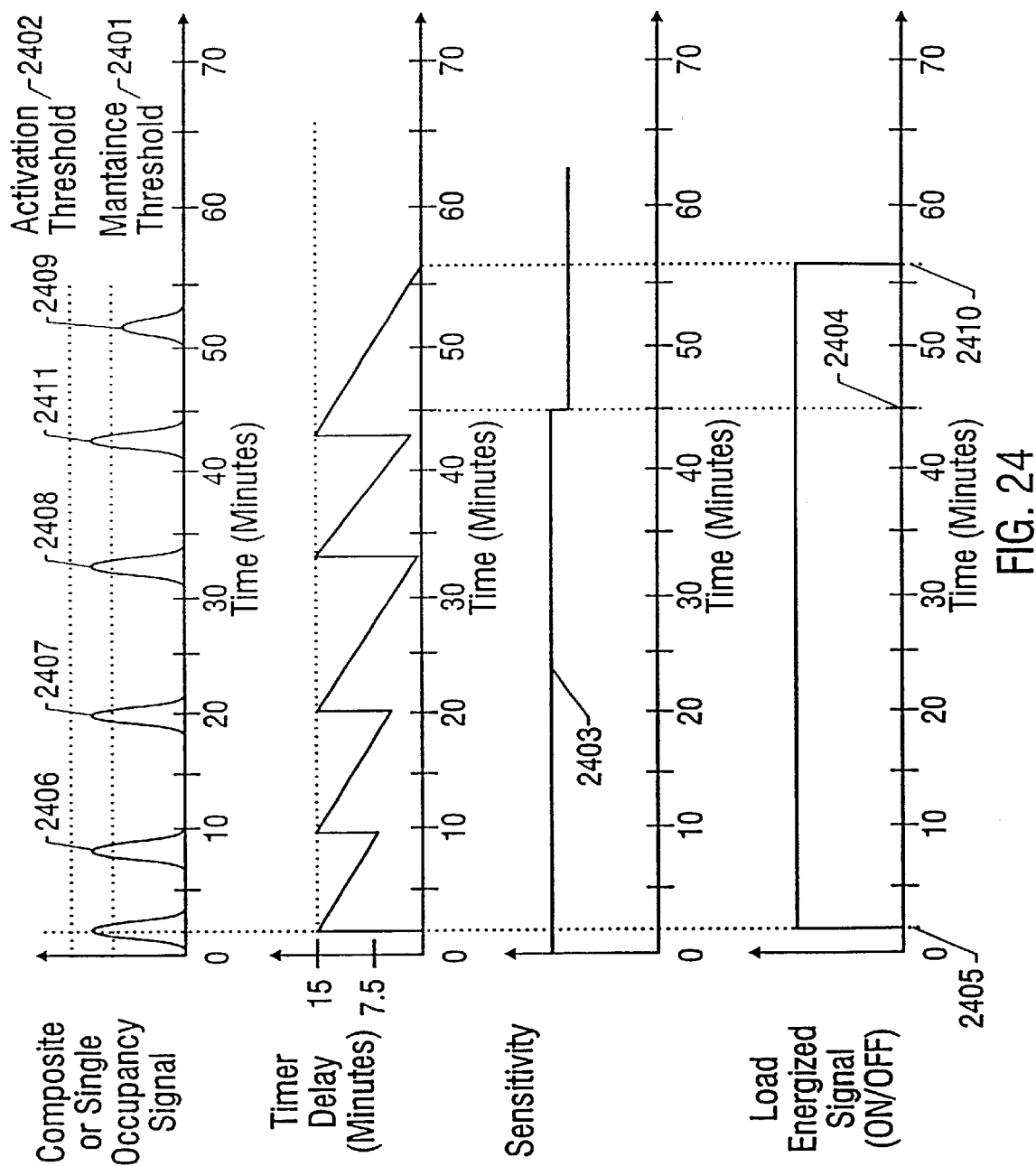
FIG. 24 is a time line depicting the adaptation of sensor sensitivity for a hallway strike false-on-stay-on event in accordance with the present invention.

A false-on-stay-on event occurs when sensor's load(s) are initially de-energized then energized for multiple timer settings without the occupancy signal ever exceeding activation threshold. FIG. 24 describes a false-on-stay-on adaptation event for a sensor that is sensing occupancy incorrectly through an open door into a hallway. Every time someone passes by the door, occupancy is detected. In this example, the timer is set at 15 minutes, occupancy is detected 2405, timer is reset and the load energized. Before the timer expires, occupancy is again detected 2406, 2407, 2408 and 2411 as someone passes by the door. After each occurrence, the timer is reset. This pattern of detecting occupancy without the signal exceeding the activation threshold 2402 continues for more than three timeout periods or 45 minutes 2404 and the sensitivity 2403 is reduced. Now when persons pass by the open door 2409 the sensor does not detect occupancy and the load is then de-energized 2410, 15 minutes after occupancy was last detected.

Figure 25:
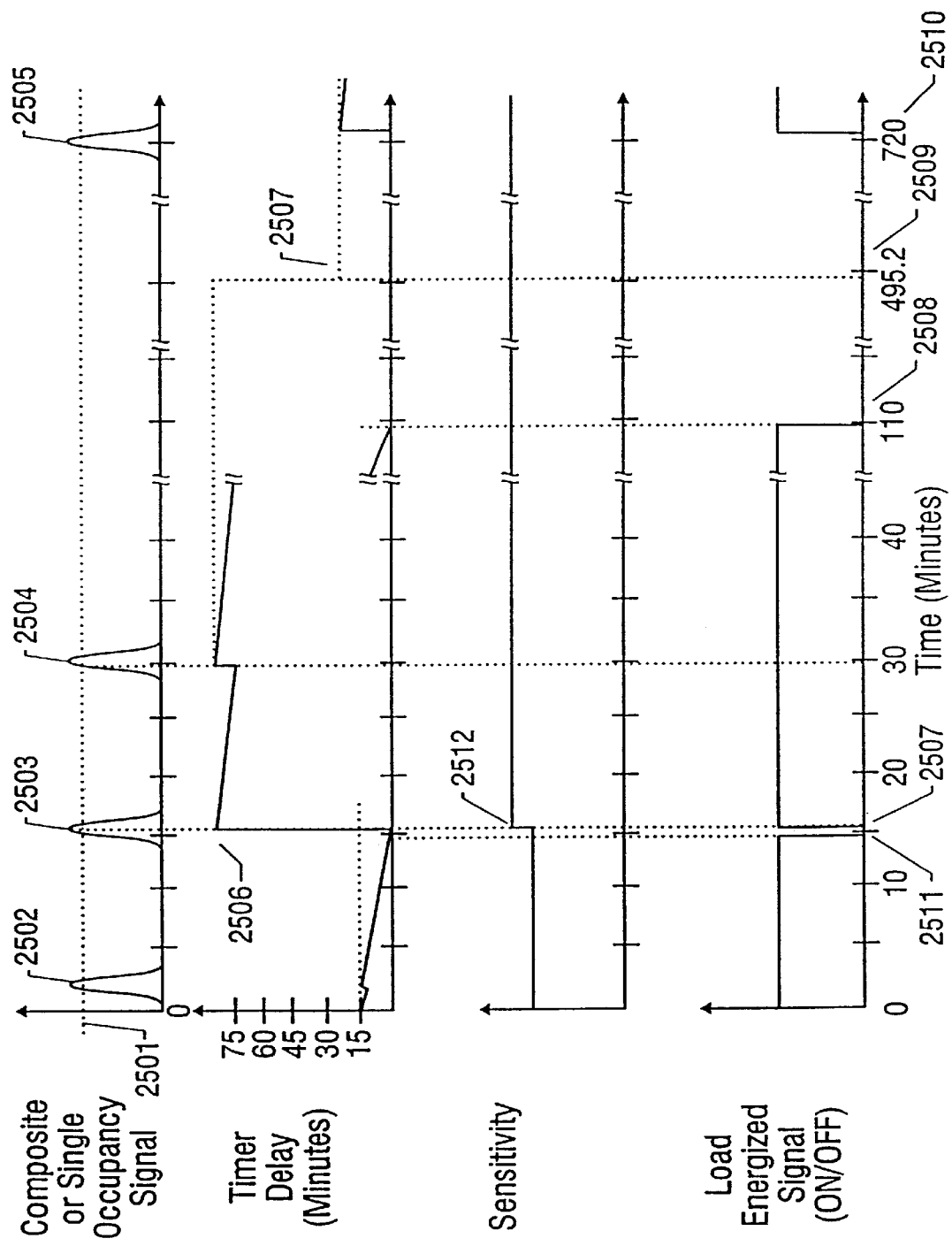
FIG. 25 is a time line depicting the adaptation of sensor sensitivity for a false-off event in accordance with the present invention.

A false-off event occurs when the sensor's load(s) are initially energized when the occupancy signal is greater than the activation threshold 2801, then de-energized for a short period of time (for example, 0 to 15 seconds), and then energized again. FIG. 25 describes a false-off adaptation event for a sensor controlling room lights. The sensor detects occupancy at 2502 and the is timer is reset to 15 minutes. At 2511, the timer expires and load is de-energized. The occupant then reactivates the lights 2507 with occupancy signal 2503 within 15 seconds of load(s) de-energizing. At 2507, the sensitivity and timer are increased to 2512 and 2506 respectively. The timer is temporarily increased to 80 (5+60+15=80) minutes at 2506 (for example, 5 is the increase in timer value after false-off event, 60 is the temporary additional increase in timer value for the next eight hours and 15 minutes was the timer value before false-off event). Occupancy detection 2504 resets the timer and after 80 minutes, the load(s) de-energize at 2508. Eight hours after false-off event occurred 2509, the timer is reduced to 20 minutes 2513. When occupancy 2505 is next detected at 2510, the timer is reset to 20 minutes and load(s) energized.

Figure 26:
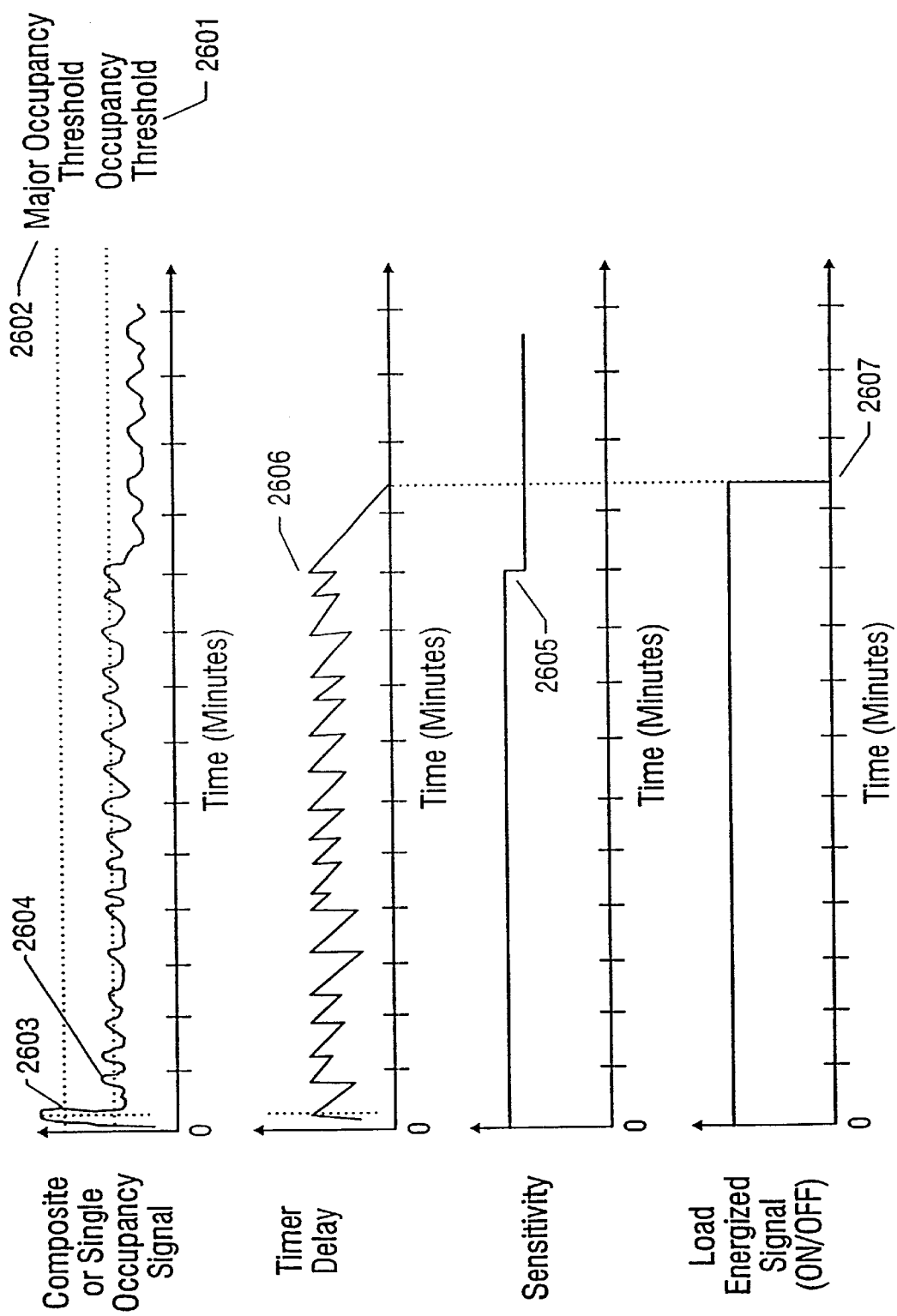
FIG. 26 is a time line depicting a stay on with no major activity.

Lights stay on-no activation event occurs when load(s) are energized constantly for multiple timer settings and occupancy signals never exceed activation threshold. FIG. 26 describes a lights stay on-no activation adaptation event. The sensor detects major occupancy 2603 when the occupancy signal exceeds the activation threshold 2602 (for example, a person just stood up and left the area), the timer is reset and the load(s) remain energized. The occupancy threshold is constantly exceeded for the next 120 minutes by small disturbances 2604 (for example, air noise, sensor electrical noise, etc . . . ) with no signals exceeding 2602 activation threshold. Sensitivity 2605 is reduced and now these small disturbances don't reset the timer and the load de-energizes at 2607.

Figure 27:
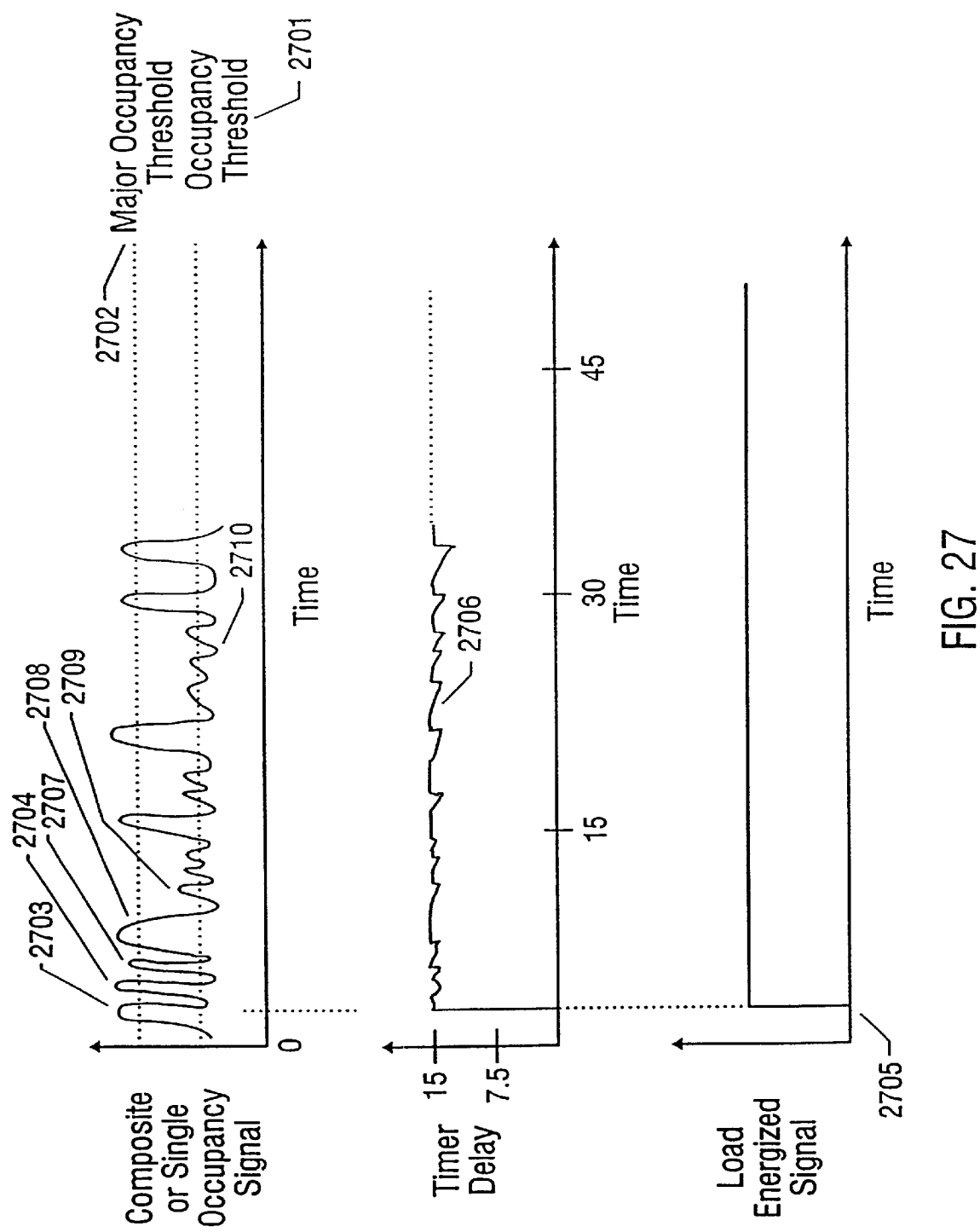
FIG. 27 is a time line depicting a stay-on-multiple-activation event.

Lights stay on-with major occupancy event occurs when load(s) are energized constantly for multiple timer settings and occupancy signal exceeds activation threshold. Several conditions can cause this event for example, the sensor is mounted close to a powerful air register, sensor mounted close to door and sensor pointed in the wrong direction and sensor mounted in correct application but sensitivity is way out of adjustment. FIG. 27 describes a lights stay on- with major occupancy adaptation event. Occupancy signal 2703 exceeds occupancy threshold 2701 and load(s) are energized at 2705. In quick succession, occupancy signals 2704, 2707, 2708 and 2709 occur with 2704, 2707 and 2708 crossing the activation threshold 2702. Quick succession of occupancy signals constantly reset timer 2706. Even in very active occupancy areas where sensor is adjusted and applied correctly, signal 2710 will settle down for short periods of time.

Using only a single technology sensor, for example ultrasonic, it is difficult to differentiate a very active room with lots of people verses a sensor mounted close to a powerful air register. However if multiple technologies are used, a much better opportunity is provided to adapt correctly, identify if the sensor is mounted close to a powerful air register or identify incorrect sensor application. Two examples are presented showing a dual technology ultrasonic and PIR sensors. In both cases the room is unoccupied. One sensor is mounted correctly with a very high initial ultrasonic sensitivity setting and in the other example the sensor is mounted close to a powerful air register.

Figure 28:
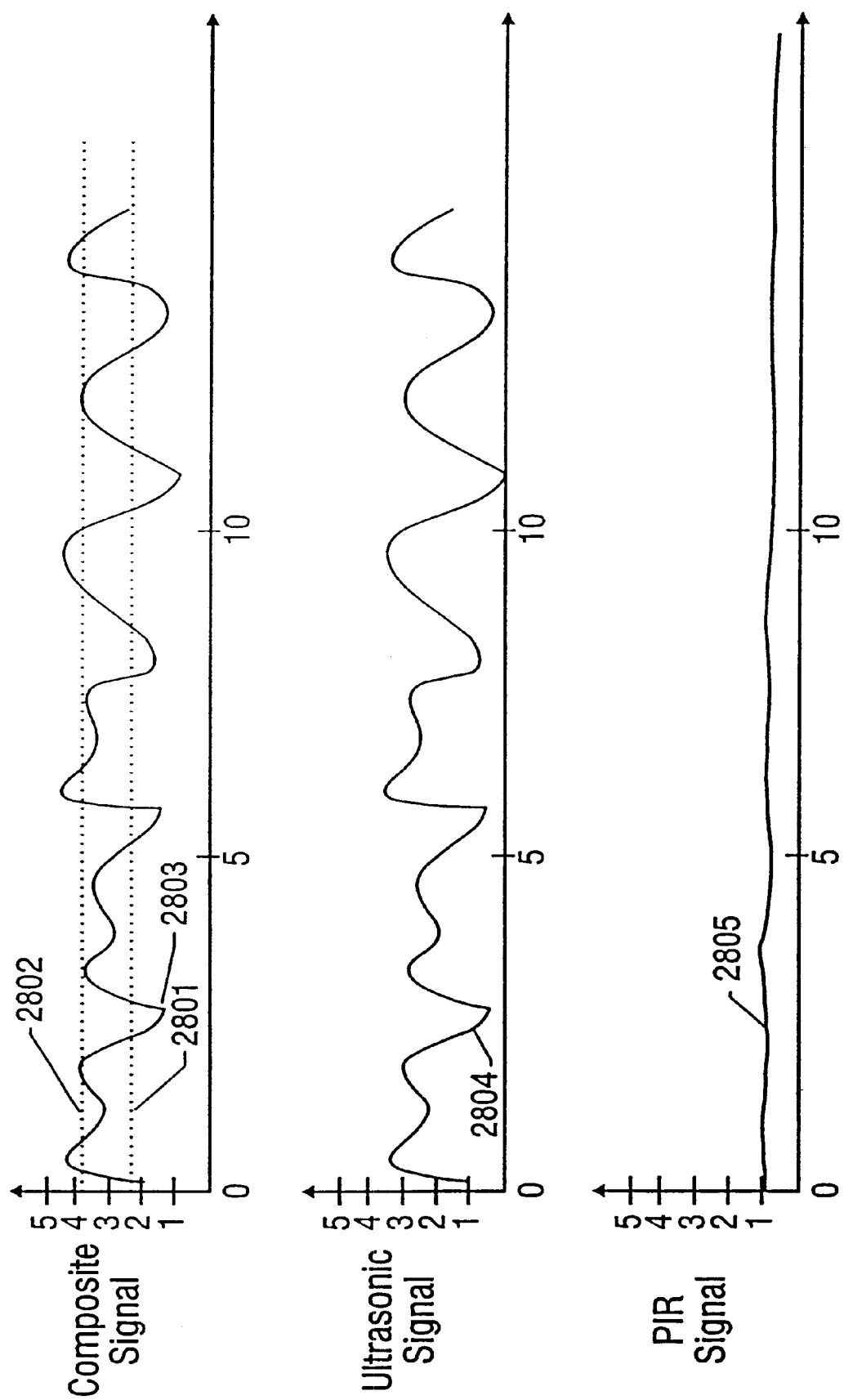
FIG. 28 is a time line depicting an expanded occupancy estimator signal for a stay-on-multiple-activation event.

FIG. 28 shows an expanded composite occupancy signal 2803 for ultrasonic and PIR detectors. Ultrasonic signal 2804 is very large and provides most of the signal contribution if an algebraic sum is used to combine the two signals. PIR signal 2805 is very quiet with very little signal variance. Since PIR is much more immune to air turbulence than ultrasonic it can be concluded that either the sensor is mounted close to an air register or the ultrasonic sensitivity is adjusted very high.

Figure 29:
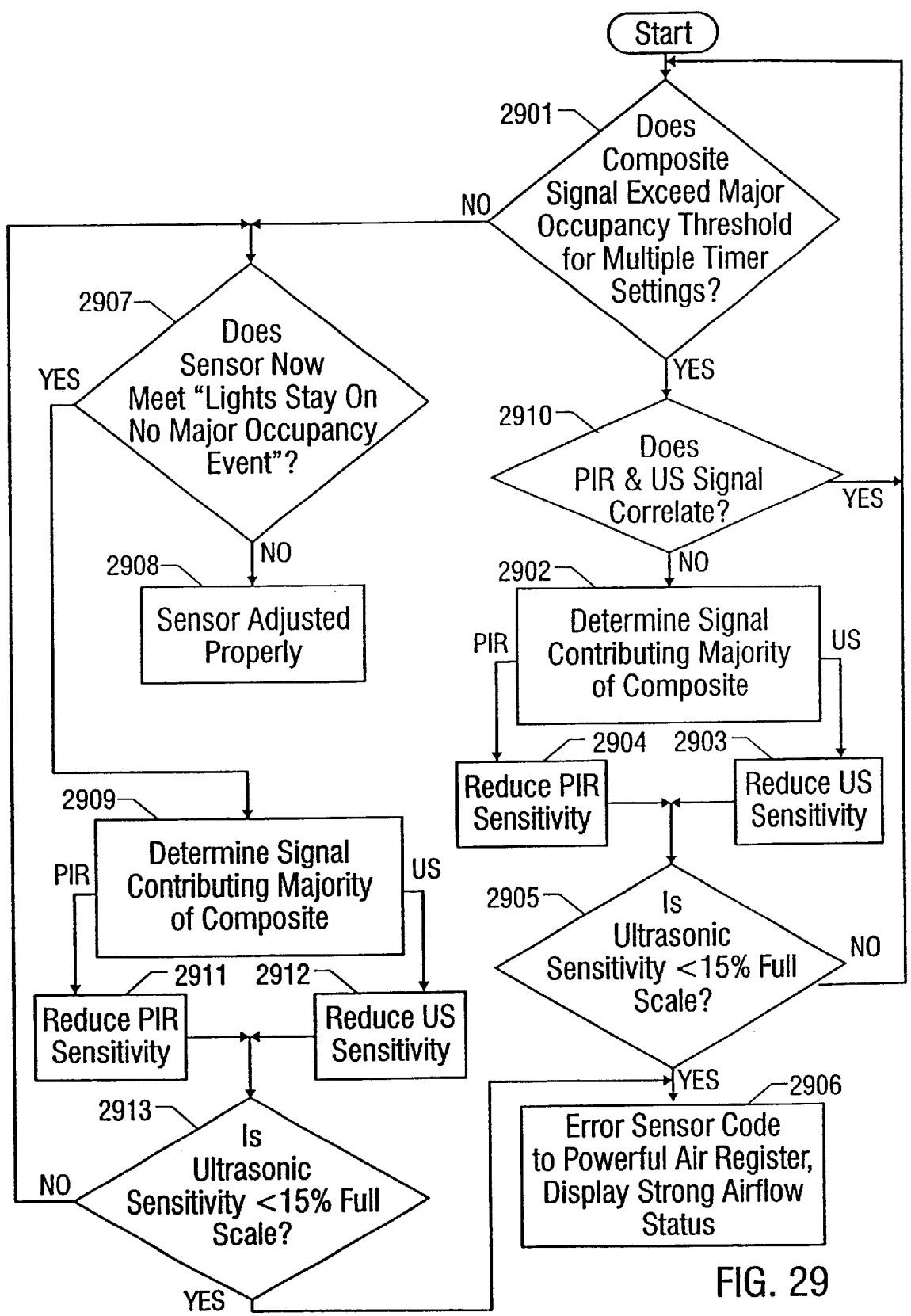
FIG. 29 is the stay-on-multiple-activation event and strong airflow analysis task flowchart for the present invention

FIG. 29 shows an example algorithm to reduce the sensitivity of either PIR or ultrasonic signals. In 2901 it is determined if the composite signal exceeds the activation threshold for multiple timer settings. If this condition is satisfied, it is determined if the PIR and US signals are occasionally correlated (2910). If the sensor detects strong occupancy by both technologies at the same time, the area could be occupied. If signals do not correlate, it is determined which signal contributes most to composite occupancy signal (2902). In this example, ultrasonic sensitivity is reduced (2903). If ultrasonic sensitivity is reduced by more than 15% full scale (2905), the sensor is too close to a powerful air register and the sensor sends strong air flow status (2906). This is true because at low ultrasonic sensitivity levels it's coverage pattern is much smaller than the PIR pattern. Also, the PIR pattern is very dense and strong PIR occupancy signals would be received if the ultrasonic pattern area was occupied.

In situations where air flow is moderate or non-existent, after a couple of ultrasonic sensitivity reductions the composite signal fails (2901). The first time decision block 2907 is entered, the sensor is most likely in a "Lights stay on-no major motion detected" event. In block 2909, it is determined that ultrasonics are the major signal contributor and ultrasonic sensitivity is reduced in 2912. If ultrasonic sensitivity is less than 15% full scale (2913), the sensor is close to a powerful air register and the sensor sends strong air flow status 2906. If ultrasonics sensitivity is greater than 15% of full scale (2913), the loop is resumed until an error occurs (2906) or the sensor is properly adapted (2908).

Figure 30A:
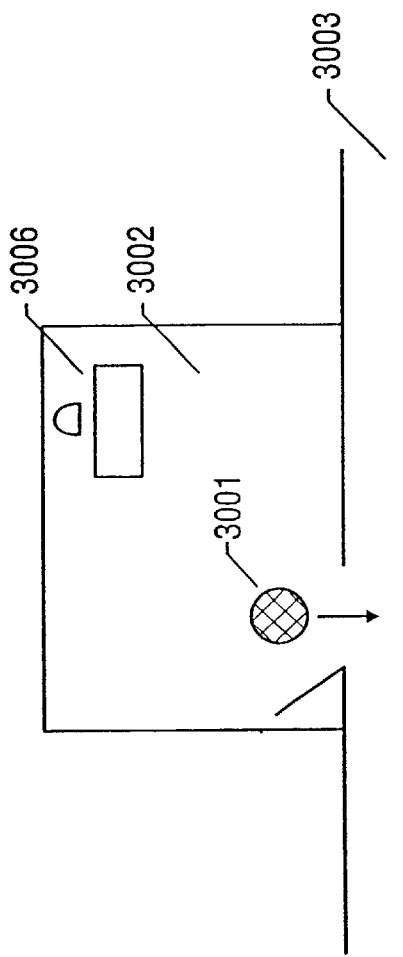
FIGS. 30A and 30B are diagrams showing installations that may result in adaptation of sensor sensitivity.
Figure 30B:
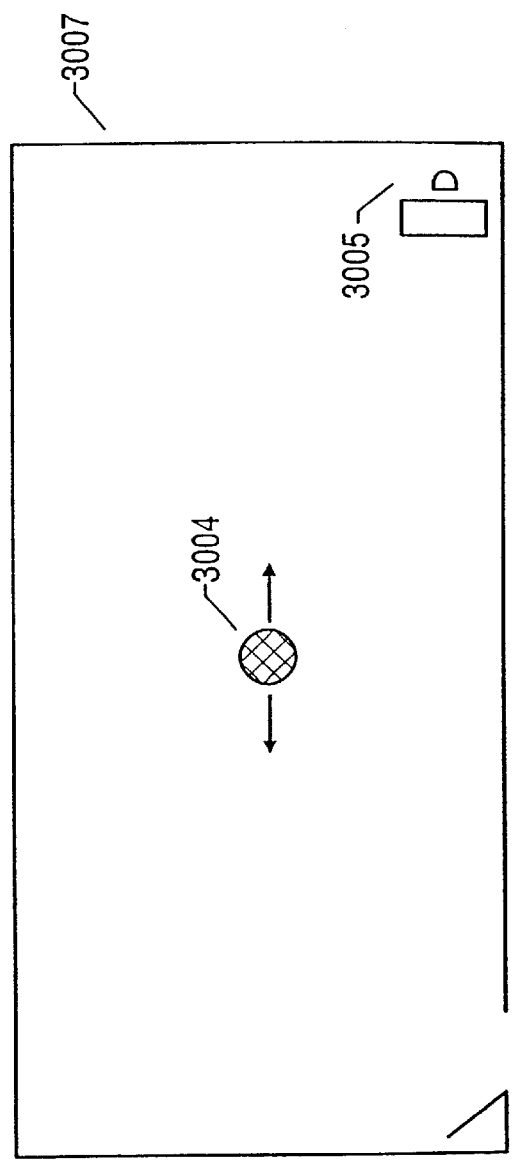

It can also be determined if the sensor is mounted incorrectly or put into an unacceptable application and flash the appropriate status information. FIGS. 30(a) and (b) show two applications where sensors 3001 and 3004 are improperly applied.

Sensor 3001 is mounted looking out the door in room 3002. As people walk past the door in hallway 3003 the lights will be tripped on. A variety of sensitivity reduction techniques, as previously discussed with reference to FIGS. 23–29, will significantly reduce sensitivity. Working at desk 3006 will not maintain electrical load(s) and will periodically de-energized. The sensitivity will increase from "false-off" adaptation event. When the space is unoccupied, the sensitivity will decrease. This cycling will be detected and an application error status message will be displayed.

Sensor 3004 is mounted in a very large room 3007. This room is much larger than the coverage pattern sensor 3004 can provide. Working at desk 3005 will increase sensitivity from "false-off" adaptation events. Eventually, sensor 3004 sensitivity will be increased through a variety of sensitivity reduction techniques previously discussed for example some of these could be "false-on", "false-on-stay-on" or "lights stay on-no major motion" adaptation events will significantly reduce sensitivity. This cycling will be detected and an application error status message will be displayed.

Figure 31:
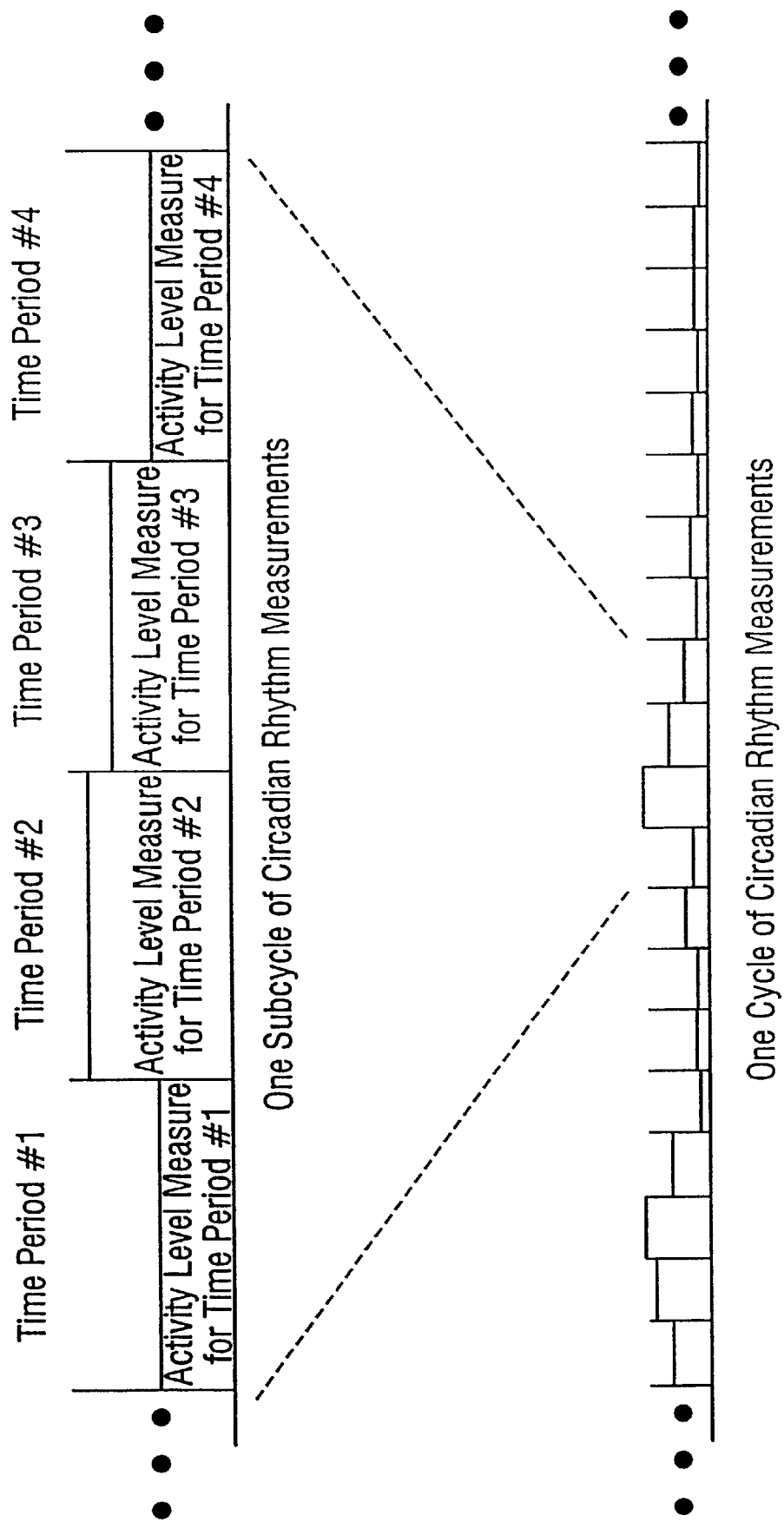
FIG. 31 is the occupancy cycle detection and utilization measurement method for the present invention.
Figure 32:
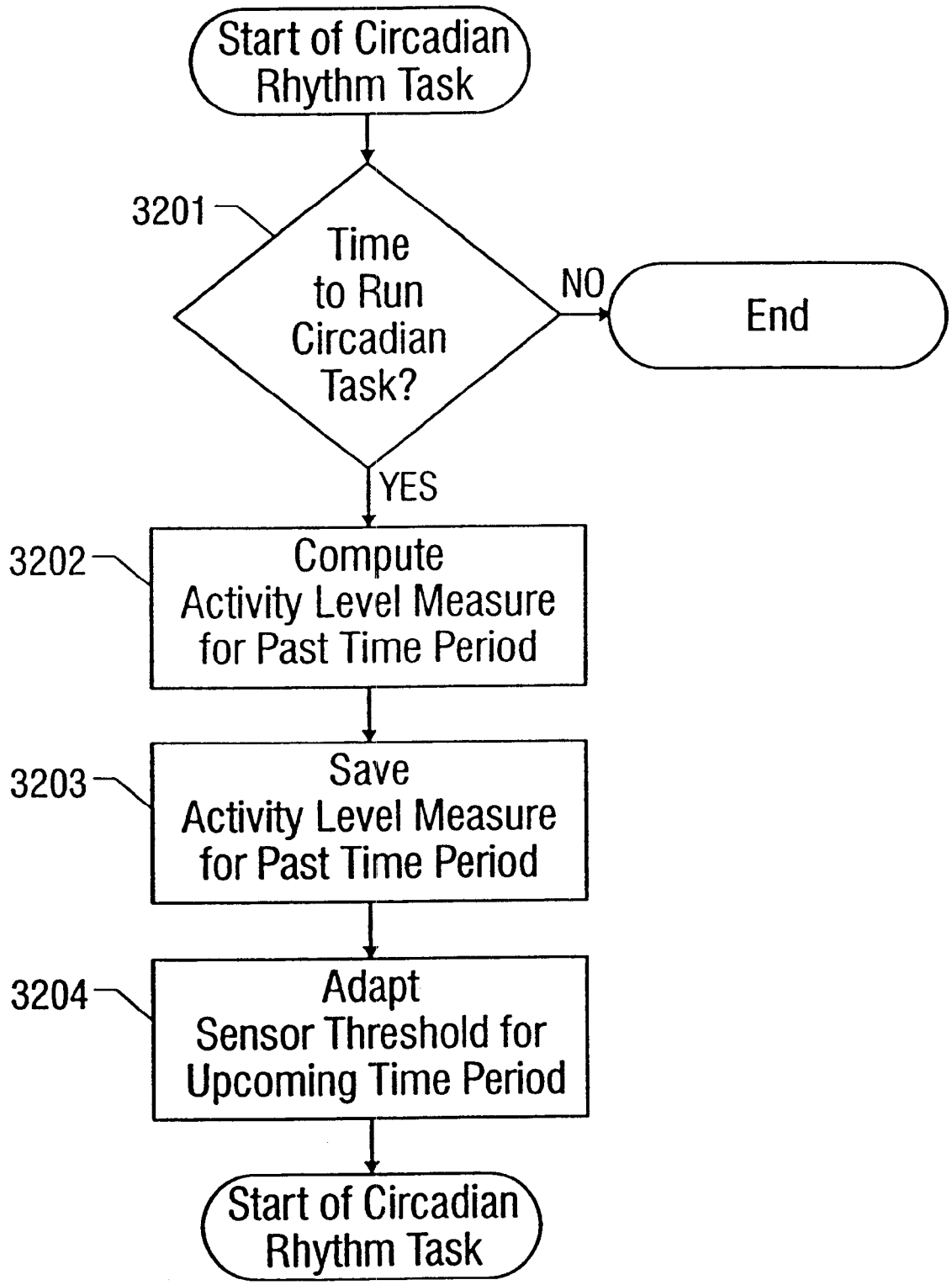
FIG. 32 is the occupancy cycle detection and utilization task flowchart for the present invention.

The occupancy cycle detection and utilization adjustment modifies the sensor's ultrasonic and infrared sensitivity settings based on the historical usage patterns of the area controlled by the sensor. FIG. 31 is a histogram that depicts the occupancy cycle detection and utilization measurement scheme of the present invention. The various sensitivity settings are slightly increased during time periods when the area is normally occupied. Similarly, the various sensitivity settings are slightly decreased during time periods when the area is normally unoccupied. FIG. 32 is a simplified occupancy cycle detection and utilization task for the present invention in flowchart form. In operation, when it is time to run the task (3201), the activity level for the immediately preceding time period is computed (3202). Then, the activity level is saved (3203). This preferably takes the form of an accumulation of newly computed activity with activity that has been computed and accumulated previously for the same time period. Thus, a histogram like that shown in FIG. 31 is built. Then, the sensor sensitivity is adjusted (3204) for the upcoming time period based upon the level of activity stored in the histogram for the next time period.

Figure 33:
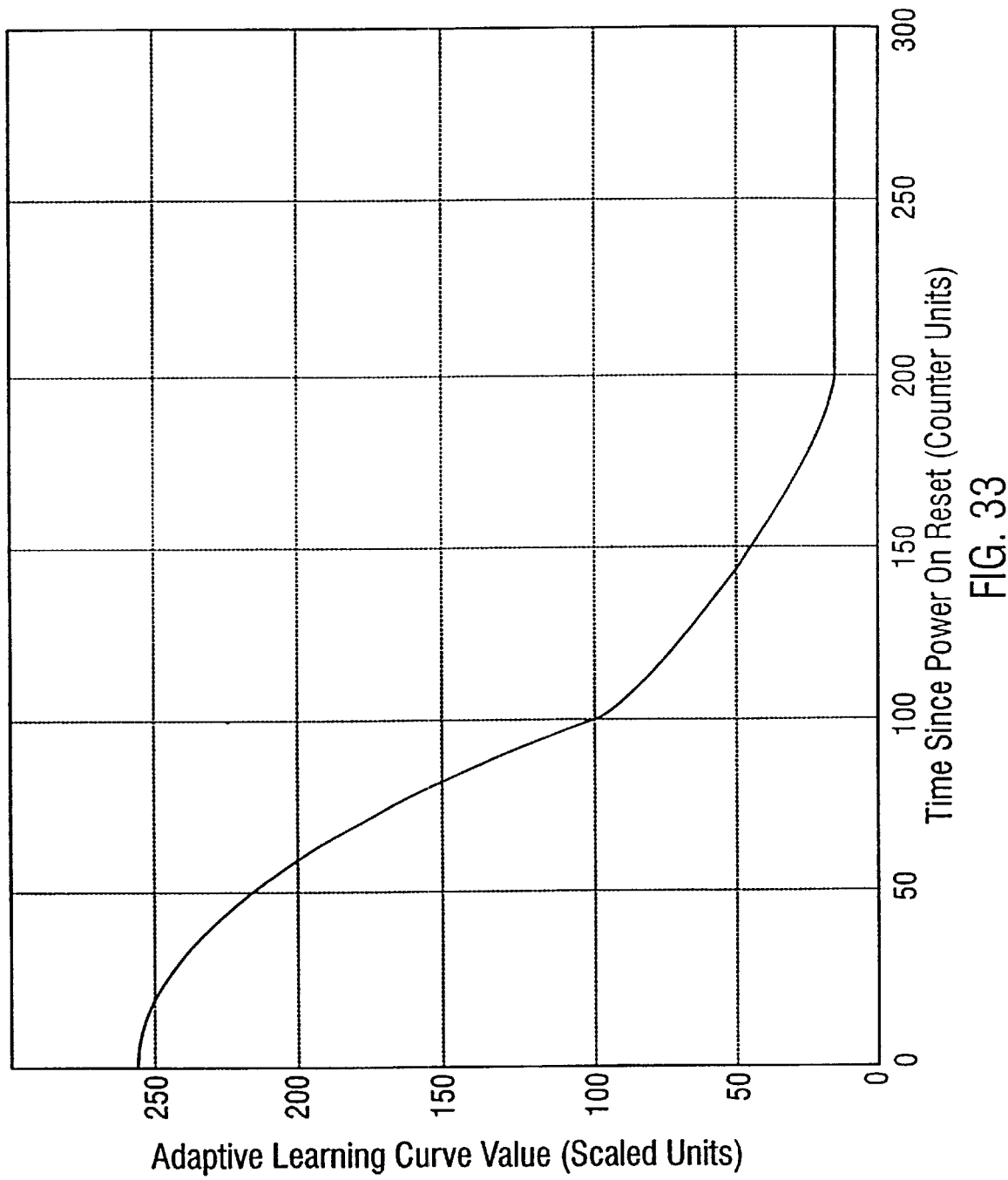
FIG. 33 is a typical learning curve describing the adaptive behavior of the present invention.

In accordance with one aspect of the present invention, a learning curve is used to adapt the sensor sensitivity and timer settings as a function of the elapsed time since the initial power on reset state, toggling of the sensor's Adaptation Reset switch 309 (FIG. 3) or continuous cycling in one of the previously discussed adaptation events. In general, each sensor technology has its own separate (and potentially different) learning curve. A typical learning curve plot is shown in FIG. 33. The shape of the learning curve implies that greatest incremental sensitivity and timer changes occur at the beginning of the learning curve cycle. As the elapsed time increases in the learning curve cycle, the adaptive behavior will gradually decrease until very small changes in sensitivity and timer settings will occur.

If the sensor's-environment experiences a significant change long after power on reset state, the sensor may require some adjustment to operate properly in its new environment. In this unusual situation, the use may toggle the sensor's Adaptation Reset switch 309 (FIG. 3). This will reset all of the sensor's adaptive algorithms and reset to the beginning of the learning curve plot in FIG. 24. The sensor will then begin to adapt to its new environment according to its various learning curves.

Figure 34:
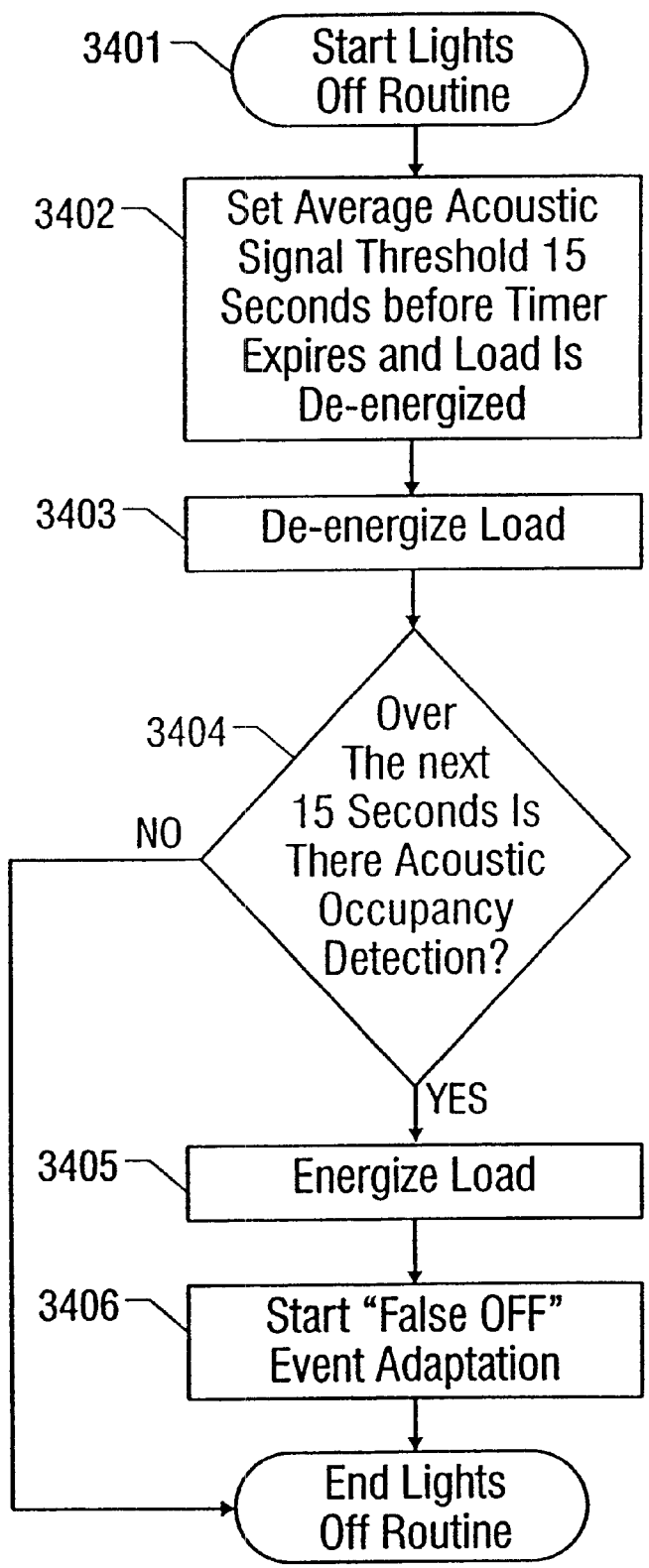
FIG. 34 is a "lights off" task flowchart when using an acoustic sensor to prevent "false off" for the present invention.

Controlling very large spaces with a minimum number of sensors or controlling areas that have unusual shapes can easily be accomplished by adding an acoustic detector. This new application method only enables the acoustic detector just before and after the load(s) are de-energized. This eliminates many of the disadvantages that dual technology PIR/Acoustic and Ultrasonic/Acoustic sensors have. When acoustic occupancy detectors are used alone or in dual technology configurations, load(s) are energized for much longer time periods because of incorrect occupancy detection due to external noises such as radios, fans, passing automobiles etc. In these devices, the acoustic detector is enabled continuously. In accordance with the present invention, as illustrated in, FIG. 34, the acoustic detector is only enabled 15 seconds before load(s) are de-energized 3402 and 15 seconds after. During the first 15 seconds, the acoustic sensor establishes an average acoustic occupancy threshold. After the load(s) are de-energized 3403 the acoustic detector is enabled for an additional 15 seconds 3404 and listens for acoustic occupancy such as human speech. If the acoustic occupancy threshold is exceeded, the load(s) are energized 3405 and start "false off" event adaptation timer begins 3406. The preferred embodiment of this acoustic detection method is to complement a single technology ultrasonic or PIR sensor or dual technology ultrasonic and PIR sensor.

Figure 35:
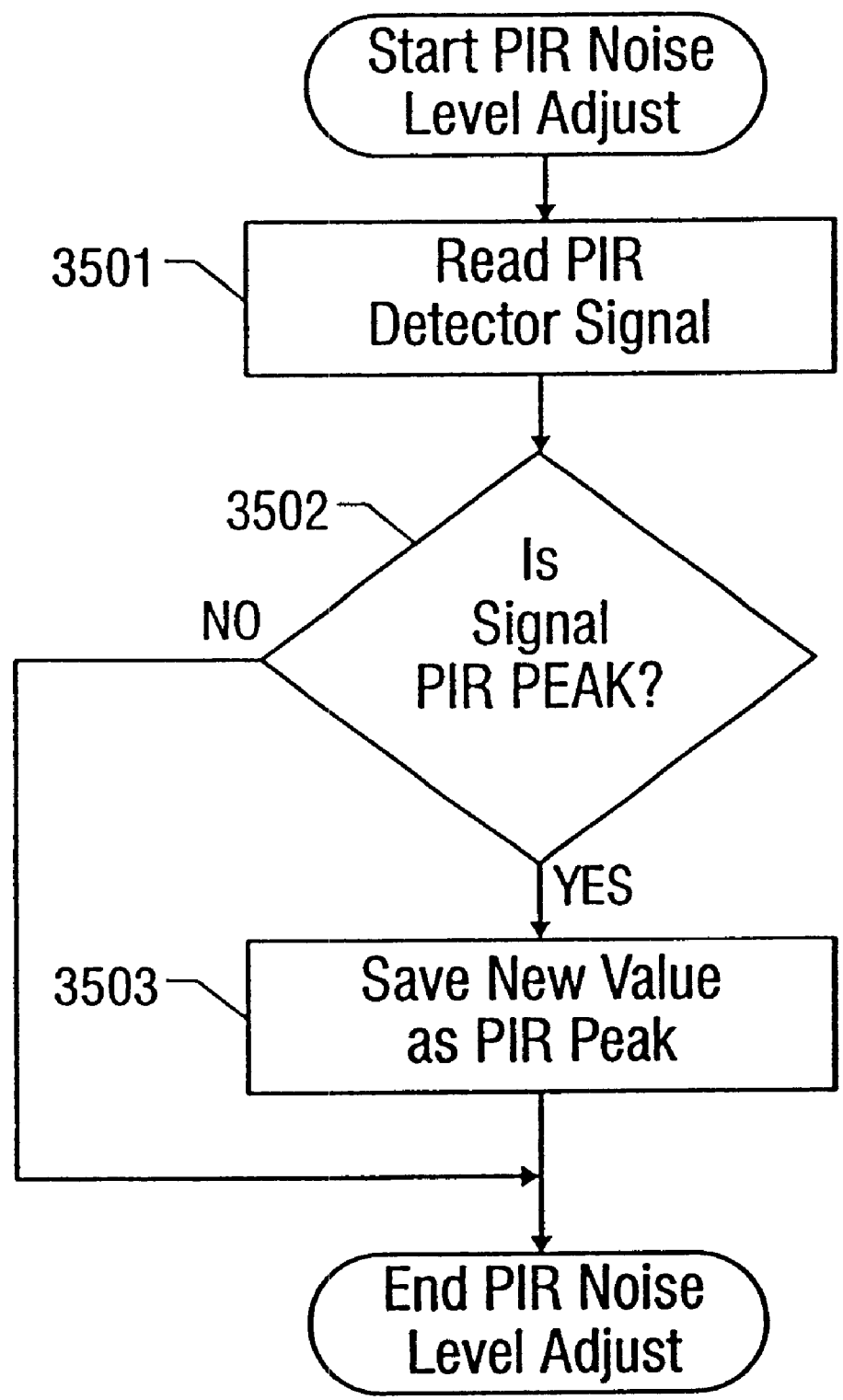
FIG. 35 is a PIR noise level adjustment task flowchart for the present invention.

Traditional analog PIR sensor manufactures provide a manual PIR gain adjustment or fix the gain during the manufacturing process. Providing a manual adjustment may lead to misadjustment. For example, the gain may be erroneously set so large that the sensor occasionally false trips on internally generated noise. Manufactures that provide fixed gain are not utilizing full detector sensitivity to allow for device tolerances in the PIR detector, filter and amplifier stages. FIG. 35 provides a method of recording PIR signal levels 3501 when load(s) are de-energized and areas unoccupied. New peak PIR values are stored 3503 and a new occupancy threshold offset can be calculated. Using this method, maximum PIR sensitivity settings can be calculated.

Ultrasonic detection technologies are most susceptible to strong air flow when turning loads on, as compared to steady state (maintaining loads on) or turning lights off. Overcoming false occupancy detection when air flow turns on or creating a "Air Puff" detector would be a major improvement in ultrasonic sensing technology. The most common way of improving ultrasonic performance is adding PIR or microwave detectors. While use of these additional sensing technologies improved overall sensor performance, they did not eliminate the deleterious effects of air flow is on the ultrasonic detector.

Sensors mounted next to an HVAC register can acoustically detect several things when air flow begins. First, the compressor turns on, second the air flow will typically exhibit a unique sound signature during startup and continuous operation. This unique sound signature may be a function of the building configuration, and the structures of the air diffuser and air duct.

Figure 36:
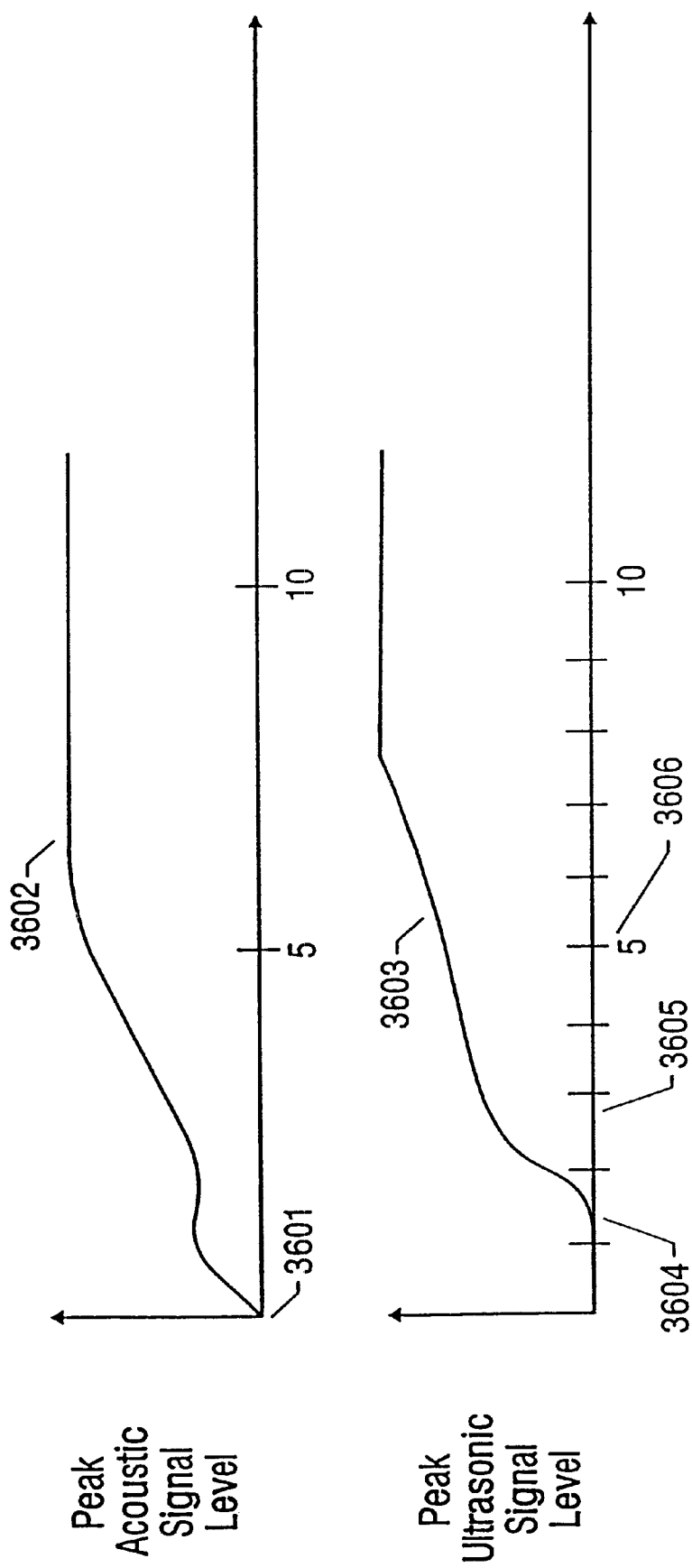
FIG. 36 is a time line illustrating the adjustment of ultrasonic sensitivity based on acoustic signal detection.
Figure 37:
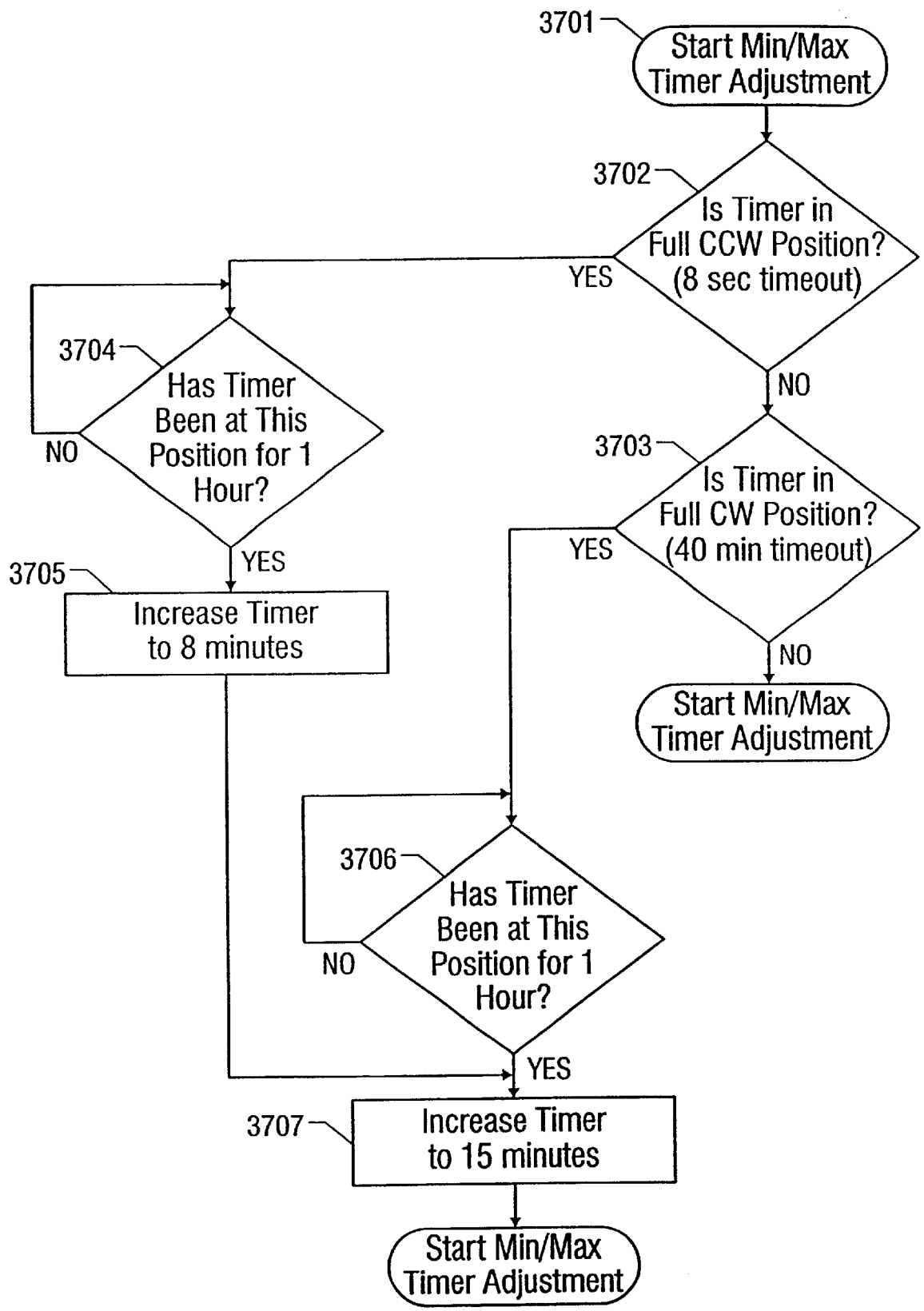
FIG. 37 is a timer adjustment task flowchart for the present invention.

The closer the sensor is to the HVAC register, the greater the affect of air flow. An acoustic detector designed to monitor air flow sounds can be used to complement ultrasonic detector systems. FIG. 36 illustrates signal levels for a room that is empty, quiet and unoccupied when air flow turns on 3601, the acoustic sound energy 3602 is detected by the acoustic detector before the ultrasonic detector is affected. The ultrasonic detector detects signal 3603 at 3604. This air flow on transition from 3604 to 3605 is difficult for ultrasonic detectors to reject. The Doppler shift spectrum in this region is broad and robust. Using the acoustic detector to temporarily inhibit or reduce ultrasonic sensitivity from 3601 to 3606 eliminates the ultrasonic detector from creating a "false-on" event The sensor's timer supports a number of special modes intended to address a variety of user needs such as to allow the sensor's installer to force a short time-out period for purposes of sensitivity adjustment, to avoid short timer settings in normal operation, and to avoid a long load-energized period with no motion if the sensor's circuit breaker is cycled. If the sensor is powered up with the timer adjustment potentiometer (319, FIG. 3) in the fully-CCW position, or if the timer adjustment potentiometer is adjusted to the fully CCW position after being at another setting, the sensor enters an 8-second timeout test mode. If the timer is adjusted from the fully-CCW position to another setting, the timer exits the 8-second timeout test mode and returns to normal operation. As an aid to the installer, the flowchart of FIG. 37 illustrates what happens if the sensor's timer is left in minimum timeout (8-second) or maximum timeout (32 minutes) setting for more than an hour. If the timer is at minimum (full CCW) the timer is set at 7 minutes (3702, 3704 and 3705). If the timer is at maximum (full CW) the timer is set at 15 minutes (3703, 3706 and 3707).

To accomplish ATA, a variety of situations modify the sensor's timer delay setting.

Figure 38:
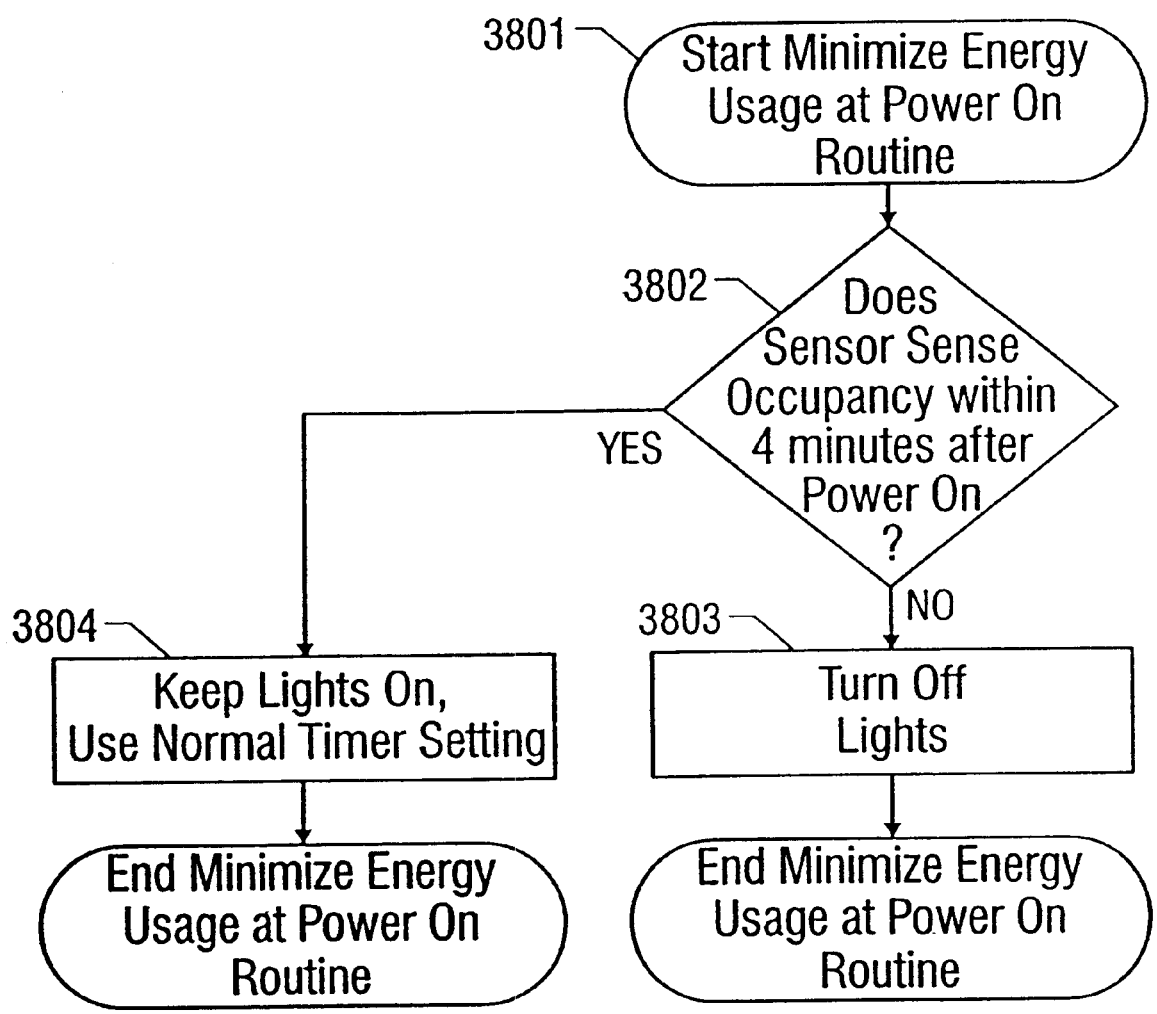
FIG. 38 is a minimize energy usage at power-up task flowchart for the present invention.

A false off event shown, for example, in FIG. 25, will slightly increase the timer delay setting. In addition, as shown in FIG. 38, the sensor also incorporates a minimize energy usage algorithm that checks for occupancy within the first two minutes after power up 3802. If motion is detected, keep lights on and use normal timer setting 3804. If motion is not detected, turn lights off 3803. This feature solves the problem if power is interrupted by utility failure or a general area shut down during the evening and power is subsequently restored. Conventional sensors power on and begin a complete time-out cycle, typically leaving the lights on needlessly for twenty minutes.

Figure 39:
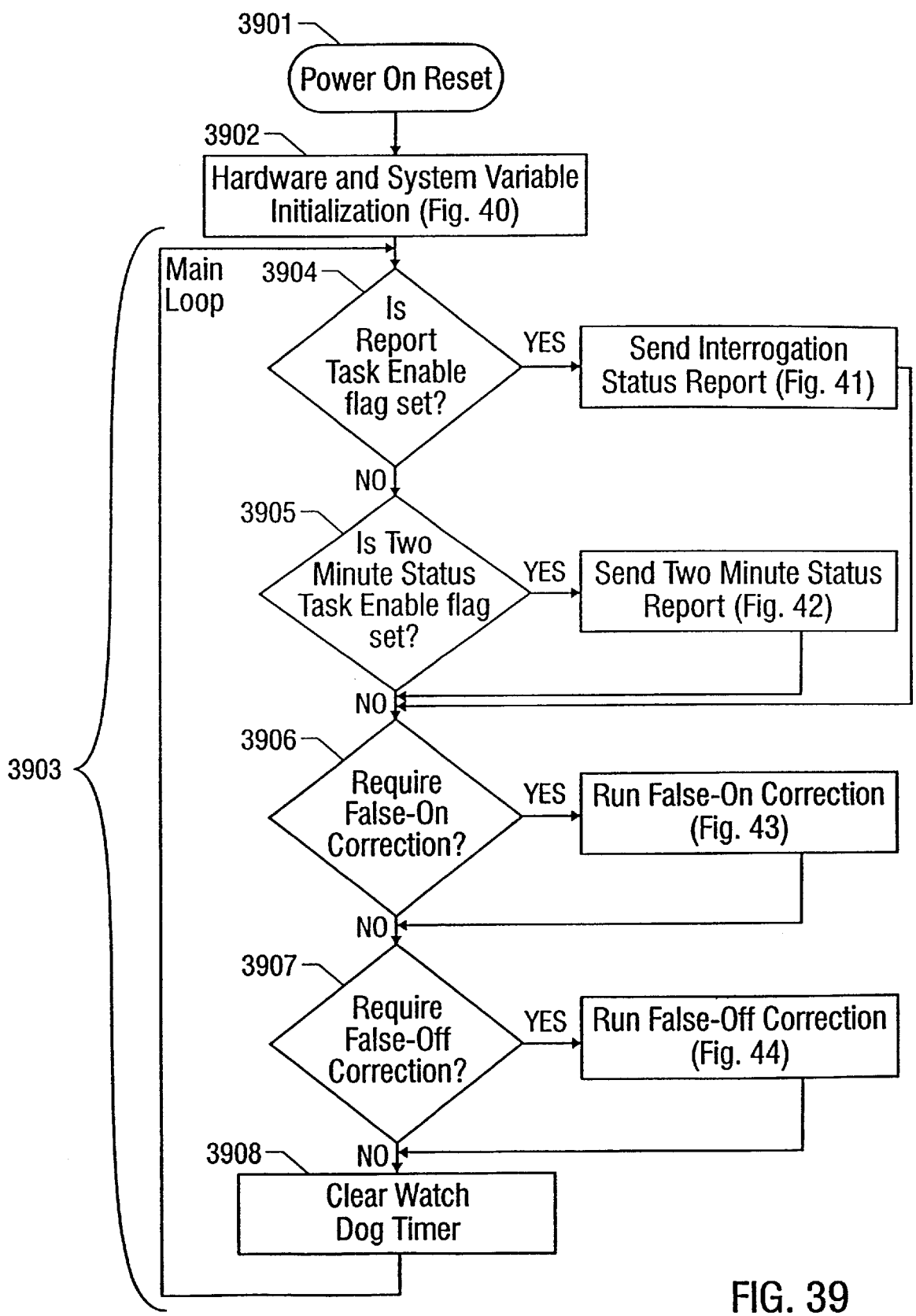
FIG. 39 is the main (foreground) routine flowchart of the present invention.

A flowchart of the main software routine of an exemplary embodiment of the present invention is shown in FIG. 39. In practice, the flowcharts depicted in FIGS. 32 and 39–69 are encoded in an appropriate programming language and loaded into the program memory of digital microcontroller 229 (FIG. 2), to cause digital microcontroller to control the operation of the apparatus of the present invention to perform the methods of the present invention.

Referring to FIG. 39, upon power on reset (3901), the digital microcontroller's various timer, counter, serial port and high speed 8-bit A/D converter peripherals are set up and the various sensor variables are initialized (3902). The microcontroller 229 then enters the occupancy sensor's main loop (3903). The sensor's main loop initially checks to see if either the manual interrogate status flag or the two minute status flag is enabled (3904, 3905). If so, the appropriate status report task is executed. The sensor then checks to see if a sensor false-on event or false-off event has occurred (3906, 3907). If either event has occurred, the appropriate correction task is executed. Finally, at the bottom of the main loop, the microcontroller's watch dog timer (WDT) is reset (3908). This timer is used to reset the microcontroller 229 to the power on reset state in the event of a software malfunction.

Figure 43:
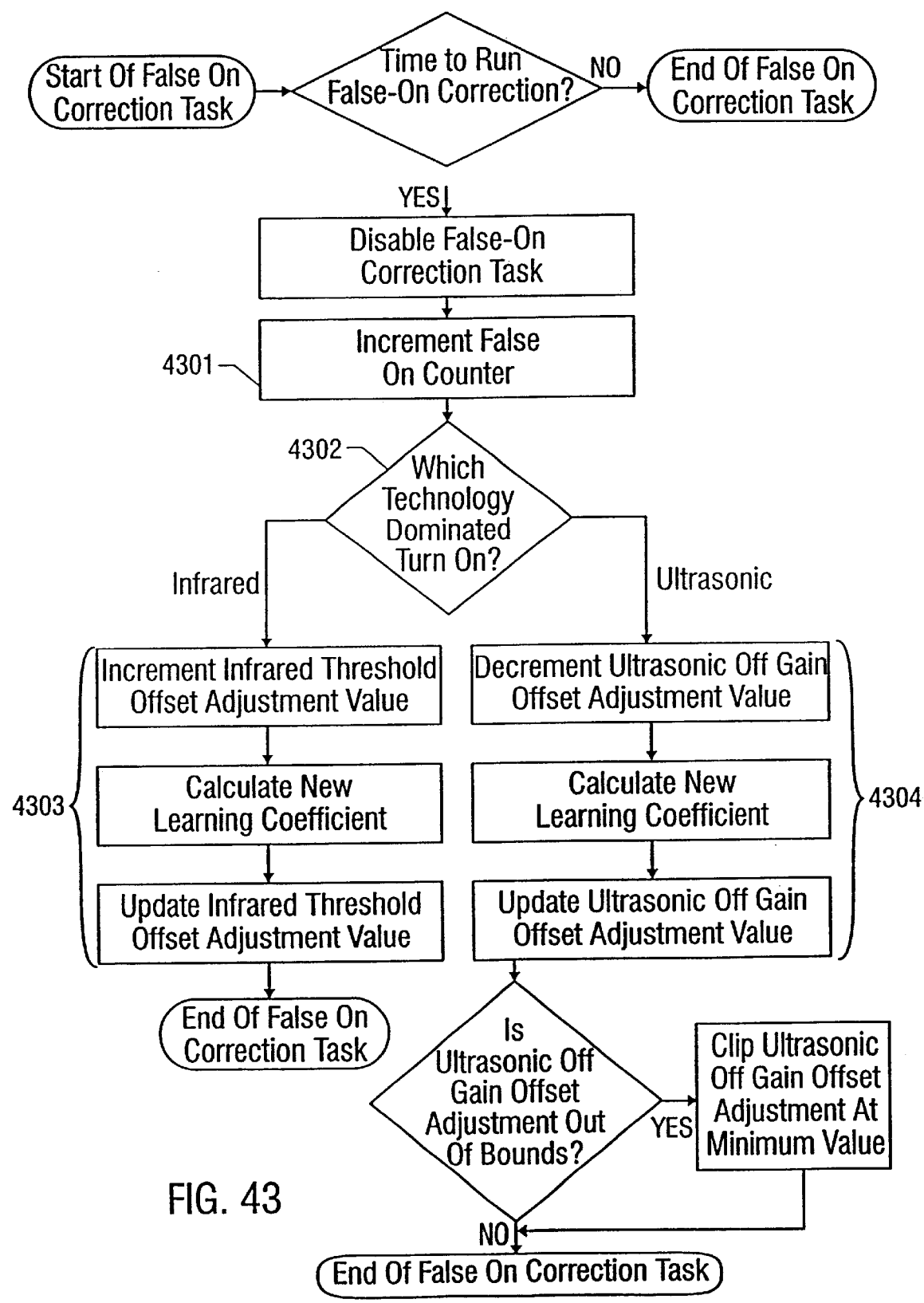
FIG. 43 is the false-on correction task flowchart of the present invention.
Figure 44:
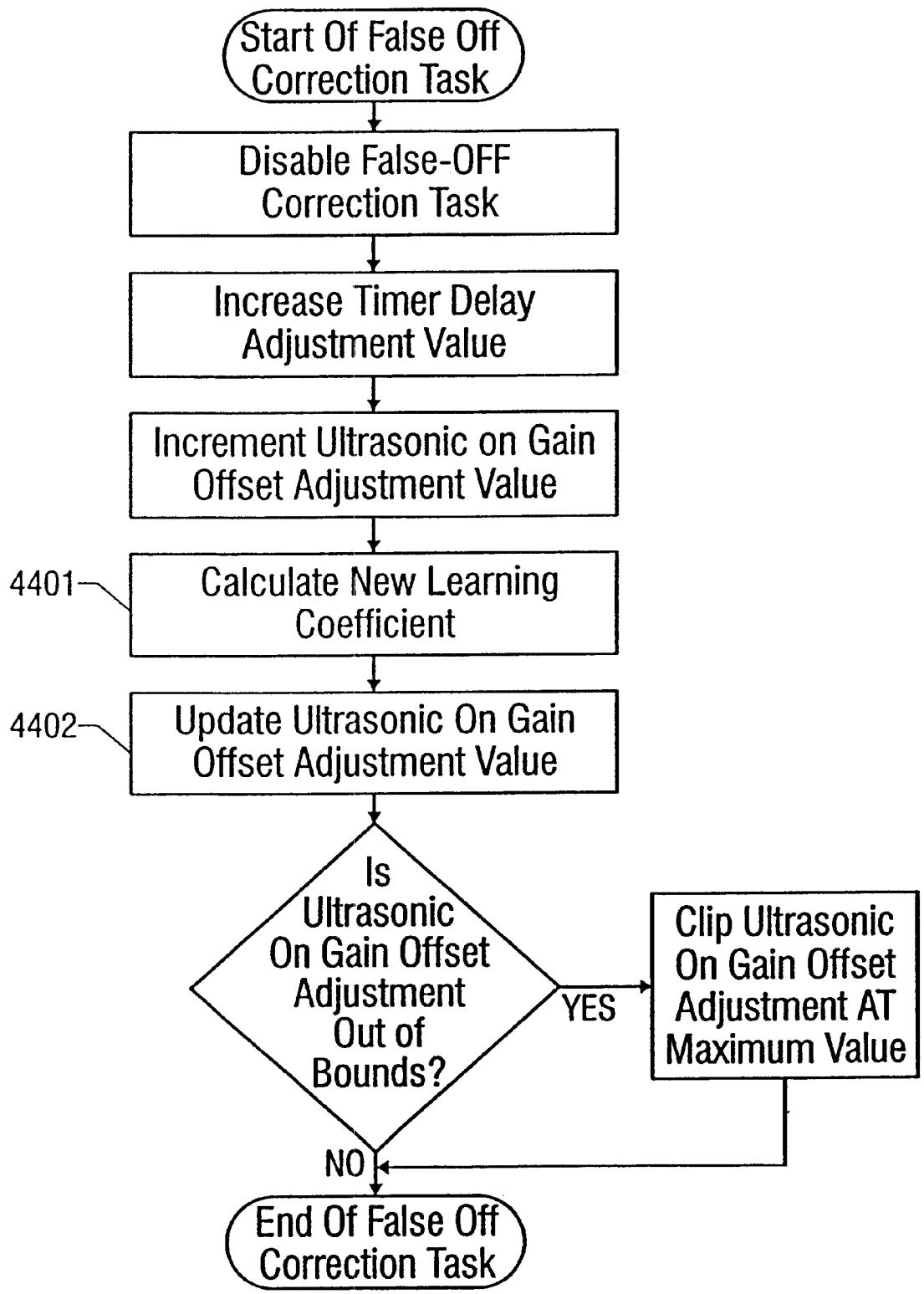
FIG. 44 is the false-off correction task flowchart of the present invention.

Thus, the main routine shown in FIG. 39 includes the following major software tasks that are described in detail in the figures indicated: hardware and system variable initialization task (FIG. 40); interrogation status report task (FIG. 41); two minute status report task (FIG. 42); false-on correction task (FIG. 43); and false-off correction task (FIG. 44).

Figure 40:
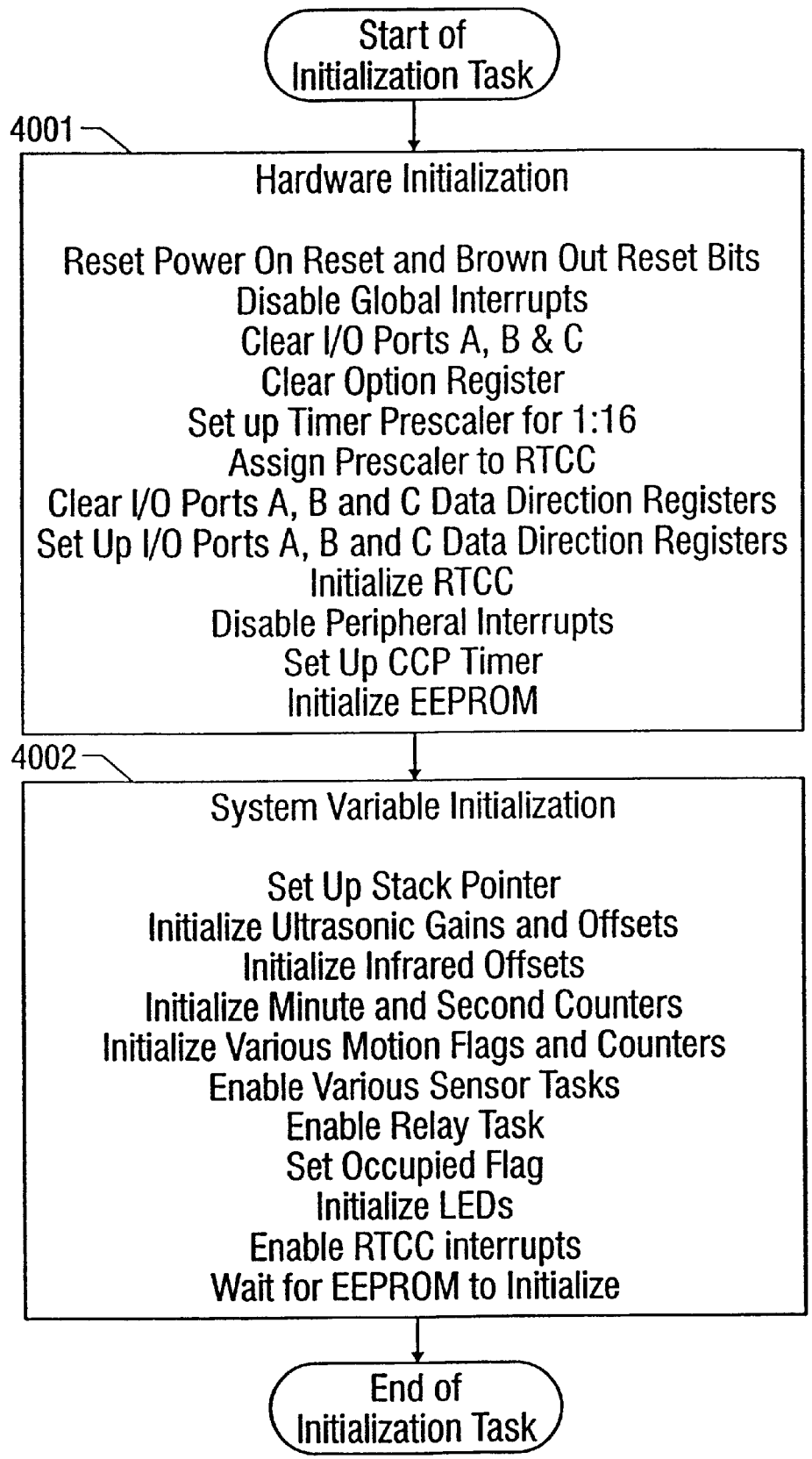
FIG. 40 is the hardware and system variable initialization routine flowchart of the present invention.

A flowchart of the hardware and system variable initialization task for the present invention is shown in FIG. 40. The hardware and system variable initialization task is executed on power up to configure the sensor for normal operation.

Initially the system on-chip and off-chip hardware is configured (4001). Specifically, the power on reset and brown out reset bits are reset. Global interrupts are disabled. The A, B and C I/O ports are cleared. The option register is cleared. The timer prescalar is set for 1:16 and is then assigned to the real time clock/counter (RTCC) peripheral. The various I/O port data direction registers are cleared and then set as required for normal operation. The RTCC timer count down value is set. All peripheral interrupts are disabled. The second CCP timer is set up. Finally, the serial EEPROM is initialized.

Next, the system variables of the occupancy sensor are initialized (4002). Specifically, a stack pointer is set up. The various ultrasonic gains, thresholds and offset values are initialized. The various infrared offset values are initialized. The minute and second counters are initialized. The various motion flags and motion counters are initialized. The primary sensor tasks are enabled except for the sensor task. The occupied bit is set. The various sensor LED registers are initialized. The RTCC interrupts are enabled. A variable delay is executed until the serial EEPROM initialization has been completed. A single EEPROM location is read to determine if the EEPROM has had sensor information previously stored in it. If it has, the contents of the EEPROM are read and the various sensor variables are restored. If the EEPROM has not had sensor information previously stored in it, the current sensor variables are stored in the EEPROM. Finally, the sensor task is enabled.

Figure 41:
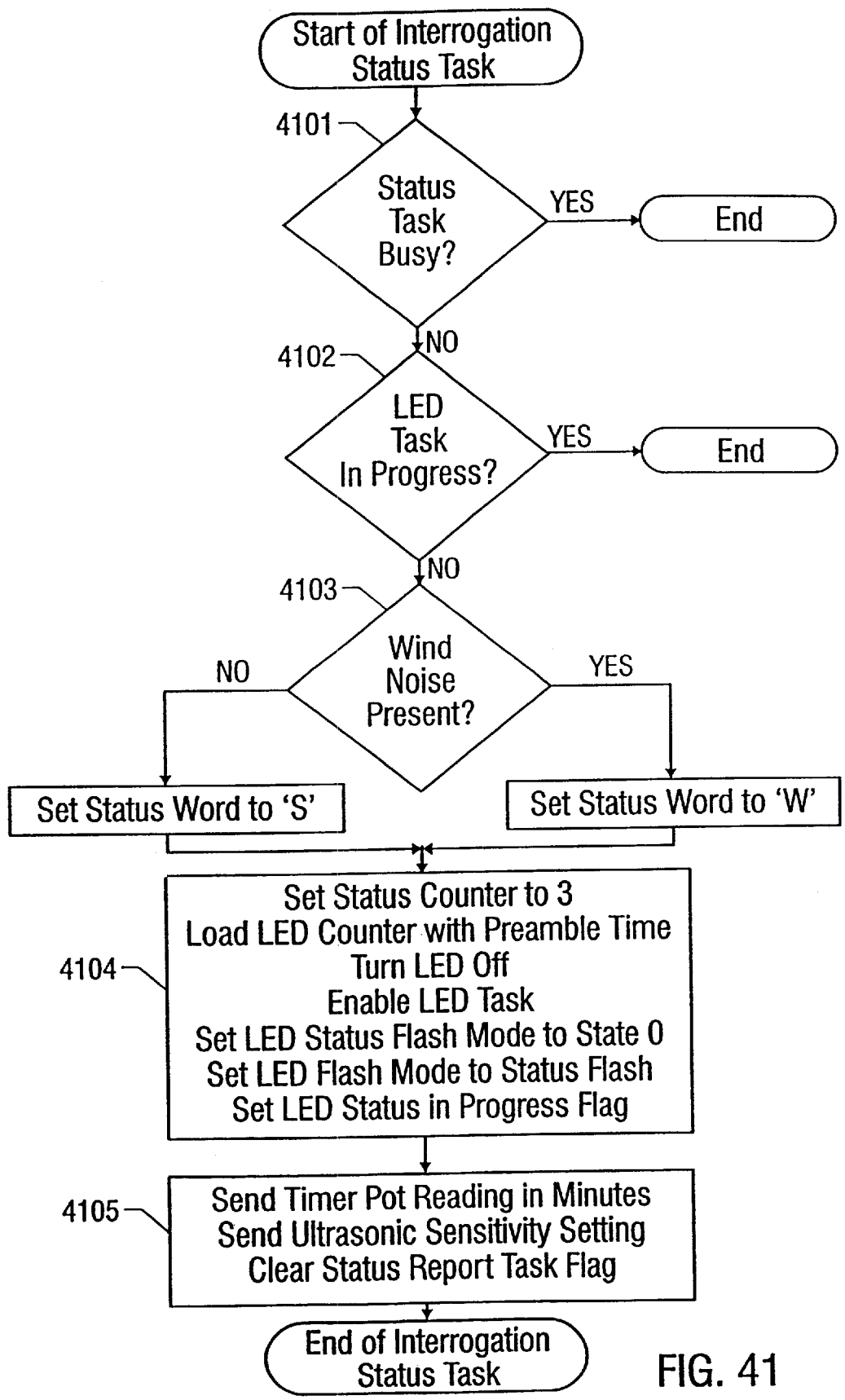
FIG. 41 is the interrogation status report routine flowchart of the present invention.

A flowchart of the interrogation status report task for the present invention is shown in FIG. 41. The interrogation status report task displays the status of the sensor in response to a user's interrogation of the sensor. If a status task is not currently in progress (4101), and if the LED task is not busy (4102), ultrasonic sensor 102 (FIG. 2) is checked to determine if wind noise is present (4103). Control then passes to block 4104, and then on to block 4105.

Figure 42:
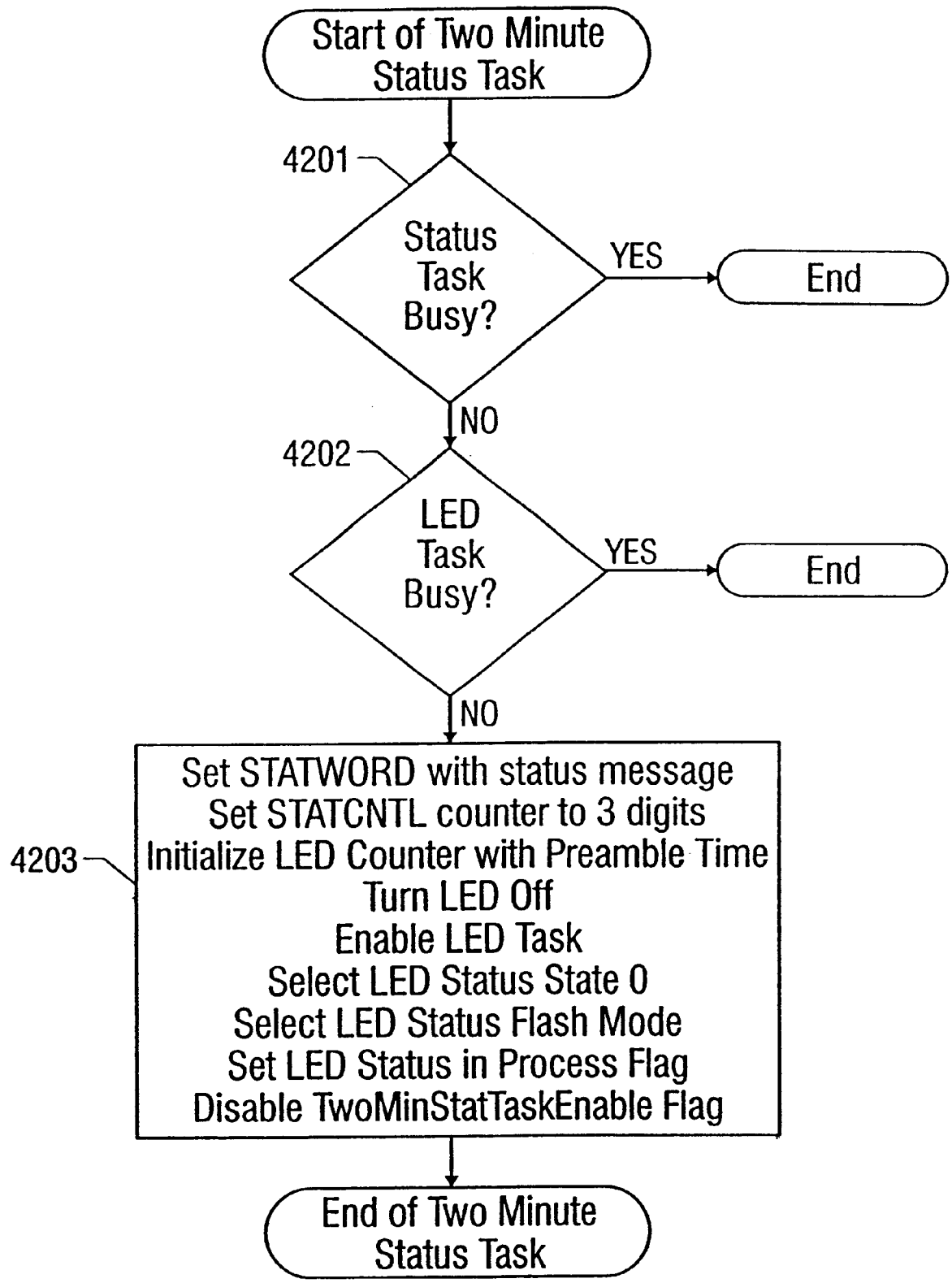
FIG. 42 is the two minute status report routine flowchart of the present invention.

A flowchart of the two minute status report task for the present invention is shown in FIG. 42. The two minute status report task displays the status of the sensor at periodic two minute intervals. If a status task is not currently in progress 4201), and if the LED task is not busy (4202), control passes to block 4203 where the sensor's status is stored in the sensor status message word and the sensor's status digit counter is initialized. The LED blink preamble time is stored in the LED counter and the LED is turned off. The LED task is enabled and the LED status state initialized. The LED status flash mode is set and the LED status in process flag is set. Finally, the TwoMinStatTaskEnable flag is set.

A flowchart of the false-on correction task for the present invention is shown in FIG. 43. The false-on correction task attempts to correct sensor false-on events by increasing the threshold required for the detection of motion. Initially a false-on event counter is incremented (4301). Then the sensor determines which technology dominated the false-on event (4302). A new adaptive leaning coefficient is computed and the appropriate threshold offset is adjusted (4303, 4304).

A flowchart of the false-off correction task for the present invention is shown in FIG. 44. The false-off correction task attempts to correct sensor false-off events by decreasing the ultrasonic threshold required for the detection of motion. A new adaptive learning coefficient is computed and the appropriate threshold offset is adjusted.

Figure 45:
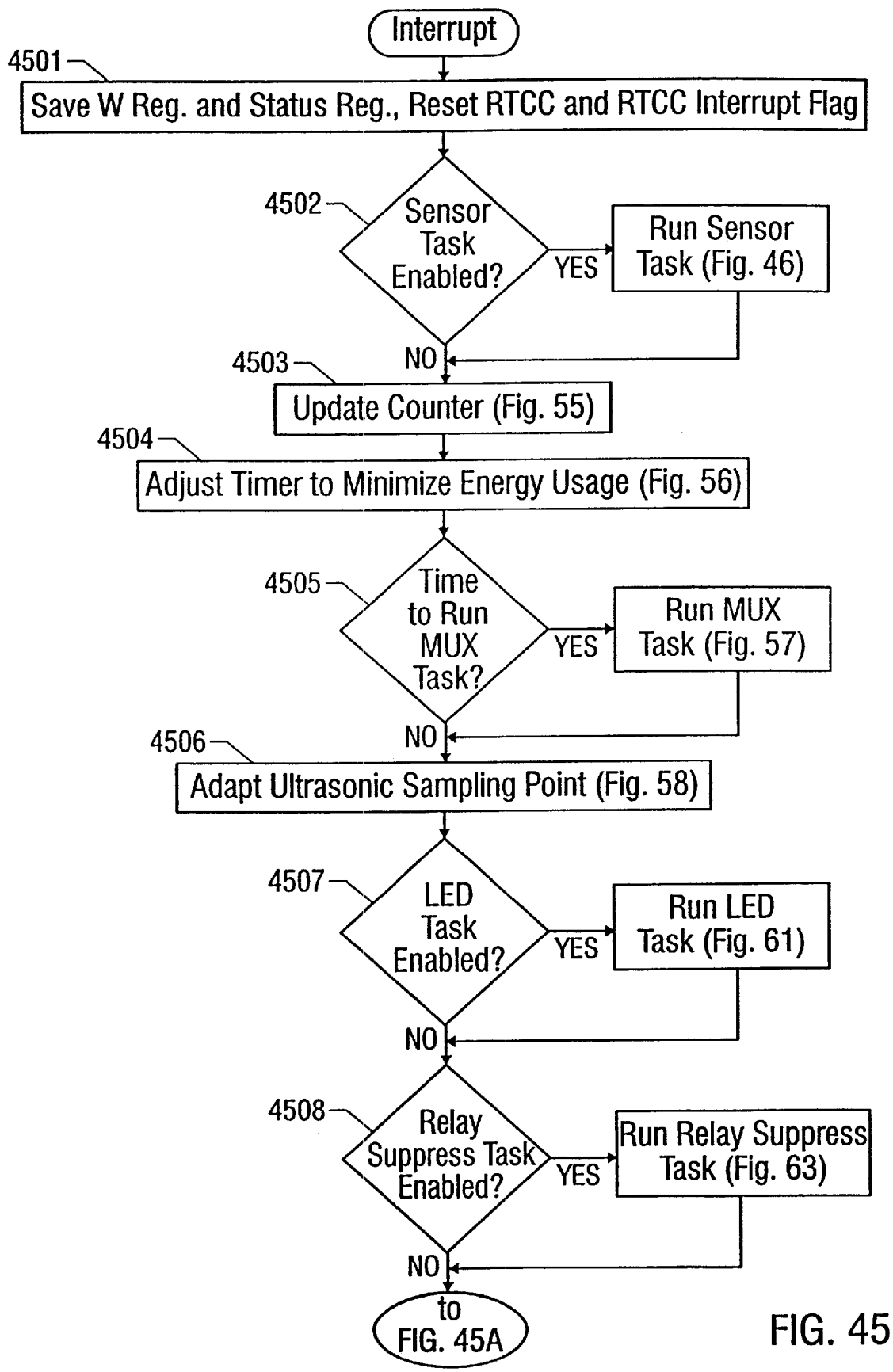
FIGS. 45 and 45A are the interrupt (background) routine flowchart for the present invention.
Figure 45A:
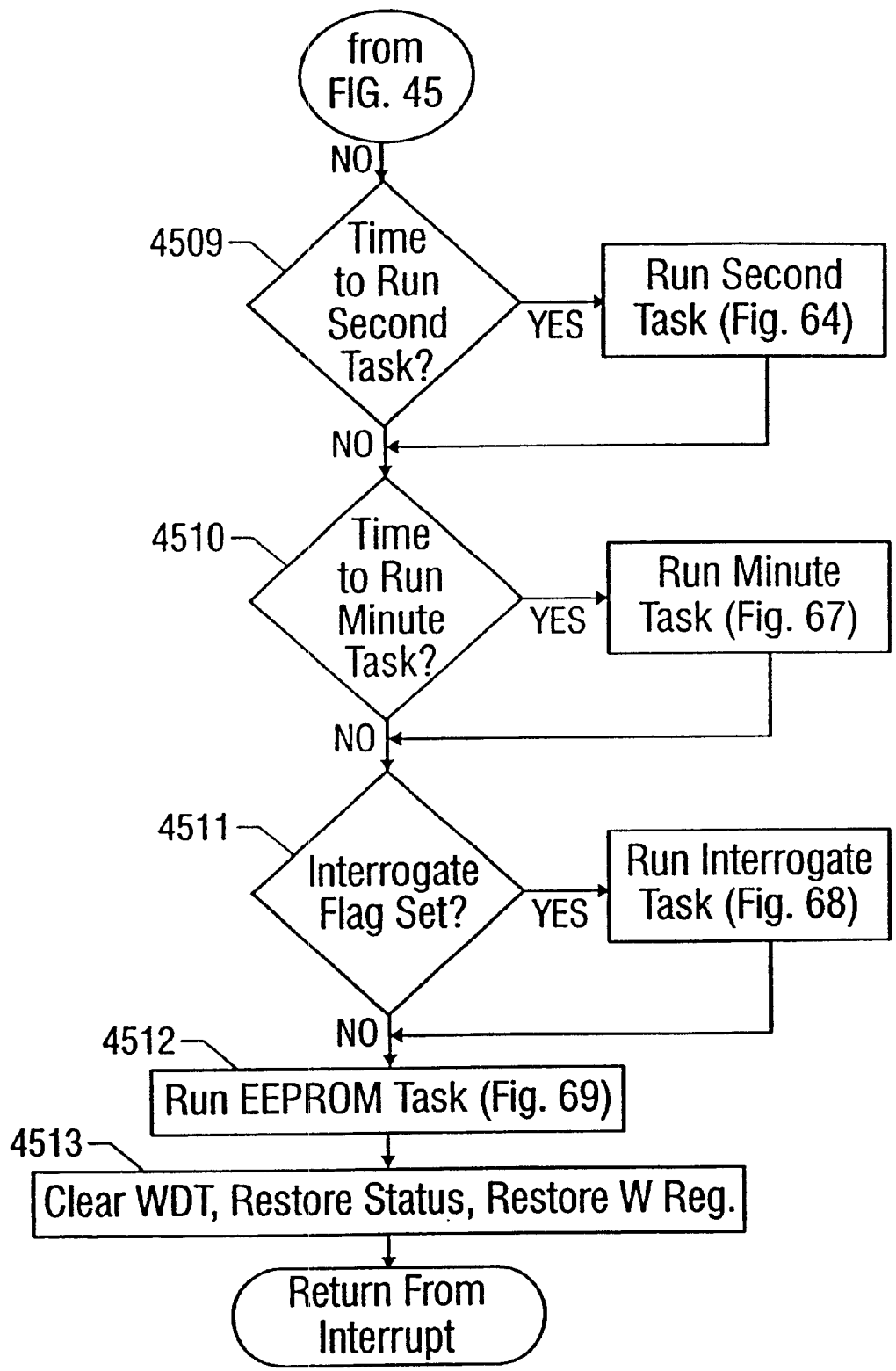

A flowchart of the occupancy sensor's interrupt software routine for the present invention is shown in FIG. 45. Upon interrupt, the contents of the 8-bit W accumulator register and Status register in microcontroller 229 are saved (4501). The timer/counter peripheral that generated the interrupt is reset and the microcontroller's interrupt flag is cleared (4501). The sensor task is executed if it is enabled (4502). The various occupancy sensor counters are updated (4503). The sensor's timer delay is adjusted to minimize energy consumption (4504). The multiplexer (MUX) task is run if it is enabled (4505). The ultrasonic sensor's sampling point is adapted (4506). Next, the LED task is run if it is enabled (4507). The relay suppress task is then run if it is enabled (4508). The second and minute tasks are then executed if enabled (4509, 4510). If the interrogate task is enabled it is executed (4511). The sensor's EEPROM task is then executed (4512). Finally, the microcontroller's watch dog timer (WDT) is cleared and the W register and the status register contents are restored (4513).

Figure 55:
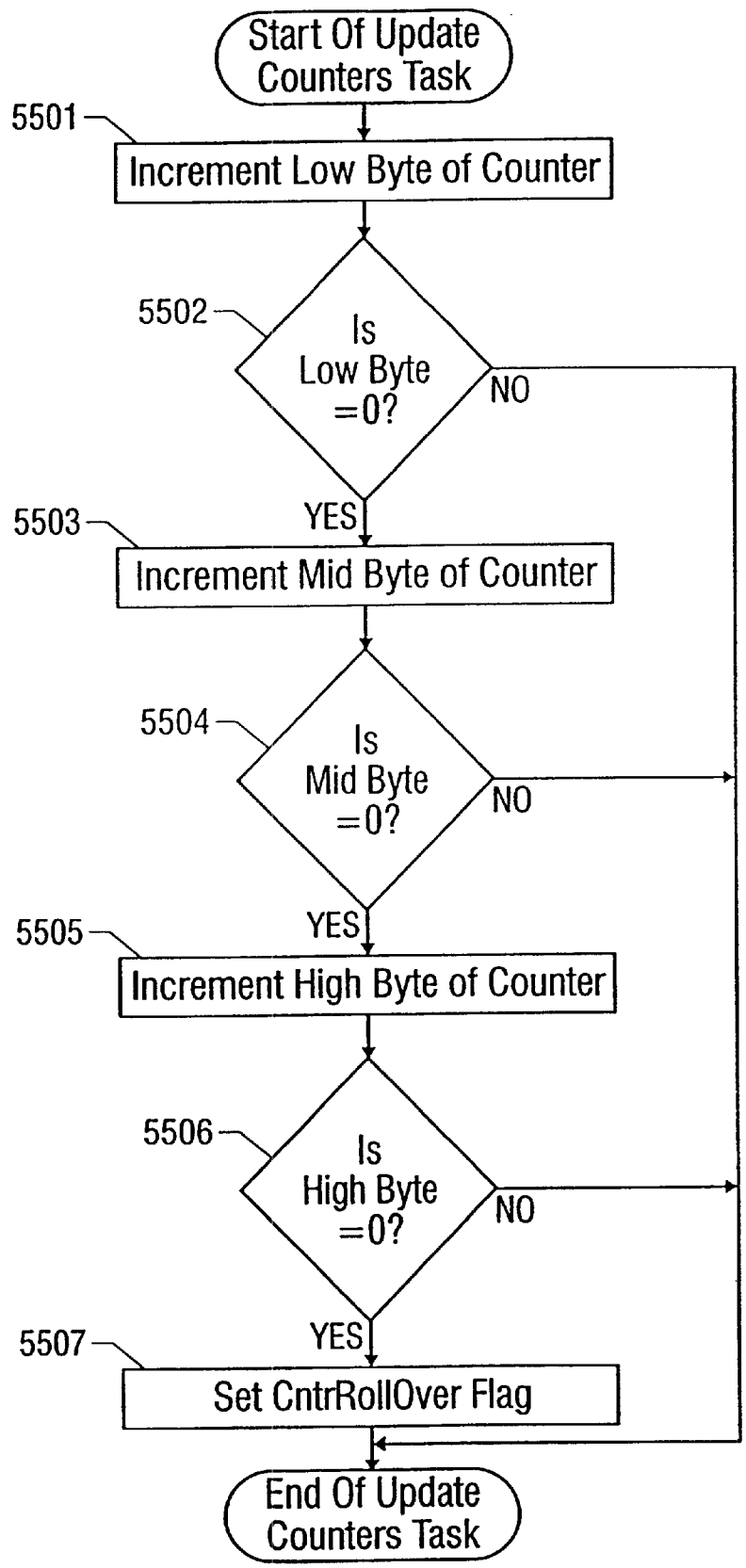
FIG. 55 is the update counters task flowchart for the present invention.
Figure 56:
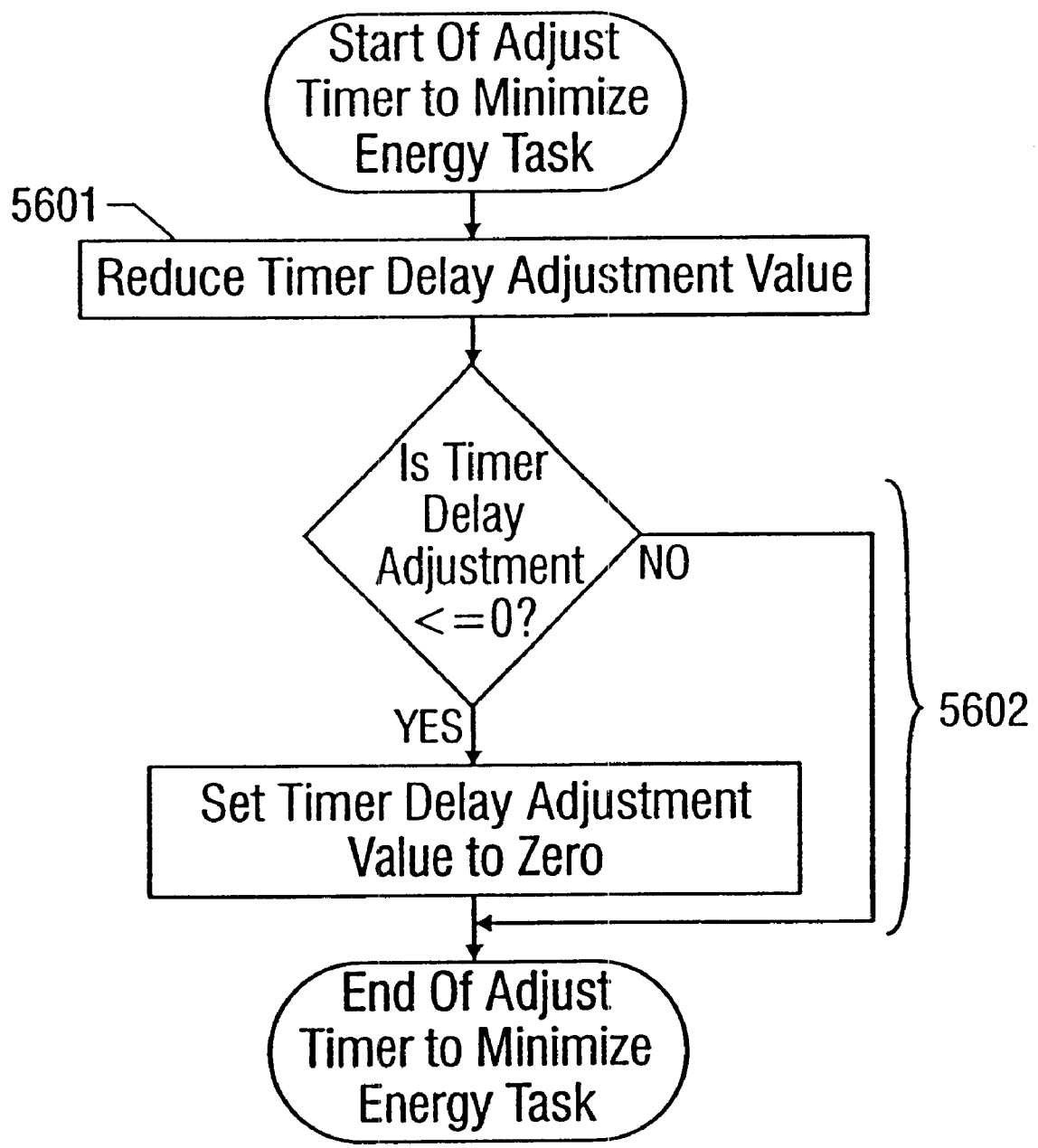
FIG. 56 is the adjust timer to minimize energy usage task flowchart for the present invention.
Figure 57:
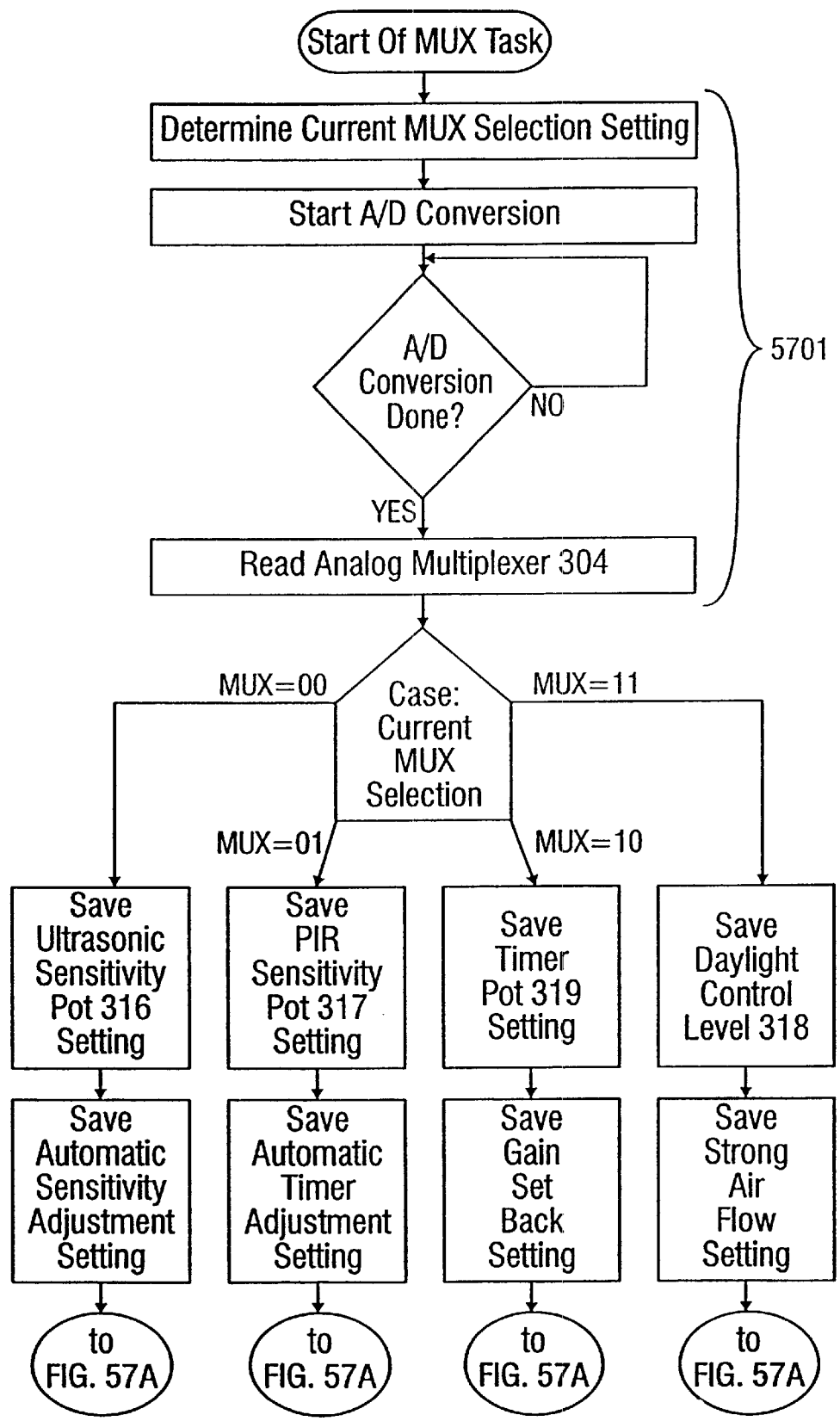
FIGS. 57 and 57A are the MUX task flowchart for the present invention.
Figure 57A:
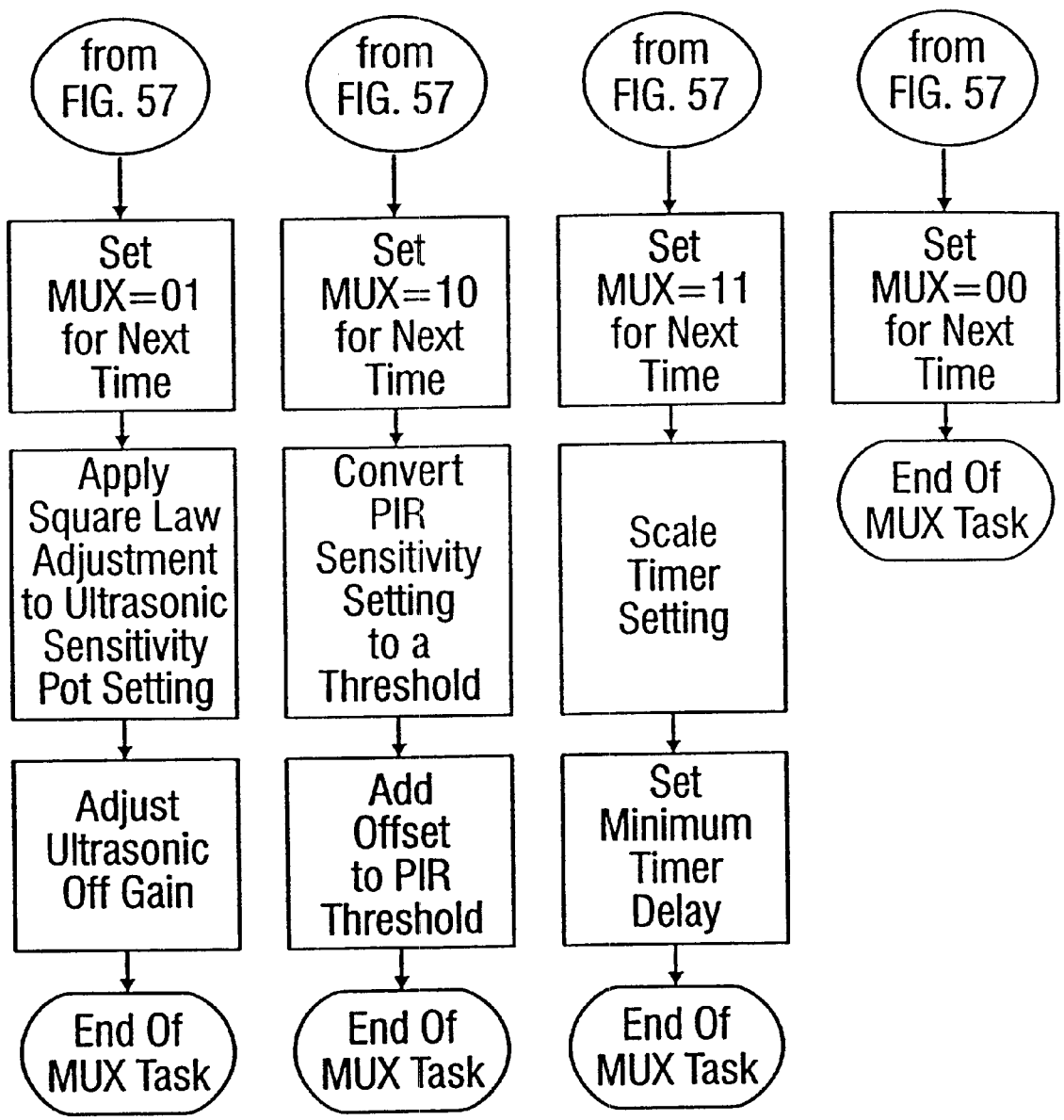
Figure 58:
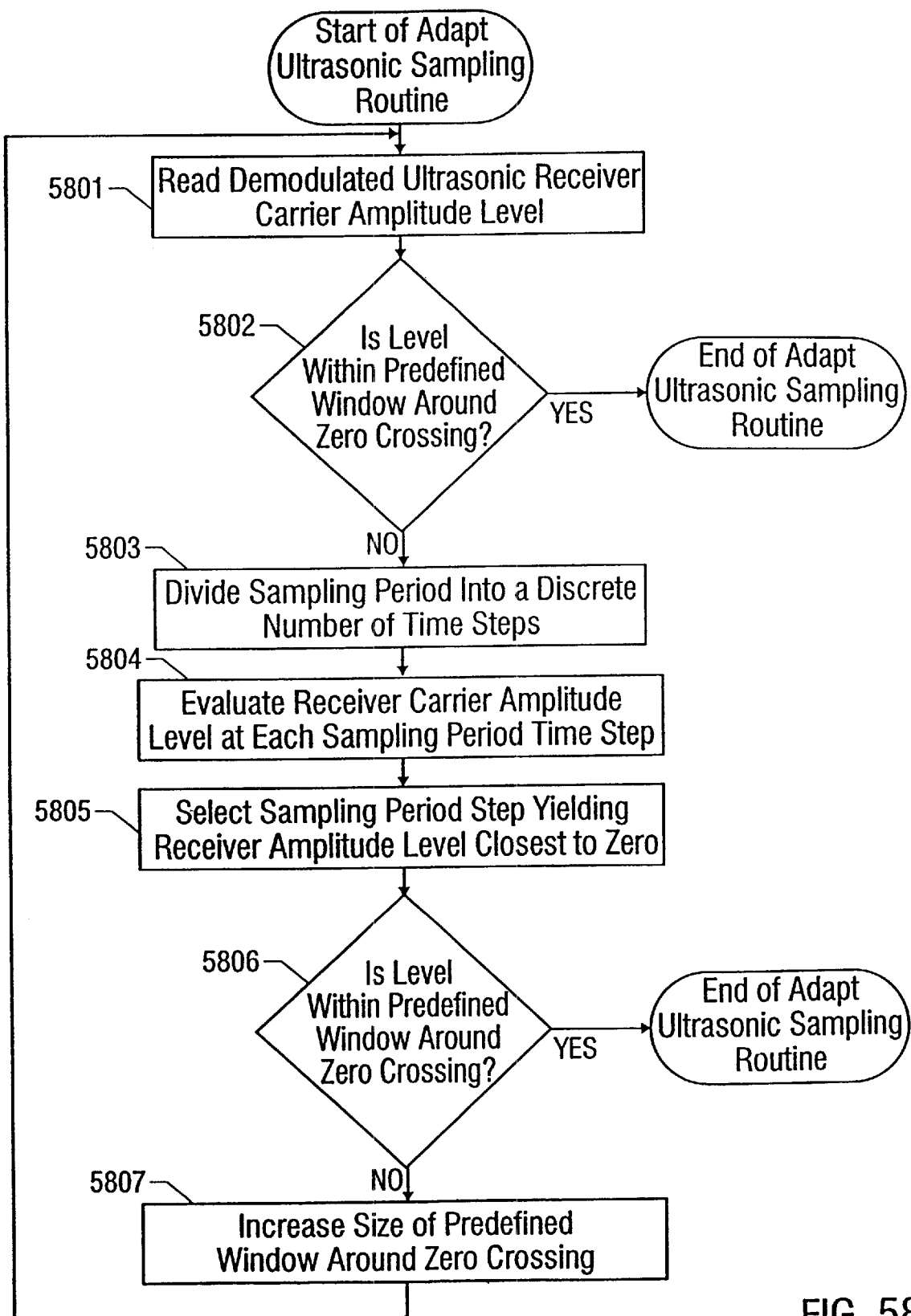
FIG. 58 is the adapt ultrasonic sampling routine flowchart for the present invention.
Figure 59:
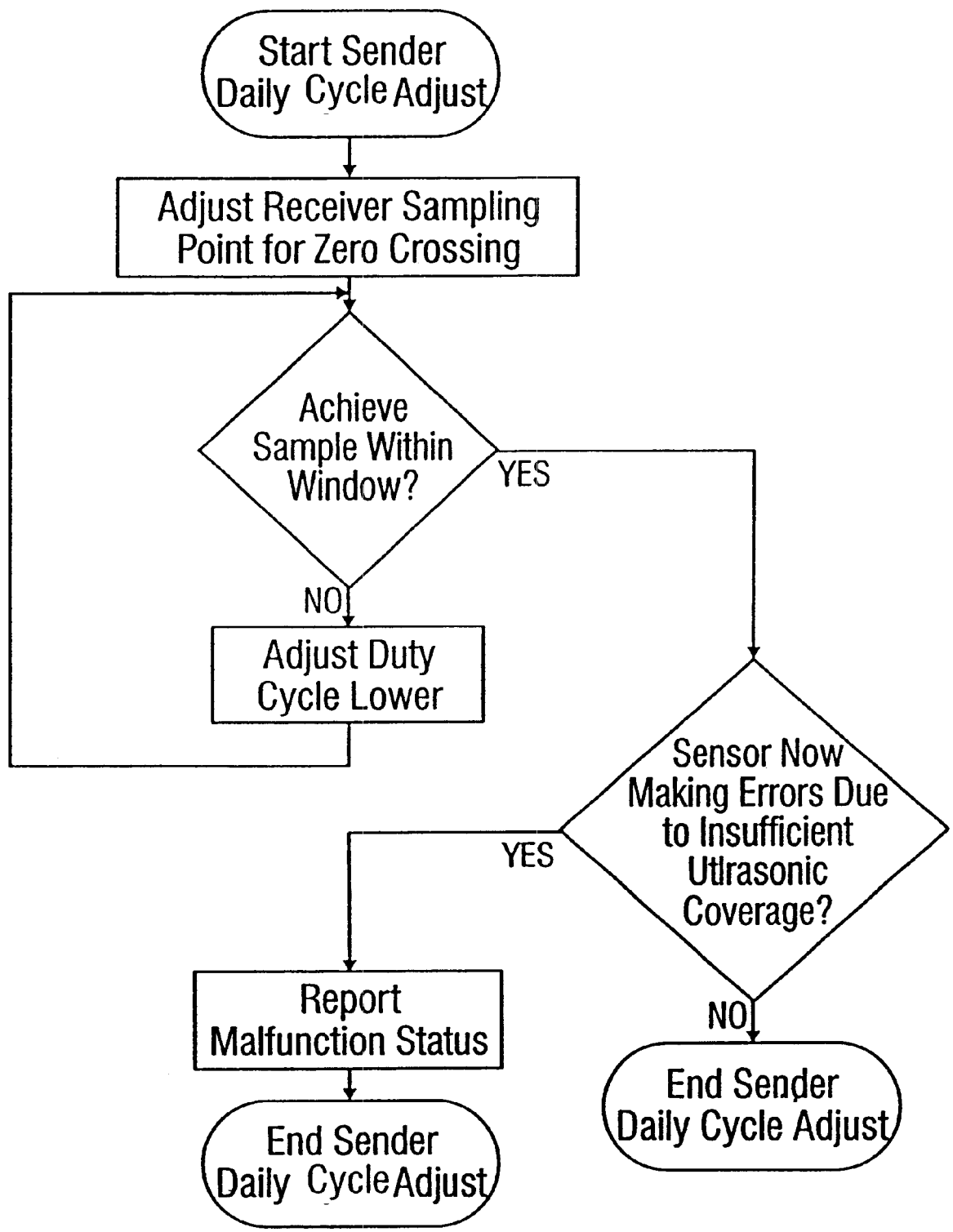
FIG. 59 is a flowchart of the ultrasonic transmitter duty cycle adjustment method of the present invention.
Figure 68:
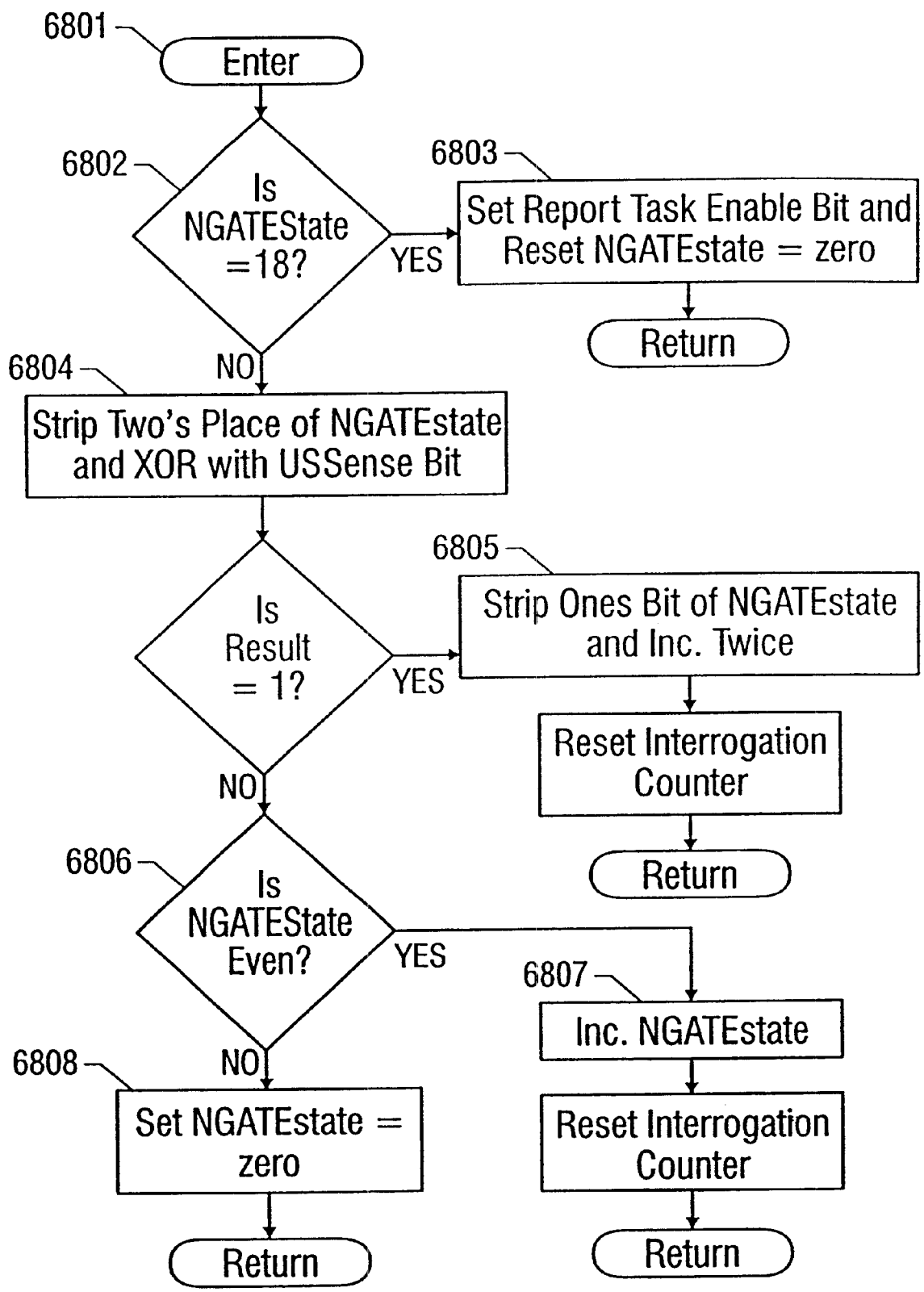
FIG. 68 is the interrogate task flowchart for the present invention.
Figure 69:
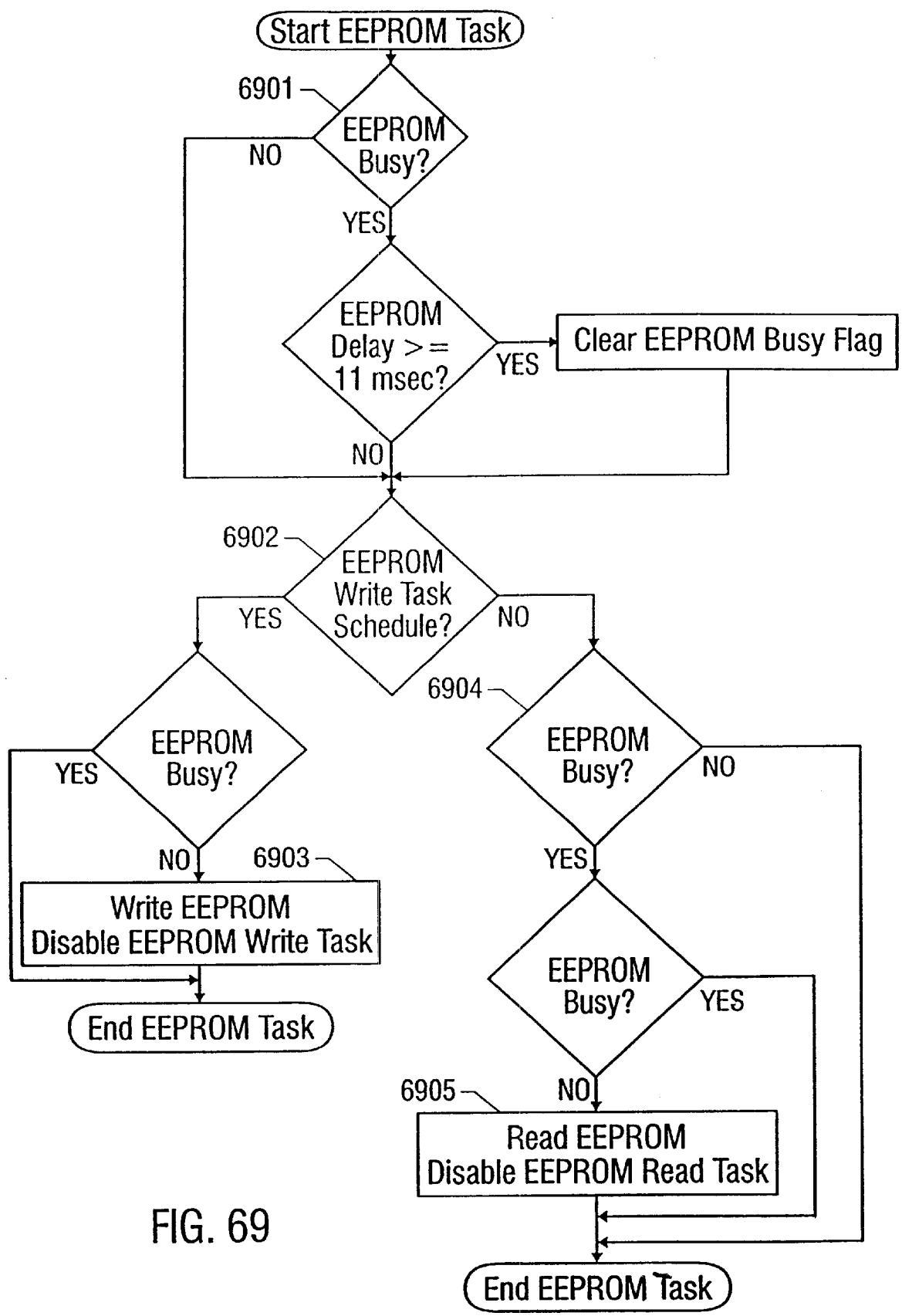
FIG. 69 is the EEPROM task flowchart for the present invention.

Thus, the interrupt routine shown in FIG. 45 includes the following major software tasks that are described in detail in the figures indicated: sensor task (FIGS. 46–54); update counters task (FIG. 55); adjust timer to minimize energy usage task (FIG. 56); MUX task (FIG. 57); adapt ultrasonic sampling point task (FIG. 58); LED task (FIG. 61); relay suppress task (FIG. 63); second task (FIG. 64); minute task (FIG. 66); interrogate task (FIG. 68); and EEPROM task (FIG. 69). Each of these interrupt routine software tasks is described in detail below.

Figure 46:
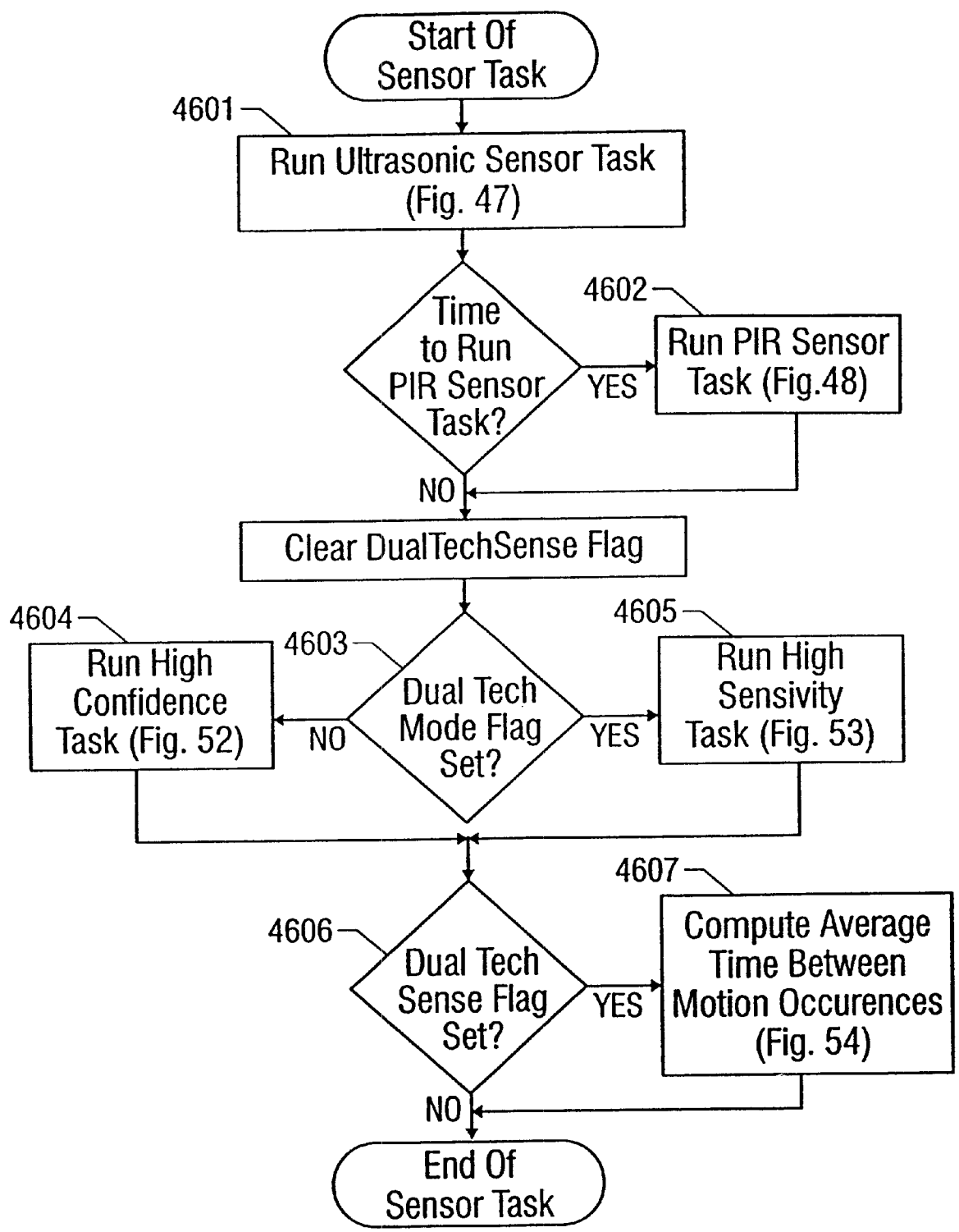
FIG. 46 is the sensor task flowchart for the present invention.

The sensor task inputs and processes data from each of the various sensor technologies. A flowchart of the sensor task of the present invention is shown in FIG. 46. First the ultrasonic task is executed (4601, shown in detail in FIG. 47). Next, the PIR task is executed if it is the proper time to run it (4602, shown in detail in FIG. 48). If the dual tech mode flag is set (4603) according to the state of user switch 307 (FIG. 3), the dual technology HIGH CONFIDENCE task is run (4604, shown in detail in FIG. 52). Otherwise, the dual technology HIGH SENSITIVITY task is run (4605, shown in detail in FIG. 53). Finally if the dual technology sense flag is set (4606), the average time between motion task is executed (4607, shown in detail in FIG. 54).

Figure 47:
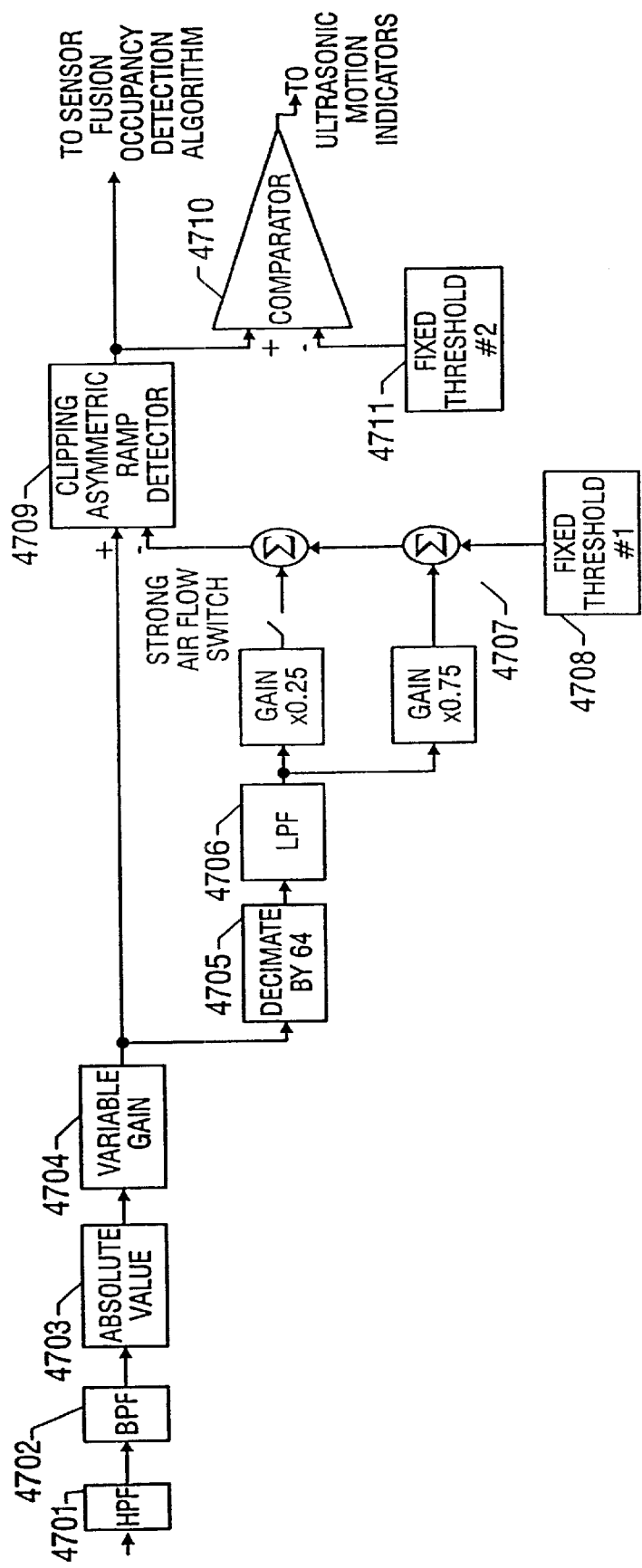
FIG. 47 is the ultrasonic DSP task block diagram for the present invention.

The ultrasonic task inputs data from the ultrasonic sensor and processes that data using an ultrasonic DSP algorithm. An exemplary ultrasonic DSP algorithm is shown schematically in FIG. 47. Although the ultrasonic DSP algorithm is represented as hardware components in FIG. 47, the algorithm is actually embodied in software. Referring to FIG. 47, first, the ultrasonic data is sampled using a sampling frequency $f_s$ of approximately 1,000 Hz. The ultrasonic data is initially passed through a low order digital highpass filter 4701. The digital ultrasonic data is then passed through a low order digital bandpass filter 4702. Next, the absolute value of the ultrasonic data signal is computed (4703) and passed through a variable gain stage 4704. The gain of stage 4704 is derived from the setting of user-specified ultrasonic sensitivity potentiometer 316 (FIG. 3). The output of the variable gain stage 4704 is then decimated by factor of 64 ($f_s$=~16 Hz) 4705, and passed through a low order digital lowpass filter 4706. Low pass filter 4706 has a cutoff frequency of approximately 2.5 Hz. The output of Low pass filter 4706 is multiplied by a variable factor, 4707, depending on the presence of strong air flow. If the strong air flow option switch 311 (FIG. 3) is ON indicating the presence of strong air flow, the signal is multiplied by a factor of 1.0. Otherwise the signal is multiplied by a factor of 0.75. A fixed offset value 4708 is added to the result that is then fed into the negative (−) input of a clipping asymmetric ramp detector 4709. The positive (+) input of ramp detector 4709 is connected to the output of the variable gain stage 4704. Whenever the positive input of ramp detector 4709 is greater than the negative input, the output of ramp detector 4709 increases by 512. Conversely, whenever the negative input of ramp detector 4709 is greater than the positive input, the output of ramp detector 4709 decreases by 128. The output of the ultrasonic DSP block is passed through a digital pulse stretcher to increase the time duration of the peaks in the ultrasonic signal. This technique slightly increases the probability of detection of small time duration events by stretching the ultrasonic signal peaks in time until the infrared sensor responds to the corresponding event, and is described in detail below with reference to FIGS. 49, 50 and 51. After pulse stretching, the output of ramp detector 4709 is passed to the sensor's fusion detection occupancy algorithm, as shown in more detail in the flow chart of FIG. 52 and 53. Finally, the output of ramp detector 4709 is compared (4710) to a user-specified ultrasonic sensor activation threshold (4711). If the signal is above that threshold, the ultrasonic motion indicator(s) will be activated.

Figure 48:
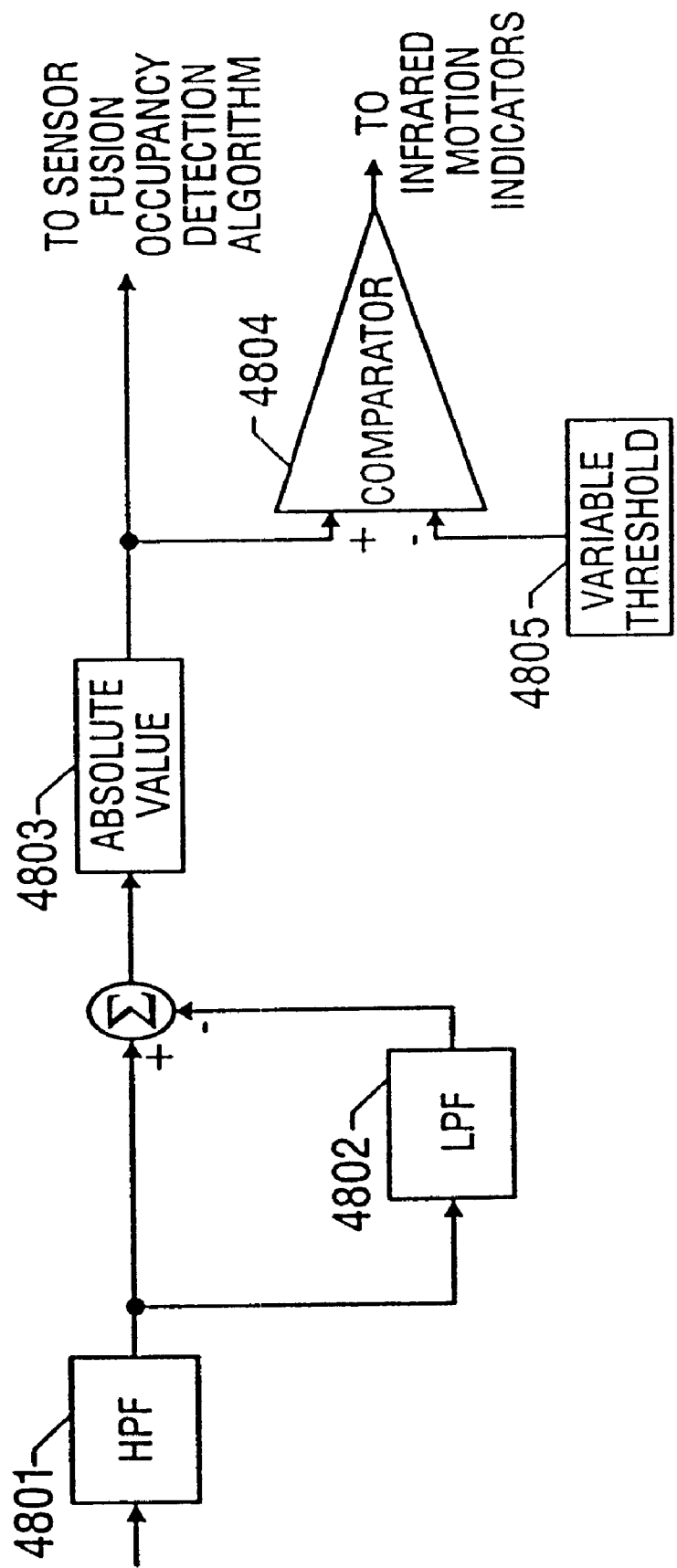
FIG. 48 is the infrared DSP task block diagram for the present invention.

The PIR task inputs data from the infrared sensor and processes that data using a passive infrared DSP algorithm. An exemplary PIR DSP algorithm is shown schematically in FIG. 48. Although the PIR DSP algorithm is represented as hardware components in FIG. 48, the algorithm is actually embodied in software. Referring to FIG. 48. The PIR data is sampled using a sampling frequency $f_s$ of approximately 32 Hz. The PIR data is initially passed through a low order digital highpass filter 4801. The digital PIR data is then passed through a low order digital lowpass filter 4802. Next, the PIR difference signal is computed by subtracting the output of the PIR low pass filter 4802 from the output of the PIR high pass filter 4801. Next, the absolute value of the PIR difference signal is computed 4803. The absolute value of the PIR difference signal is then pulse stretched in a manner similar to that done with the ultrasonic signal, and passed to the sensor's multi-technology sensor fusion detector (FIG. 52 and 53) to determine occupancy. Finally, the absolute value of the PIR difference signal is compared 4804) to a user-specified PIR activation threshold (4805); If this signal is above the threshold, the infrared motion indicator(s) will be activated.

As mentioned above with reference to FIGS. 47 and 48, pulse stretching is applied in both the ultrasonic and PIR DSP algorithms. This is desirable because valid occupancy signals from multiple technologies may occur nearly, but not exactly simultaneously. For instance, ultrasonic motion detectors are preferentially sensitive to motion along the direction to the sensor, while infrared are more sensitive to motion perpendicular to the direction to the sensor. Under normal circumstances, the movements of an occupant of the controlled space may vary between the directions toward and perpendicular to the sensor, resulting in occupancy estimator signals that peak at different times.

Figure 49:
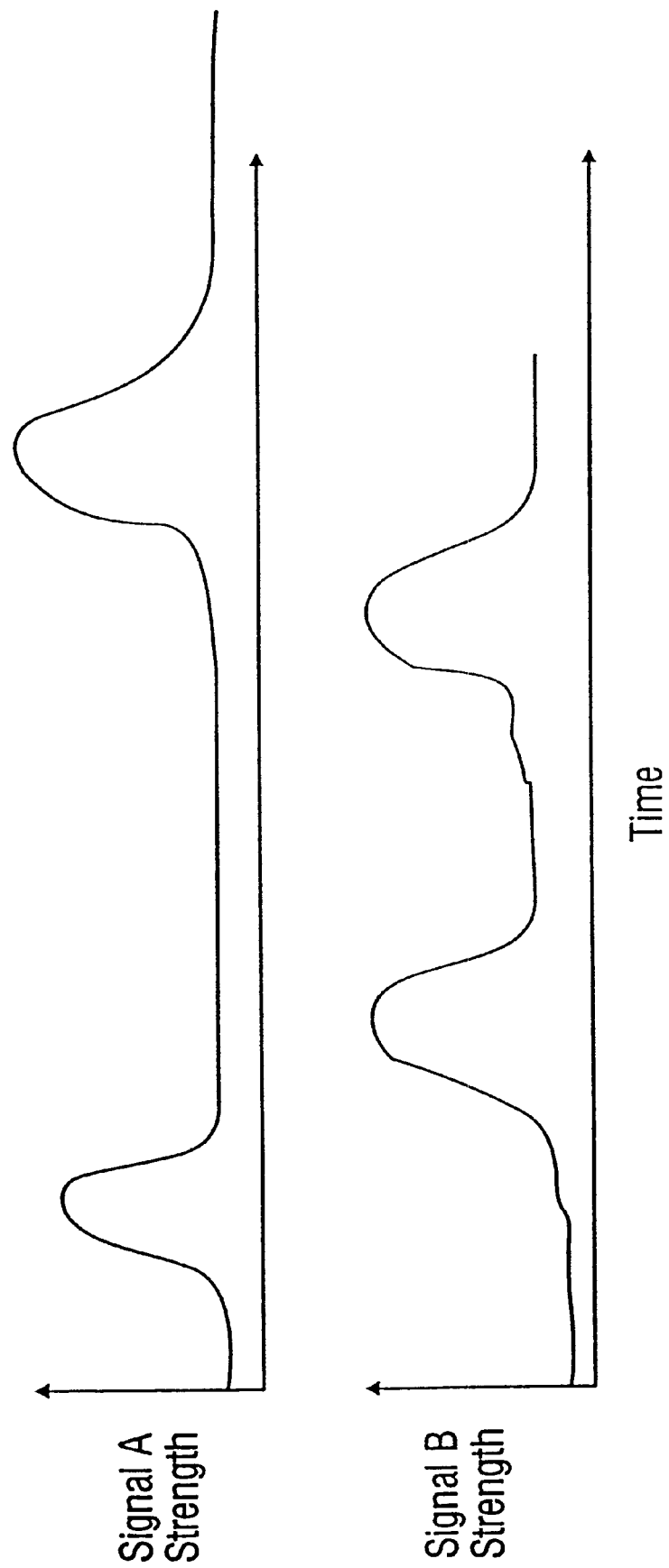
FIG. 49 is a time line of two unstretched occupancy signals
Figure 50:
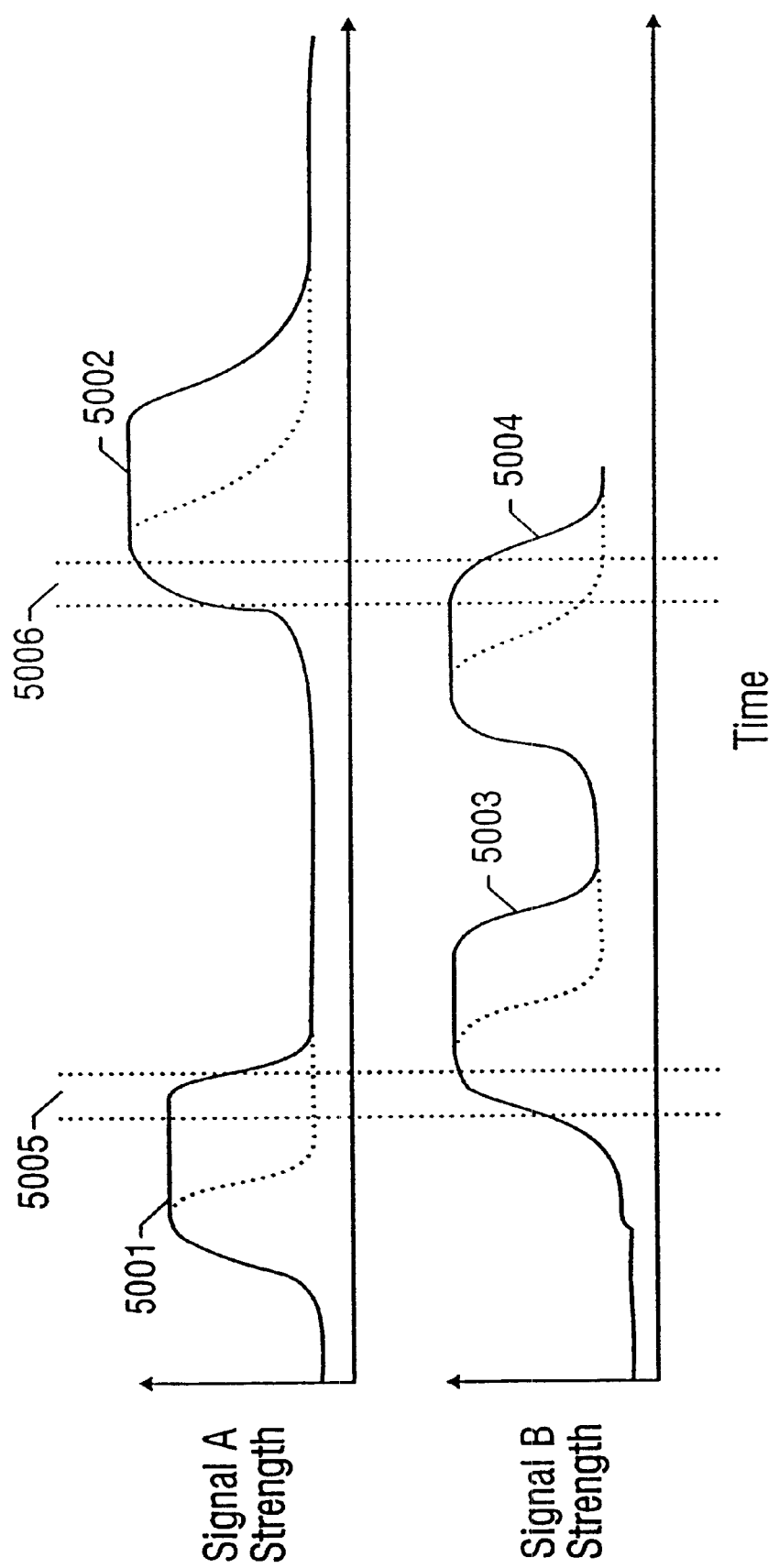
FIG. 50 is a time line of two stretched occupancy signals

The need for pulse stretching is illustrated in FIG. 49. Without pulse stretching, motion signals from detection technology 1 and 2 occur at different times and are generally not coincident in time. In this case a composite occupancy estimator will not indicate occupancy, despite the near coincidence of signals from the individual detection technologies. The result of stretching these signals is shown in FIG. 50. In this case the stretch of signal 1 (5001) brings it into temporal coincidence (5005) with signal 2 in the first case, and the stretch of signal 2 (5002) brings it into temporal coincidence (5006) with signal 1 in the following case. Now the signals overlap, and a composite occupancy estimator will indicate occupancy.

Figure 51:
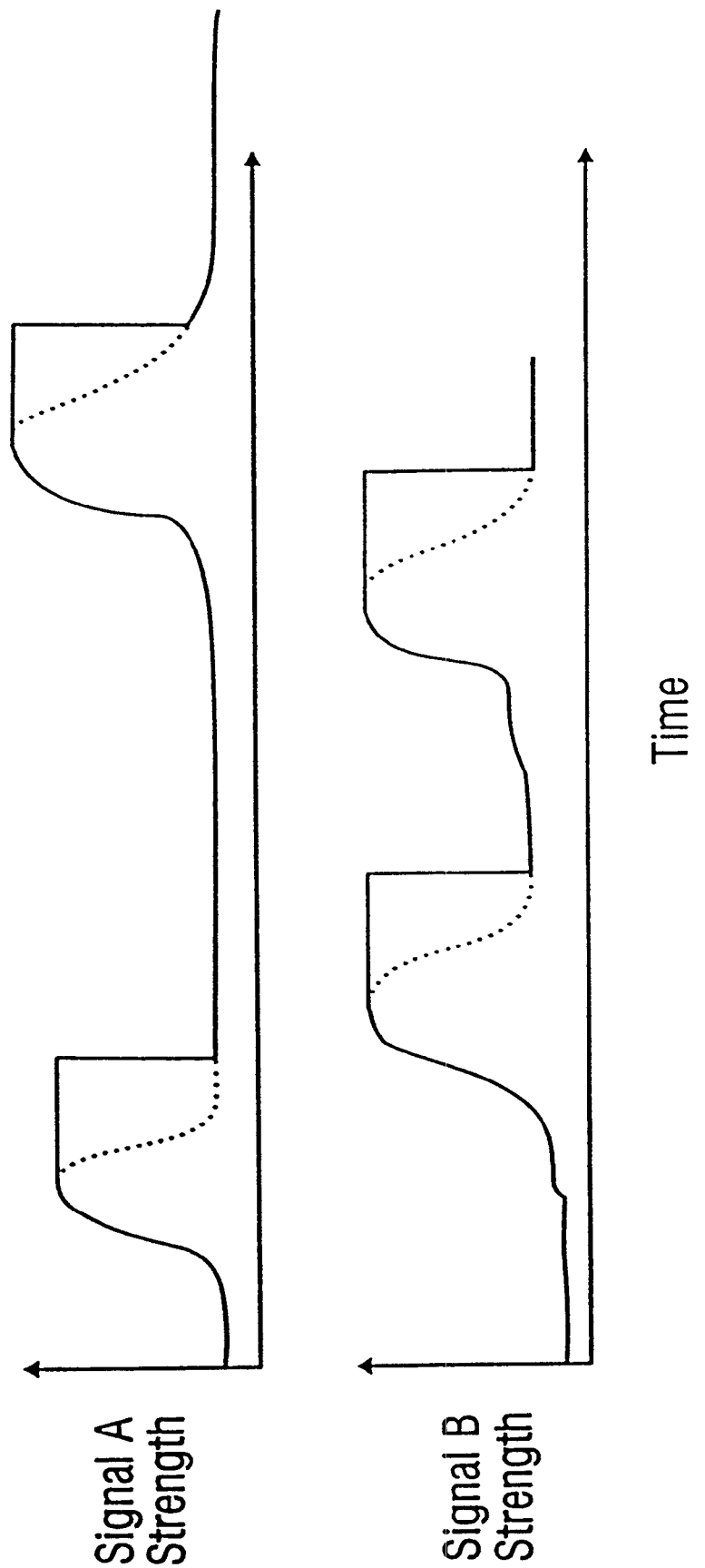
FIG. 51 is a time line of two peak stretched occupancy signals

Pulse stretching as shown in FIG. 50 generally requires a circular buffer large enough to store a number of samples equal to the stretch time period divided by the sample rate. It also requires a search algorithm to find the maximum value within the buffer, that becomes the current stretched signal value. An alternative implementation is to recognize the local maximum of a signal, and stretch only the maximum value. This implementation requires a lesser computational resource, and the storage of only two values, the signal maximum value, and its stretch ending time. The result of this pulse stretching implementation is shown in FIG. 51.

Figure 52:
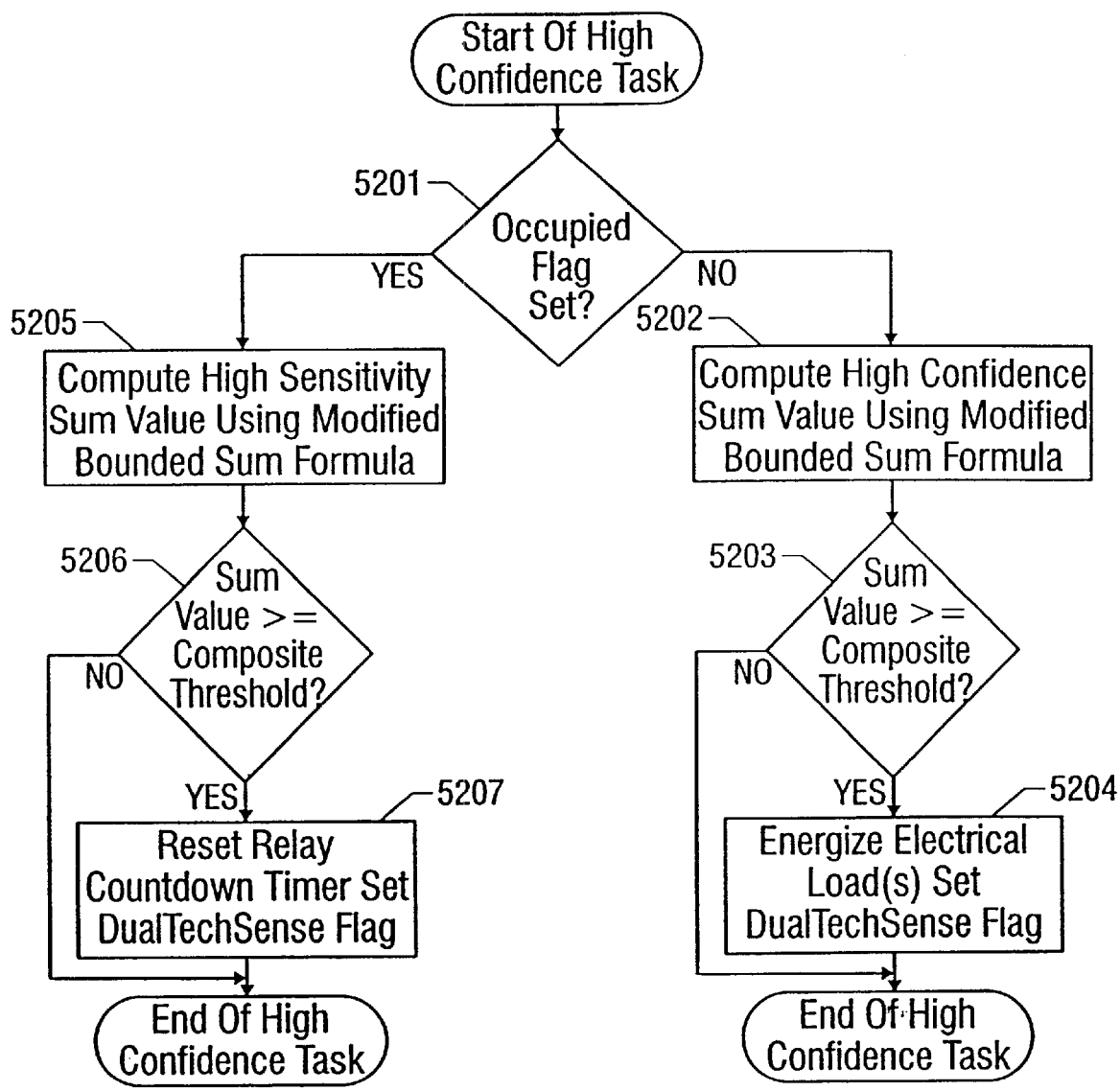
FIG. 52 is the HIGH CONFIDENCE task flowchart for the present invention.

The HIGH CONFIDENCE task implements the sensor's HIGH CONFIDENCE occupancy detection mode. A flowchart of the sensor's HIGH CONFIDENCE task is shown in FIG. 52. If the area covered by the occupancy sensor is not currently occupied (5201), a composite occupancy estimator is computed using an arithmetic sum formula (5202). If the resulting value is above the predetermined composite activation threshold (5203), the sensor's electrical load(s) are energized and the DualTechSense flag is set (5204).

If the area covered by the occupancy sensor is currently occupied, a composite occupancy estimator is computed using an arithmetic sum formula (5205). If the resulting composite occupancy estimator value is above the predetermined composite maintenance threshold (5206), the sensor's relay countdown timer is reset and the DualTechSense flag is set (5207).

Figure 53:
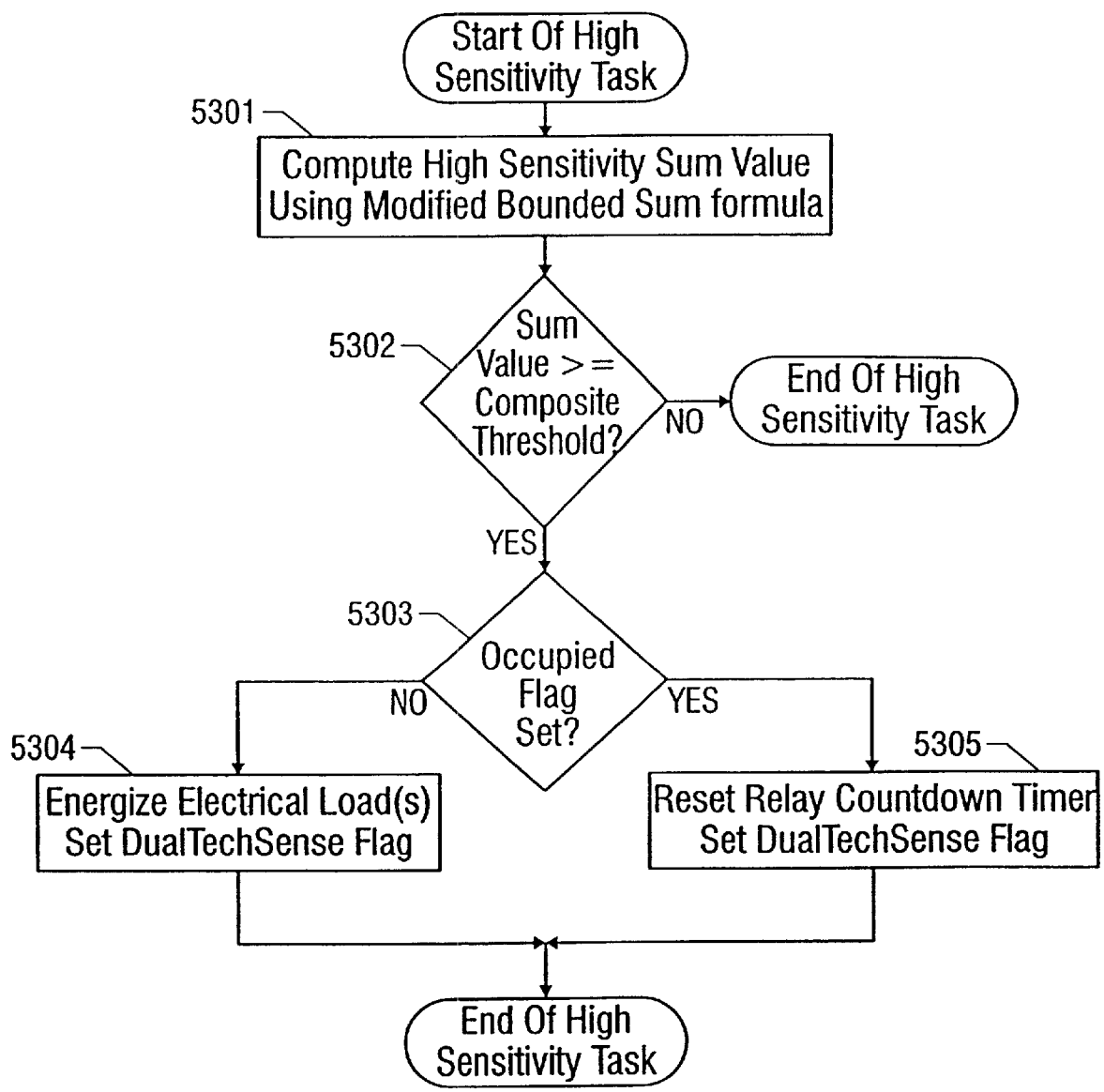
FIG. 53 is the HIGH SENSITIVITY task flowchart for the present invention.

The HIGH SENSITIVITY task implements the sensor's HIGH SENSITIVITY occupancy detection mode. A flowchart of the sensor's HIGH SENSITIVITY task is shown in FIG. 53. Initially, an composite occupancy estimator is computed using an arithmetic sum formula (5301). If the resulting value is above the predetermined composite maintenance threshold (5302), the sensor checks to see if the area covered by the sensor is currently occupied (5303). If the area covered by the occupancy sensor is not currently occupied, the sensor's electrical load(s) are energized and the DualTechSense flag is set (5304). If the area covered by the occupancy sensor is currently occupied, the sensor's relay countdown timer is reset and the DualTechSense flag is set (5305).

Figure 54:
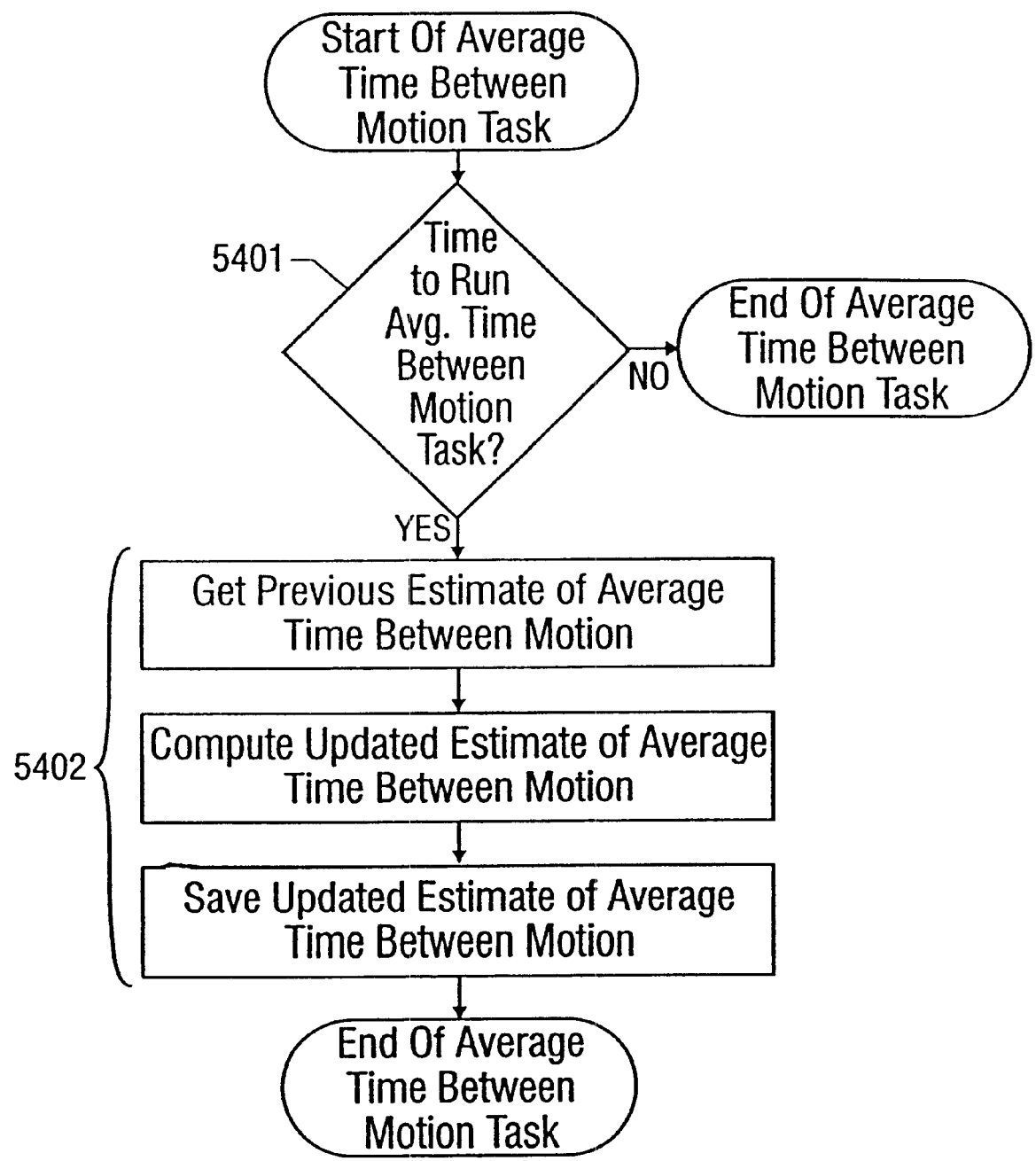
FIG. 54 is the average time between motion routine flowchart for the present invention.

The average time between motion task estimates the average time between motion. A flowchart of the average time between motion task of the present invention is shown in FIG. 54. If it is time to run this task (5401), the previous estimate of the average time between motion is updated and saved (5402). This information is used as a cue for the various adaptive sensor algorithms.

The update counters task updates the primary three byte interrupt counter used in the occupancy sensor. A flowchart of the update counters task of the present invention is shown in FIG. 55. The low byte of the counter is first incremented (5501). If zero (5502), the middle counter byte is incremented (5503). If zero (5504), the high byte of the counter is incremented (5505). If the high byte is zero (5506), a counter roll over flag is set (5507).

The adjust timer to minimize energy usage task implements the power up timer adjust algorithm. A flowchart of the adjust timer to minimize energy usage task of the present invention is shown in FIG. 56. The adjust timer to minimize energy usage task acts to reduce the time out on an ongoing basis. The amount of reduction depends upon the current value of the time delay potentiometer 319 (FIG. 3). In the illustrated embodiment, the amount of timer reduction is done according to the following formulas:

If time out$\geq$60 minutes, reduce by 30 minutes/4.66 hours,

If time out$\geq$30 minutes, reduce by 5 minutes/4.66 hours,

If time out$\geq$15 minutes, reduce by 1 minutes/4.66 hours,

If time out$\geq$10 minutes, reduce by 30 seconds/4.66 hours,

Otherwise, reduce timer by 2 seconds/4.66 hours

Initially, the timer delay adjustment value is reduced (5601). The timer delay adjustment value is then clipped at zero (5602).

The MUX task reads the status of the various user-selected mode option switches (discussed in detail above with reference to FIG. 3), and saves the results in the various sensor variables and flags. A flowchart of the MUX task is shown in FIG. 57. The MUX task initially sets the A and B MUX controls to cause MUX 304 (FIG. 3) to read the ultrasonic sensitivity potentiometer setting and the ASA switch setting (MUX=00). On the next pass, the MUX 304 reads the PIR sensitivity potentiometer setting and the ATA switch setting (MUX=01). On the next pass, the MUX 304 reads the timer pot setting and GSB switch setting (MUX=10). Finally, on the fourth pass, the MUX 304 reads the photo cell potentiometer setting and the strong air flow switch setting (MUX=11). This sequence of four MUX states is then sequentially repeated on a periodic basis.

The adapt ultrasonic sampling point task adjusts the ultrasonic sampling point to prevent the loss of motion information due to ultrasonic analog front end receiver signal saturation. A flowchart of the adapt ultrasonic sampling point task of the present invention is shown in FIG. 58. The sample point setting algorithm adjusts the sample point to achieve a receive carrier amplitude level at the sample point that is as close to zero crossing (VREF voltage) as possible. The sample point is adjusted by varying the timer value that sets the sample point within the carrier period.

When the sensor is initially powered, the sample point is adjusted to a default initialization value that is correct for the sensor in a nominal situation. The receive carrier sample point value is tested (5801), and if found to lie within a window about zero crossing (5802), no change to the sample point is made. If the receive carrier sample point value is found to be outside the desired window (5802), the sample point is precessed in discrete steps (5803), until the receive carrier sample point value is within the window(5804). The sample point is further perturbed to search out the value that is closest to zero crossing (5805). This becomes the synchronous demodulator sample point.

If it is impossible to find a sample point that results in a carrier value within the window (5806), the allowable window size is increased (5807), and the sample point search is made again. This process is repeated until the window has been increased to the point of receiver preamplifier saturation. In the event that the sensor is installed so close to a reflecting wall that there is no sample point that may be found that does not saturate the receiver preamplifier, the sample point search has failed, and the sensor reports this via the status reporting feature. Alternatively, the sensor may adjust the carrier send output level.

Specifically, when an ultrasonic sensor is installed within a small space, reverberant energy from the close walls may cause the sensor receive preamplifier to saturate. This saturation may be extreme beyond the ability of the sample point search algorithm FIG. 58 to find a satisfactory sample point within the granularity of the sample point timer adjustment. The correct response to this situation is to decrease the transmitter power, since the small space will be adequately covered. In another situation an ultrasonic sensor may be installed in a large space, but too close to an acoustic reflecting surface, resulting in receiver preamplifier saturation extreme beyond the ability of the sample point search algorithm to find a satisfactory sample point. The correct response in this situation is to decrease the transmitter power, unless this causes the sensor to emit insufficient acoustical energy to effectively survey the space. If this is the case, the sensor is unable to achieve a satisfactory drive level that both avoids preamplifier saturation and effectively surveys the space, so the sensor signals its inability to perform in a satisfactory manner by reporting a malfunction. This prompts service personnel to review the sensor installation and move it away from the acoustic reflector that is causing the saturation problem. This process is detailed in FIG. 59.

The receive carrier sample point value is periodically retested while the sensor is in operation. In the event that the sample point is recognized to be outside the window, and is found to lie consistently outside the window, indicating a change in the sensor mounting, the sample point search is reinitiated. The search results in a new sample point.

Figure 60:
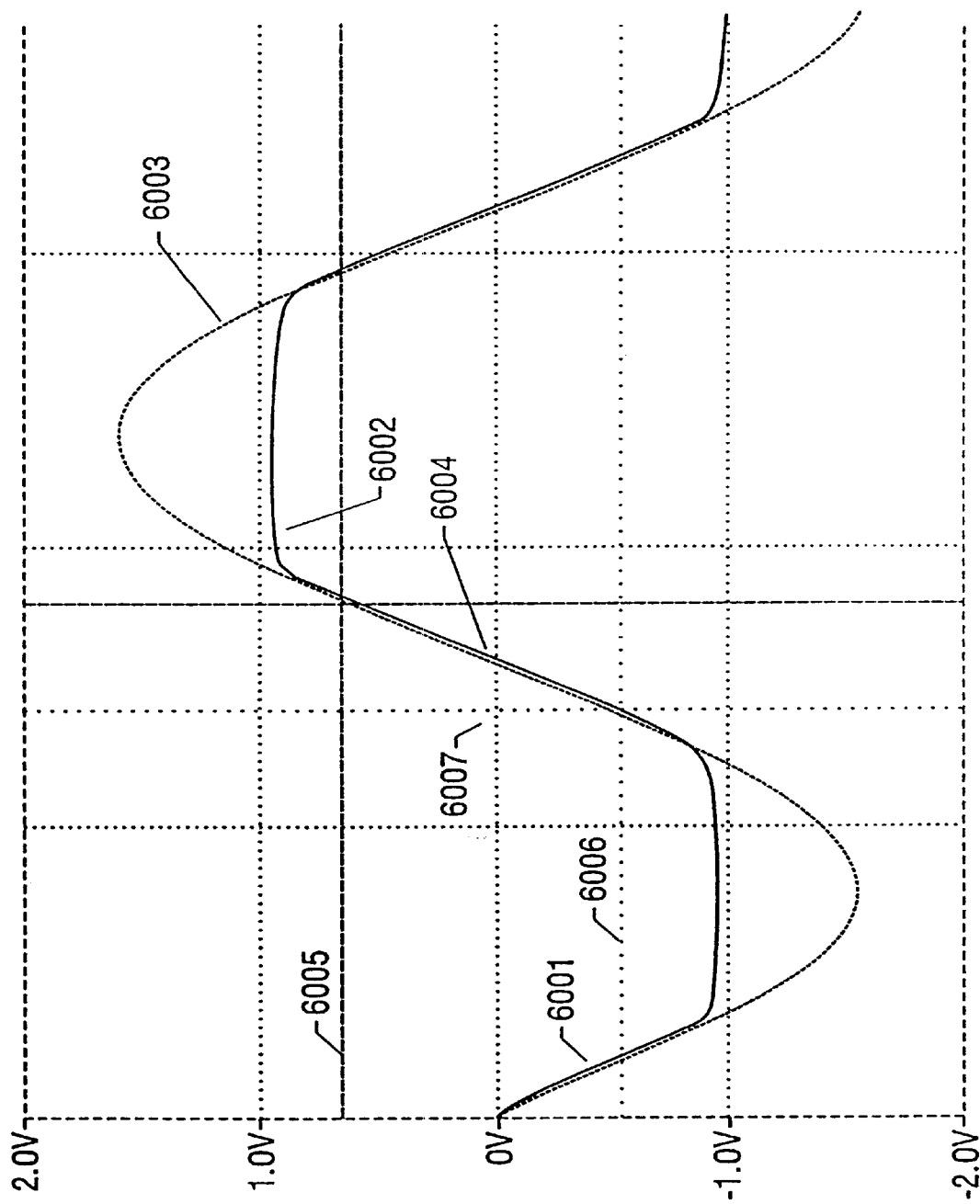
FIG. 60 is s time line of input receiver saturation

FIG. 60 depicts the situation of waveform saturation. Time is shown on horizontal axis, and the waveform at the preamplifier output is shown as a function of time. Point 6001 on the waveform indicates the preamplifier output at a voltage below the positive saturation limit. Point 6002 is the preamplifier output in saturation, where it cannot achieve the ideal waveform value of point 6003. Point 6004 is the ideal sample point at the zero crossing of the preamplifier signal. The region bounded by 6005 and 6006 is a voltage window around zero crossing within which the sample point should ideally lie to avoid the preamplifier saturation characteristic. The region bounded by 6007 and 6008 is the corresponding window in time within which the sample point must lie in order to achieve a sample point voltage within region 6005.

Figure 61:
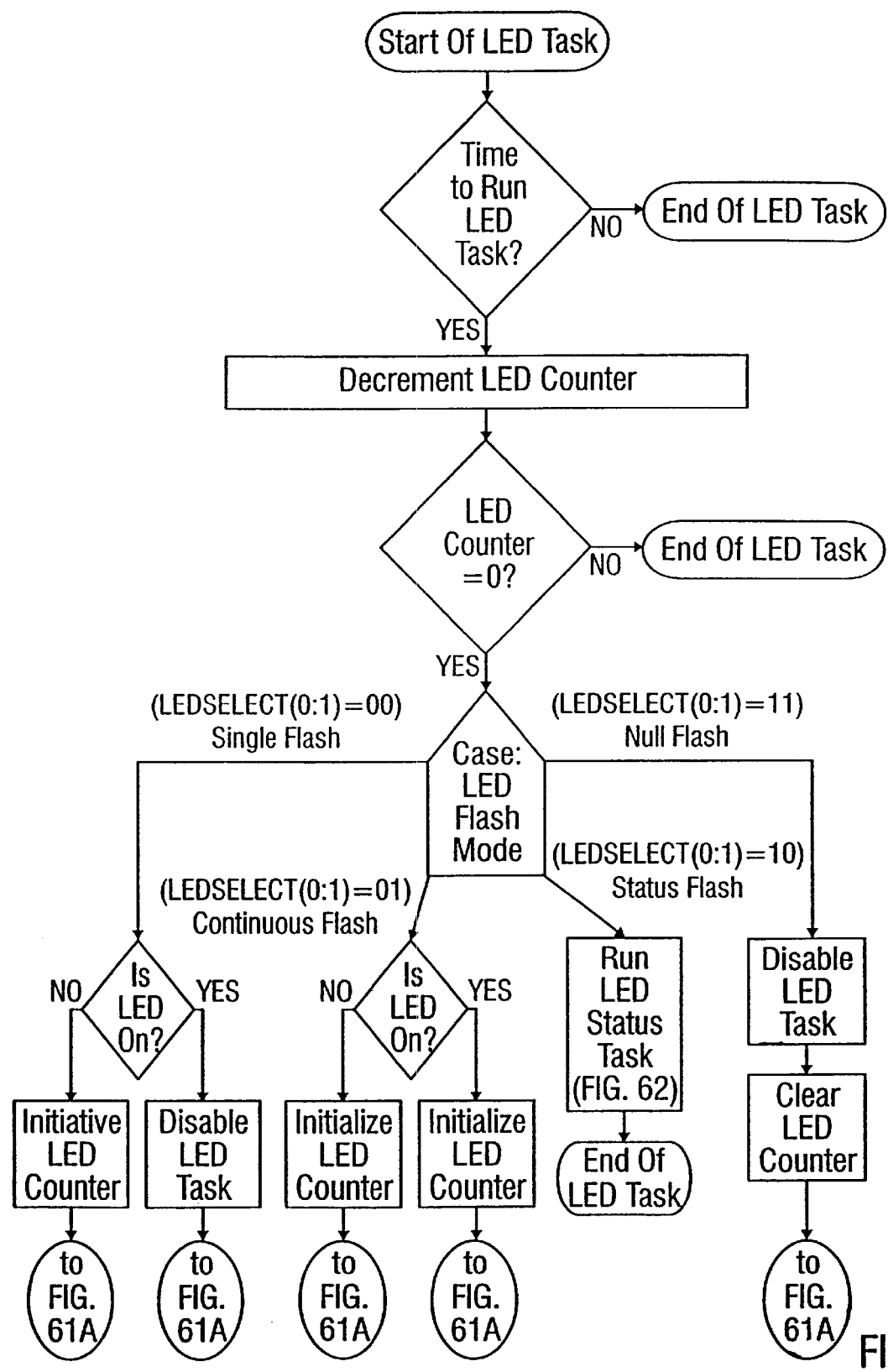
FIGS. 61 and 61A are the LED task flowchart for the present invention.
Figure 61A:
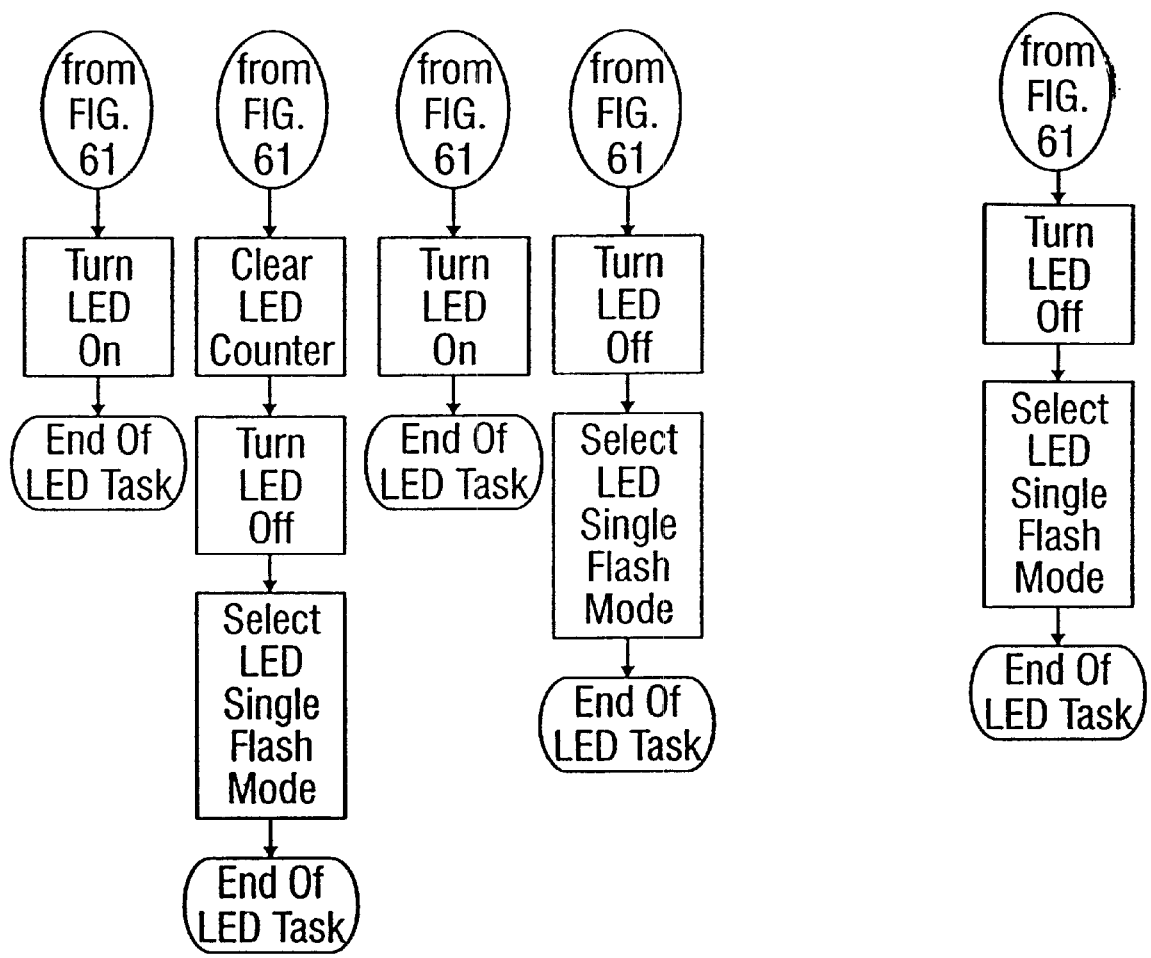

The LED task determines the LED flash mode and then flashes the various sensor LEDs in the appropriate fashion. A flowchart of the LED task is shown in FIG. 61. In the exemplary embodiment there are four different LED flash modes: single flash mode, continuous flash mode, status flash mode, and null flash mode. The LED single flash mode flashes the LED on and off a single time. The LED continuous flash mode flashes the LED on and off continuously. The LED status flash mode flashes the current status of the sensor, and is discussed in more detail with reference to FIG. 62(*a*). The LED null flash mode may be used for testing.

Figure 62A:
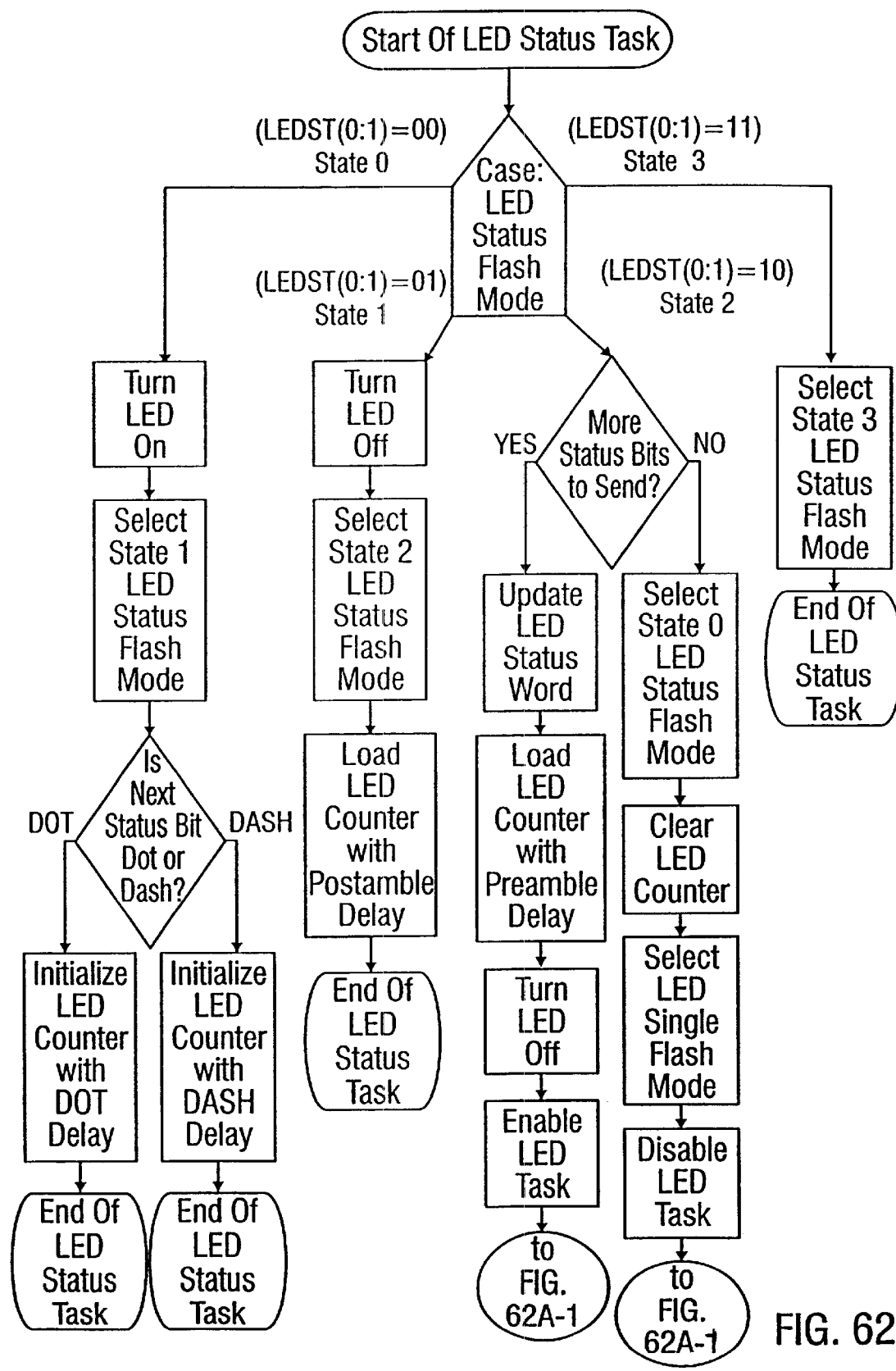
Figures 1, 62A:
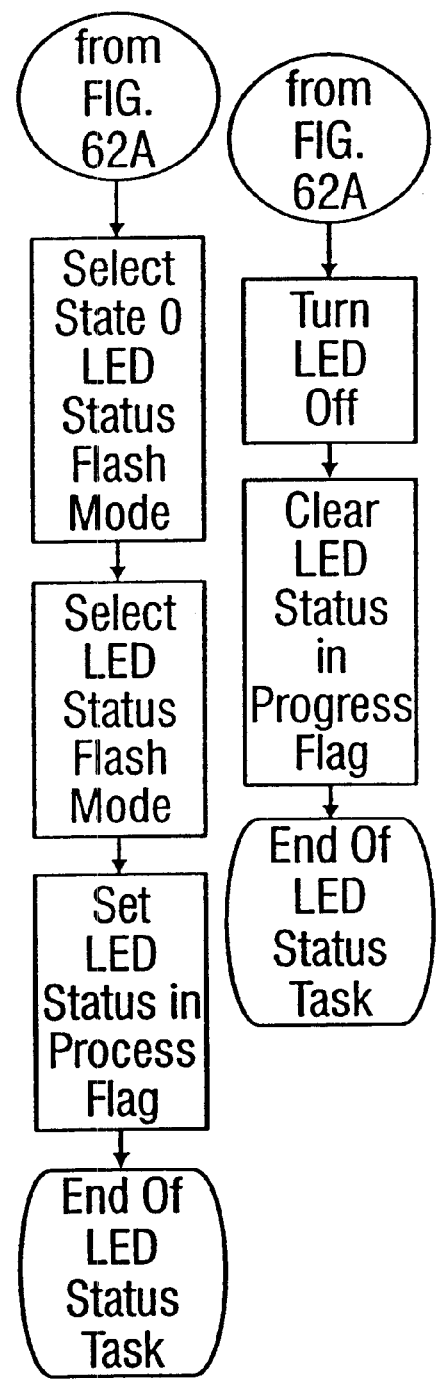

The LED status task manages the overall operation of the LEDs in order to output the status of the various sensor registers and its overall status. A flowchart of the LED status task of an example of the present invention is shown in FIG. 62(*a*).

Figure 62B:
FIG. 62B is an example of a status report according to the present invention.

Each status register value and the overall status of the sensor are converted into a sequence of Morse code dots and dashes, or other coding scheme. The LED status routine keeps track of the various dot and dash characters and makes sure the complete status information is sent. An exemplary status report is shown with reference to FIG. 62(*b*). The status report takes the form of a series of short and long LED flashes that, in the exemplary embodiment are in Morse code. The report is preceded by a preamble 6201 and then by one or more data fields. For example, after the preamble, the general status (6202) of the sensor may be reported. General status my be, for example, normal, windy (for a windy installation), failed or any other status that is useful. In the example of FIG. 62(b), the general status is followed by the delay timer setting in minutes (6203) and the ultrasonic sensitivity setting (6204). Thus, in the example given, the status of the sensor is normal ("S"), the delay timer is set for 16 minutes, the ultrasonic sensitivity setting is 10 and the PIR sensitivity is set to 8. Other types of information may also be displayed, including by way of example, PIR sensitivity setting and microwave sensitivity setting.

Figure 66:
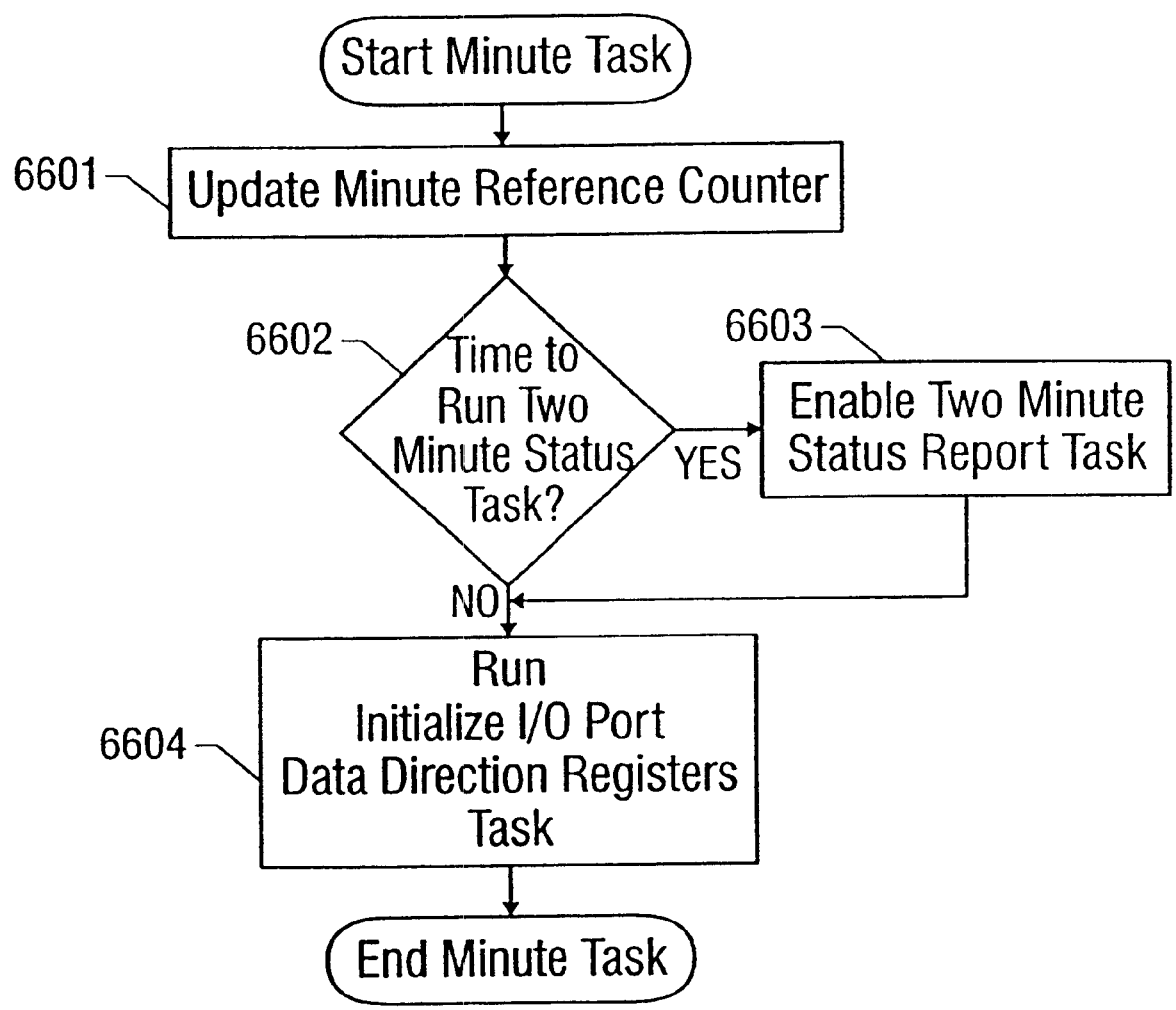
FIG. 66 is the minute task flowchart for the present invention.

As described below in detail with reference to FIGS. 66 and 68, status may be reported periodically, without user intervention, or it may be reported in response to user interrogation. In the former case, a shorted status report may be given (for example, only the general sensor status), whereas a more complete status report may be given in response to user interrogation. FIGS. 61 and 62(*a*) and (*b*) illustrate various possibilities for using LEDs to provide status information on the sensor. The specific information provided may be of any useful nature, and is not limited to any specific type of sensor status information.

Figure 63:
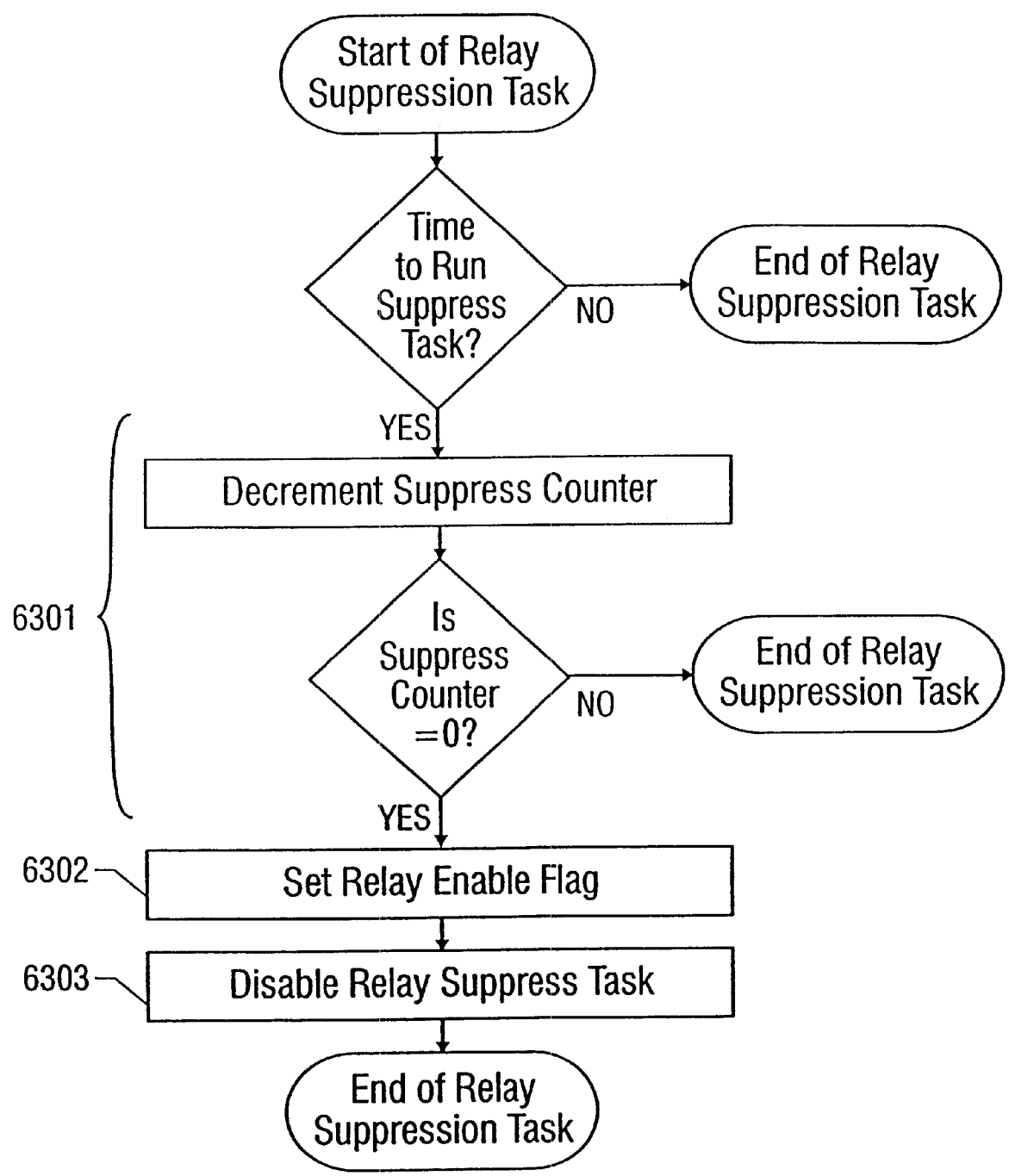
FIG. 63 is the relay suppress task flowchart for the present invention.

The sensor's relay suppress task disables the sensor's relay for a predetermined period of time. A flowchart of the relay suppress task of the present invention is shown in FIG. 63. This routine is used to prevent sensor false triggering by large voltage spikes from the sensor's relay. Once the relay's predetermined suppression time has elapsed (6301), the relay task enable flag is set (6302),and the relay suppress task enable flag is cleared (6303).

Figure 64:
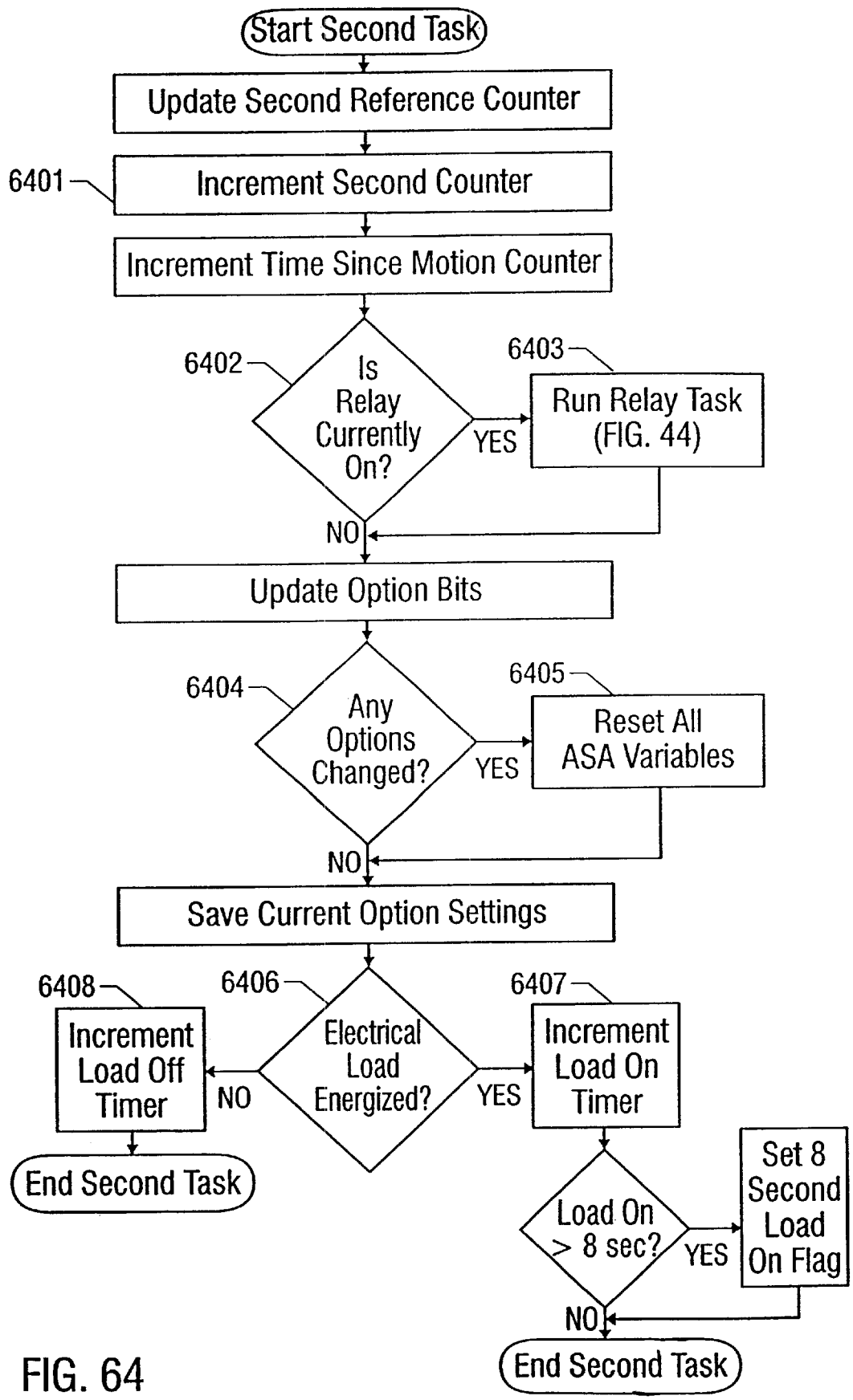
FIG. 64 is the second task flowchart for the present invention.

The sensor's second task is run once a second. A flowchart of the sensor's second task is shown in FIG. 64. This task initially increments the seconds counter (6401). If the relay is currently on (6402), the relay task is executed (6403). If any user-specified mode options have changed (6404), the various auto-sensitivity adjust (ASA) variables are reset (6405). Finally, if the sensor's electrical load(s) are energized (6406), the energized load counter is incremented (6407). If the sensor's electrical load(s) are off, the de-energized load counter is incremented (6408).

Figure 65:
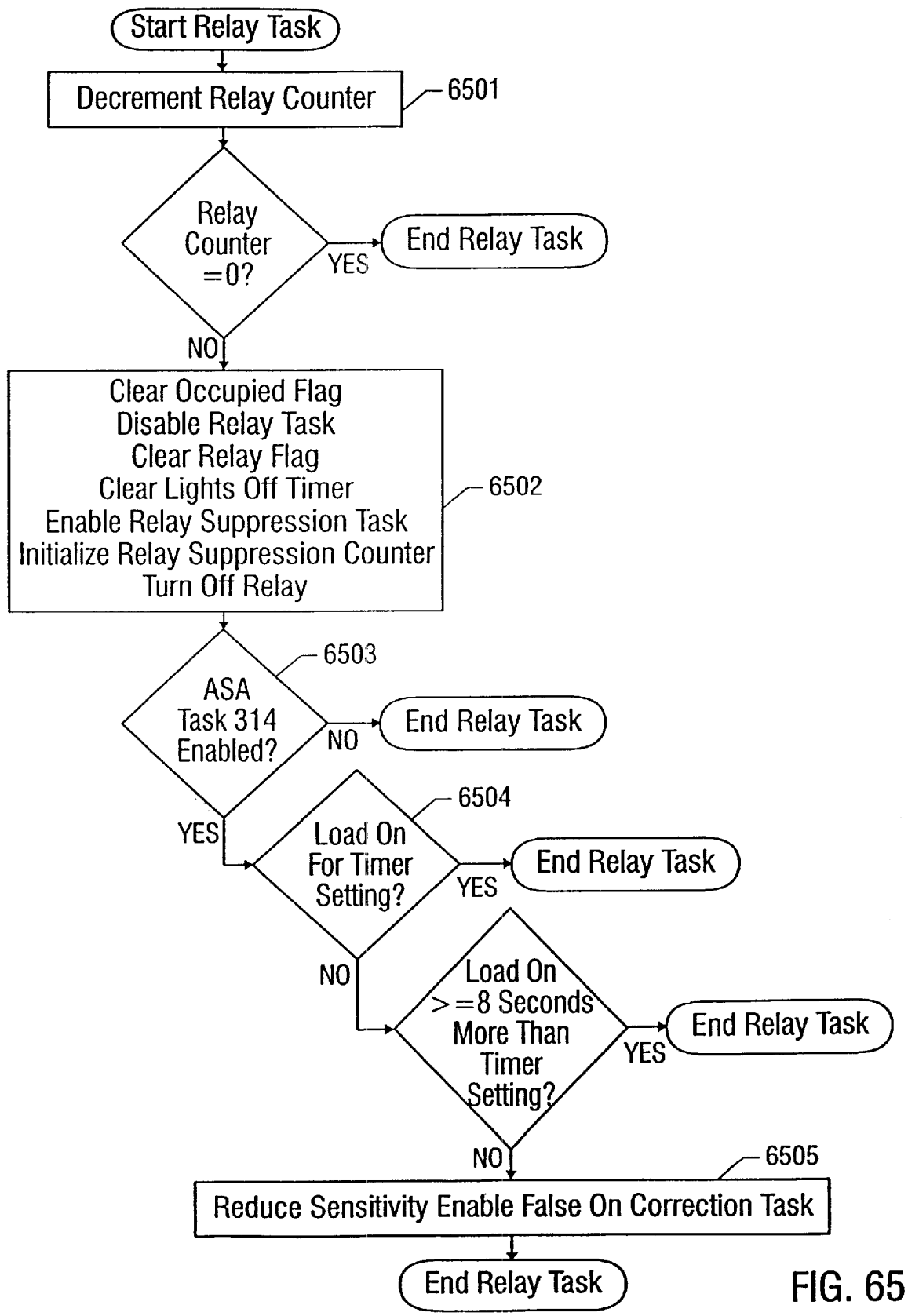
FIG. 65 is the relay task flowchart for the present invention.

The relay task decrements the sensor's relay counter. A flowchart of the relay task of the present invention is shown in FIG. 65.

After decrementing the sensor's relay counter (6501), the relay task turns off the sensor's relay if the relay counter has reached zero (6302). If the relay counter has not reached zero, the relay suppression task is ended. If the ASA task is enabled (6503), and the lights were previously on for about the same time as the sensor's timer delay setting (6504), the ultrasonic and PIR sensitivities are reduced and the false on correction task is enabled (6505).

The sensor's minute task is run once a minute. A flowchart of the minute task of the present invention is shown in FIG. 66. This task initially increments the minutes counter (6601). If it is time to run the two minute status task (6602), the two minute status task enable flag is set (6603). Finally, the initialize I/O port data direction registers task is executed (6604).

Figure 67:
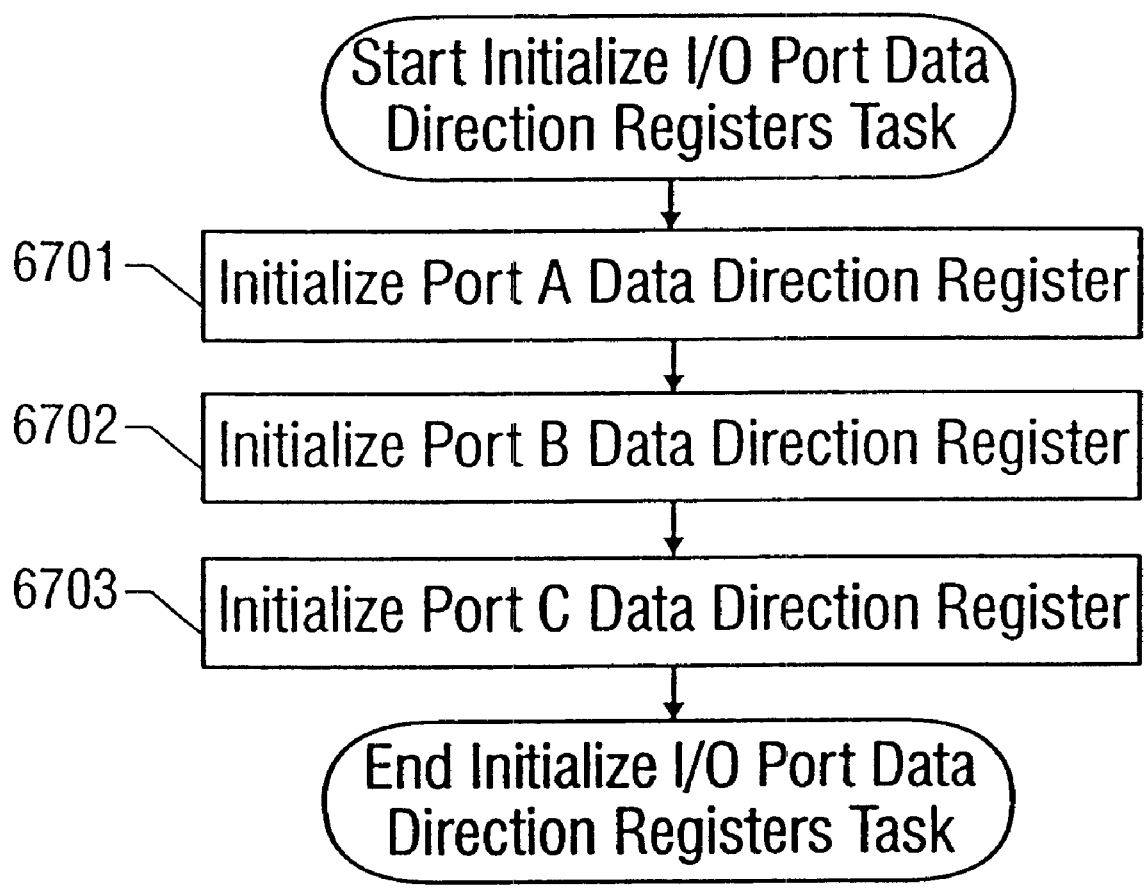
FIG. 67 is the initialize I/O port data direction registers task flowchart for the present invention.

The initialize I/O port data direction registers task periodically resets the I/O ports on the digital microcontroller 229 (FIG. 2). A flowchart of the initialize I/O port data direction registers task is shown in FIG. 67. The Port A (6701), Port B (6702), and Port C (6703) data direction reregisters are periodically reset to ensure proper operation.

The sensor's interrogate task is used to command the sensor into a special mode of operation (for example, a status reporting mode) by using the motion sensing capabilities of the sensor and without the need for adding a mode selection switch. In the exemplary embodiment, the special mode is invoked by the detection of five successive hand waves by the user. A flowchart of the interrogate task of the present invention is shown in FIG. 68. This task is implemented as an eighteen state machine. The state counter (NGATEstate) is monitored at a rate determined by the interrogation counter STATcnt reaches zero (6801). If the state counter ever reaches a value of eighteen, the interrogation has been successfully requested (6802), so the bit allowing the sensor status to be displayed is set and the state counter is set to zero (6803). If the state counter is less than eighteen, the state of the USSense is used to modify the state counter. The two's place bit of the state counter is XOR'ed with the USSense bit (6804) to determine if the state counter should be incremented to the next even state. If the USSense bit contains the desired value, the state, is incremented twice and the STATcnt is set equal to FF (6805). If the USSense bit doesn't contain the desired value, the state is evaluated (6806). If NGATEstate is even it is incremented once, and the STATcnt is set equal to FF(6807). This branch of program flow creates all of the odd states. If NGATEstate is odd, NGATEstate is set to zero (6808) By this method, the sensor may be switched from normal mode to status reporting mode using the motion detecting functions of the sensor, and without the need for adding a status mode selection switch.

The sensor's EEPROM task reads and writes data to the sensor's EEPROM. A flowchart of the EEPROM task is shown in FIG. 69. If the EEPROM is not busy (6901), and an EEPROM write task is scheduled (6902), the EEPROM task writes the various sensor variables to the sensor's EEPROM (6903), and then clears the EEPROM write task flag. If the EEPROM is not busy (6901), an EEPROM write task is not scheduled (6902), and an EEPROM read task is scheduled (6904), the EEPROM task reads the various sensor variables from the sensor's EEPROM and then clears the EEPROM read task flag (6905).

Although the description above contains many specifics, these should not be construed as limiting the scope of the invention but as merely providing illustrations of some of the presently preferred embodiments of this invention. For example, the sensor might use one or more subsets of the various detection technologies described above. Similarly, the sensor might use a different digital microcontroller, a different ultrasonic transducer or a different ultrasonic transducer frequency from the exemplary embodiment. Thus the scope of this invention and the method of operating the same should be determined by the appended claims and their legal equivalents and should not be limited to the example embodiments described above.

Table 3 provides a correlation between the attached source code appendix, and the flowcharts of FIGS. 39–69. The source code appendix is written in the assembly language, and is an example of programming for the digital microcontroller used in the exemplary embodiment to practice the present invention. Other programs may be used without departing from the scope of the invention.

TABLE 3

Source Code Label References for Primary Sensor Tasks

| FIG. Number | Description of Routine | Code Label |
|---|---|---|
| 39 | Main (Foreground) Routine | main |
| 40 | Hardware and Variable Initialization Task | 02init |
| 41 | Interrogation Status Report Task | statussend |
| 42 | Two Minute Status Report Task | twominstatus |
| 43 | False On Correction Task | fixfalson |
| 28 | False Off Correction Task | fixfalsoff |
| 45 | Interrupt (Background) Routine | inta |
| 47 | Ultrasonic DSP Task | ultrasonictask |
| 48 | Infrared DSP Task | runPIR |
| 52 | HIGH CONFIDENCE Task | dtdecidenorm |
| 53 | HIGH SENSITIVITY Task | dtHSscheme |
| 55 | Update Counters Task | cntrupdt |
| 56 | Adjust Timer to Minimize Energy Usage Task | reducetimer |
| 57 | MUX Task | runMUXT |
| 61 | LED Task | LEDTASK |
| 62 | LED Status Task | statusled |
| 63 | Relay Suppress Task | suppress |
| 64 | Second Task | SECONDtask |
| 65 | Relay Task | relaytask |
| 66 | Minute Task | mcnt |
| 67 | Initialize I/O Port Data Direction Registers | setTrisRegs |
| 68 | Interrogate | handleSTAT |
| 69 | EEPROM Task | eepromwait |

What is claimed is:

1. An occupancy based load controller, comprising:

a plurality of occupancy sensors for producing a respective plurality of occupancy estimator signals, each indicative of motion within a space;

a programmable microprocessor, connected to said plurality of occupancy sensors, for calculating a composite occupancy estimator from said plurality of occupancy estimator signals, and for comparing said composite occupancy estimator to a programmable composite activation threshold, said programmable microprocessor being operable to adaptively adjust a sensitivity of at least one of said plurality of occupancy sensors;

a controllable load energizing device responsive to said programmable microprocessor, operable to automatically energize an electrical load when said microprocessor determines that said composite occupancy estimator is greater than said composite activation threshold; and wherein said sensitivity of said at least one of said plurality of occupancy sensors is adjusted by said programmable microprocessor as a function of an energization state of said electrical load, said programmable microprocessor calculating an average time between determinations by said programmable microprocessor that said composite occupancy estimator is greater than said composite activation threshold, wherein said sensitivity of said at least one of said plurality of occupancy sensors is adjusted by said programmable microprocessor as a function of said average time.

2. An occupancy based load controller, comprising:

a plurality of occupancy sensors for producing a respective plurality of occupancy estimator signals, each indicative of motion within a space;

a programmable microprocessor, connected to said plurality of occupancy sensors, for calculating a composite occupancy estimator from said plurality of occupancy estimator signals, and for comparing said composite occupancy estimator to a programmable composite activation threshold, said programmable microprocessor being operable to adaptively adjust a sensitivity of at least one of said plurality of occupancy sensors;

a controllable load energizing device responsive to said programmable microprocessor, operable to automatically energize an electrical load when said microprocessor determines that said composite occupancy estimator is greater than said composite activation threshold; and wherein said sensitivity of said at least one of said plurality of occupancy sensors is adjusted by said programmable microprocessor as a function of an energization state of said electrical load, said programmable microprocessor further acting to stretch at least one of said occupancy estimator signals by detecting a peak value of said at least one occupancy estimator signal, and holding said peak value for a predetermined time.

3. An occupancy based load controller, comprising:

a plurality of occupancy sensors for producing a respective plurality of occupancy estimator signals, each indicative of motion within a space;

a programmable microprocessor, connected to said plurality of occupancy sensors, for calculating a composite occupancy estimator from said plurality of occupancy estimator signals, and for comparing said composite occupancy estimator to a programmable composite activation threshold, said programmable microprocessor being operable to adaptively adjust a sensitivity of at least one of said plurality of occupancy sensors;

a controllable load energizing device responsive to said programmable microprocessor, operable to automatically energize an electrical load when said microprocessor determines that said composite occupancy estimator is greater than said composite activation threshold; and wherein said sensitivity of said at least one of said plurality of occupancy sensors is adjusted by said programmable microprocessor as a function of an energization state of said electrical load, said programmable microprocessor storing occupancy times of day for an area sensed by said plurality of occupancy sensors and adjusting said sensitivity of said at least one occupancy sensor based on said stored occupancy times of day.

4. An occupancy based load controller, comprising:

at least one occupancy sensor for producing at least one respective occupancy estimator signal indicative of motion within a space;

a programmable microprocessor, connected to said at least one occupancy sensor, for comparing said at least one occupancy estimator signal to an activation threshold, said programmable microprocessor being operable to adaptively adjust a sensitivity of said at least one occupancy sensor as a function of detected false-on-stay-on events; and a controllable load energizing device responsive to said programmable microprocessor; operable to automatically energize an electrical load when said microprocessor determines that said occupancy estimator is greater than said activation threshold.

5. The load controller of claim 4, said programmable microprocessor indicating an error condition when said adaptive adjustment of said sensitivity of said at least one occupancy sensors fails to minimize erroneous energization and de-energization of said electrical load within a predetermined time.

6. An occupancy based load controller, comprising:

at least one occupancy sensor for producing at least one respective occupancy estimator signal indicative of motion within a space;

a programmable microprocessor, connected to said at least one occupancy sensor, for comparing said at least one occupancy estimator signal to an activation threshold, said programmable microprocessor being operable to adaptively adjust a sensitivity of said at least one occupancy sensor as a function of detected lights-stay-on-no-activation events; and a controllable load energizing device responsive to said programmable microprocessor, operable to automatically energize an electrical load when said microprocessor determines that said occupancy estimator signal is greater than said activation threshold.

7. An occupancy based load controller, comprising:

at least one occupancy sensor for producing at least one respective occupancy estimator signal indicative of motion within a space;

a programmable microprocessor, connected to said at least one occupancy sensor, for comparing said at least one occupancy estimator signal to an activation threshold, said programmable microprocessor being operable to adaptively adjust a sensitivity of said at least one occupancy sensor as a function of detected lights-stay-on-with major occupancy events; and a controllable load energizing device responsive to said programmable microprocessor, operable to automatically energize an electrical load when said microprocessor determines that said occupancy estimator signal is greater than said activation threshold.

8. An occupancy based load controller, comprising:

at least one occupancy sensor for producing at least one respective occupancy estimator signal indicative of motion within a space;

a programmable microprocessor, connected to said at least one occupancy sensor, for comparing said at least one occupancy estimator signal to an activation threshold, said programmable microprocessor being operable to adaptively adjust a sensitivity of said at least one occupancy sensor as a function of detected false-on events; and a controllable load energizing device responsive to said programmable microprocessor, operable to automatically energize an electrical load when said microprocessor determines that said occupancy estimator signal is greater than said activation threshold.

9. An occupancy based load controller, comprising:

at least one occupancy sensor for producing at least one respective occupancy estimator signal indicative of motion within a space;

a programmable microprocessor, connected to said at least one occupancy sensor, for comparing said at least one occupancy estimator signal to an activation threshold, said programmable microprocessor being operable to adaptively adjust a sensitivity of said at least one occupancy sensor as a function of detected false-off events; and a controllable load energizing device responsive to said programmable microprocessor, operable to automatically energize an electrical load when said microprocessor determines that said occupancy estimator signal is greater than said activation threshold.

10. An occupancy based load controller, comprising:
- at least one occupancy sensor for producing at least one respective occupancy estimator signal indicative of motion within a space;
- a programmable microprocessor, connected to said at least one occupancy sensor, for comparing said at least one occupancy estimator signal to an activation threshold, said programmable microprocessor being operable to adaptively adjust a sensitivity of said at least one occupancy sensor as a function of detected false-off events;
- a controllable load energizing device responsive to said programmable microprocessor, operable to automatically energize an electrical load when said microprocessor determines that said occupancy estimator signal is greater than said activation threshold; and to de-energize said electrical load after a predetermined time.

11. The occupancy based load controller of claim 10, wherein said predetermined time is increased when said electrical load is first de-energized and then re-energized within a time interval, said time interval being less than said predetermined time.

12. The occupancy based load controller of claim 11, wherein said predetermined time, after being increased, is maintained at said increased value for an extended time period, said extended time period being longer than said predetermined time.

13. The occupancy based load controller of claim 12, wherein said predetermined time is decreased after the expiration of said extended time period.

14. An occupancy based load controller, comprising:
- at least one occupancy sensor for producing at least one respective occupancy estimator signal indicative of motion within a space;
- a programmable microprocessor, connected to said at least one occupancy sensor, for comparing said at least one occupancy estimator signal to an activation threshold, said programmable microprocessor being operable to adaptively adjust a sensitivity of said at least one occupancy sensor as a function of a learning curve whereby sensitivity adjustments are reduced in magnitude as time advances; and
- a controllable load energizing device responsive to said programmable microprocessor, operable to automatically energize an electrical load when said microprocessor determines that said occupancy estimator signal is greater than said activation threshold.

15. An occupancy based load controller, comprising:
- a plurality of occupancy sensors for producing a respective plurality of occupancy estimator signals, each indicative of motion within a space;
- an acoustic sensor for producing a signal indicative of sound within said space;
- a programmable microprocessor, connected to said plurality of occupancy sensors, for calculating a composite occupancy estimator from said plurality of occupancy estimator signals, for producing a load energization signal as a function of said composite occupancy estimator and said signal indicative of sound within said space,
- a controllable load energizing device responsive to said programmable microprocessor, operable to automatically energize and de-energize an electrical load in response said load energization signal;
- said programmable microprocessor analyzing said a signal indicative of sound within said space only for a specified time both before and after de-energization of said electrical load.

16. The occupancy based load controller of claim 15, wherein said plurality of occupancy sensors includes a PIR sensor.

17. The occupancy based load controller of claim 15, wherein said plurality of occupancy sensors includes an ultrasonic sensor.

18. The occupancy based load controller of claim 15, wherein said plurality of occupancy sensors includes a combination an ultrasonic sensor and a PIR sensor.

19. The occupancy based load controller of claim 15, said programmable microprocessor analyzing said a signal indicative of sound within said space for a time before de-energization of said electrical load to establish an average acoustic occupancy threshold, and analyzing said a signal indicative of sound within said space for a time after de-energization of said electrical load for patterns of human speech.

20. An occupancy based load controller, comprising:
- a plurality of occupancy sensors for producing a respective plurality of occupancy estimator signals, each indicative of motion within a space;
- a programmable microprocessor, connected to said plurality of occupancy sensors, for calculating a composite occupancy estimator from said plurality of occupancy estimator signals, and for comparing said composite occupancy estimator to a programmable composite activation threshold; and
- a controllable load energizing device responsive to said programmable microprocessor, operable to automatically energize an electrical load when said microprocessor determines that said occupancy estimator signal is greater than said activation threshold; and to de-energize said electrical load after a predetermined time, said predetermined time being set upon power on of said load based occupancy controller according to a position of a manual user control, said manual user control having a test mode position and positions corresponding to a range of values for said predetermined time, wherein, if said manual user control is not in said test mode position, said predetermined time is adjustable by adaptive sensor algorithms in said programmable microprocessor.

21. The occupancy based load controller of claim 20, wherein, if said manual user control is in said test mode position, said predetermined time is set to a test mode value.

22. The occupancy based load controller of claim 21, wherein, if said manual user control remains in said test mode position for an extended time period, the extended time period being longer than the predetermined time, then said predetermined time is adjustable by adaptive sensor algorithms in said programmable microprocessor.

23. An occupancy based load controller, comprising:
- at least one occupancy sensor for producing at least one respective occupancy estimator signal indicative of motion within a space;
- a programmable microprocessor, connected to said at least one occupancy sensor, for comparing said at least one occupancy estimator signal to a programmable activation threshold; and a controllable load energizing device responsive to said programmable microprocessor, operable to automatically energize an electrical load when said microprocessor determines that said occupancy estimator signal is greater than said activation threshold; and to de-energize said electrical load after a predetermined time, said predetermined time being set upon power on of said load based occupancy controller according to a position of a manual user control, said manual user control having a test mode position and positions corresponding to a range of values for said predetermined time; and wherein if said manual user control is not in said test mode position, said predetermined time is adjustable by adaptive sensor algorithms in said programmable microprocessor.

24. The occupancy based load controller of claim 23, wherein, if said manual user control is in said test mode position, said predetermined time is set to a test mode value.

25. The occupancy based load controller of claim 24, wherein, if said manual user control remains in said test mode position for an extended time period, the extended time period being longer than the predetermined time, then said predetermined time is adjustable by adaptive sensor algorithms in said programmable microprocessor.

* * * * *

UNITED STATES PATENT AND TRADEMARK OFFICE
CERTIFICATE OF CORRECTION

PATENT NO. : 6,415,205 B1
DATED : July 2, 2002
INVENTOR(S) : Myron et al.

It is certified that error appears in the above-identified patent and that said Letters Patent is hereby corrected as shown below:

<u>Column 41,</u>
Line 67, please insert -- to -- between "response" and "said".

<u>Column 42,</u>
Lines 1, 16 and 19, please delete "a".

Signed and Sealed this

Sixth Day of January, 2004

JAMES E. ROGAN
*Director of the United States Patent and Trademark Office*